United States Patent
Kumagai et al.

(10) Patent No.: US 11,722,793 B2
(45) Date of Patent: *Aug. 8, 2023

(54) IMAGING DEVICE AND ELECTRONIC DEVICE

(71) Applicant: SONY SEMICONDUCTOR SOLUTIONS CORPORATION, Kanagawa (JP)

(72) Inventors: Yoshimichi Kumagai, Kanagawa (JP); Takashi Abe, Kanagawa (JP); Ryoto Yoshita, Kanagawa (JP); Ryo Fukui, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/659,361

(22) Filed: Apr. 15, 2022

(65) Prior Publication Data

US 2022/0311958 A1 Sep. 29, 2022

Related U.S. Application Data

(63) Continuation of application No. 17/250,392, filed as application No. PCT/JP2019/027260 on Jul. 10, 2019, now Pat. No. 11,330,203.

(30) Foreign Application Priority Data

Jul. 24, 2018 (JP) .................................. 2018-138644
Jul. 30, 2018 (JP) .................................. 2018-142341

(51) Int. Cl.
*H04N 25/53* (2023.01)
*H04N 25/75* (2023.01)
*H04N 25/76* (2023.01)

(52) U.S. Cl.
CPC ............. *H04N 25/53* (2023.01); *H04N 25/75* (2023.01); *H04N 25/76* (2023.01)

(58) Field of Classification Search
CPC ........ H04N 5/353; H04N 5/374; H04N 5/378; H04N 5/37452; H01L 27/1463;
(Continued)

(56) References Cited

U.S. PATENT DOCUMENTS 9,894,304 B1   2/2018  Smith et al.
2006/0261431 A1* 11/2006  Kim .................... H04N 5/3745
                                                    348/E3.018
(Continued)

FOREIGN PATENT DOCUMENTS

CN    102215351 A    10/2011
CN    104469198 A     3/2015
(Continued)

OTHER PUBLICATIONS

International Search Report and Written Opinion of PCT Application No. PCT/JP2019/027260, dated Oct. 1, 2019, 09 pages of English Translation and 08 pages of ISRWO.

(Continued)

*Primary Examiner* — Sinh Tran
*Assistant Examiner* — Zhenzhen Wu
(74) *Attorney, Agent, or Firm* — Chip Law Group

(57) ABSTRACT

Provided is an imaging device and an electronic device which enable image capturing based on the global shutter system, without reducing the amount of saturated signal charge. Pixels each including a photoelectric conversion unit that converts light received thereon into electric charge, and a holding unit that holds the electric charge transferred from the photoelectric conversion unit, a floating diffusion that is shared among a plurality of the pixels, and that holds the electric charge transferred from the holding unit, and a boost (Continued)

line through which the floating diffusion is boosted are included.

17 Claims, 40 Drawing Sheets

(58) Field of Classification Search
CPC ............. H01L 27/146; H01L 27/14603; H01L 27/14612; H01L 27/14623; H01L 27/1464; H01L 27/14641
See application file for complete search history.

(56) References Cited

U.S. PATENT DOCUMENTS

| | | | |
|---|---|---|---|
| 2011/0036969 A1 | 2/2011 | Ahn et al. | |
| 2011/0242378 A1 | 10/2011 | Mabuchi | |
| 2013/0082313 A1 | 4/2013 | Manabe | |
| 2014/0022427 A1* | 1/2014 | Goto | H04N 5/363 348/308 |
| 2014/0299925 A1 | 10/2014 | Manabe | |
| 2015/0077611 A1 | 3/2015 | Yamashita et al. | |
| 2015/0229859 A1 | 8/2015 | Guidash et al. | |
| 2016/0111461 A1* | 4/2016 | Ahn | H01L 27/14614 257/225 |
| 2016/0165165 A1* | 6/2016 | Chen | H04N 5/3741 348/308 |
| 2016/0198108 A1 | 7/2016 | Guidash et al. | |
| 2016/0268322 A1 | 9/2016 | Watanabe et al. | |
| 2017/0019618 A1* | 1/2017 | Koga | H04N 5/369 |
| 2017/0208272 A1 | 7/2017 | Guidash et al. | |
| 2018/0115727 A1* | 4/2018 | Yanagita | H01L 27/14607 |
| 2018/0278810 A1 | 9/2018 | Webster | |
| 2019/0045149 A1 | 2/2019 | Guidash et al. | |
| 2019/0222781 A1 | 7/2019 | Lim et al. | |
| 2019/0355778 A1 | 11/2019 | Zheng et al. | |

FOREIGN PATENT DOCUMENTS

| | | |
|---|---|---|
| CN | 105981370 A | 9/2016 |
| EP | 3103255 A1 | 12/2016 |
| JP | 2008-103647 A | 5/2008 |
| JP | 2011-217315 A | 10/2011 |
| JP | 2015-056878 A | 3/2015 |
| JP | 2015-082592 A | 4/2015 |
| KR | 10-2015-0031154 A | 3/2015 |
| KR | 10-2016-0077055 A | 7/2016 |
| TW | 201523853 A | 6/2015 |
| TW | 201826515 A | 7/2018 |
| WO | 2015/059898 A1 | 4/2015 |
| WO | 2015/120328 A1 | 8/2015 |
| WO | 2015/187884 A1 | 12/2015 |
| WO | 2018/110303 A1 | 6/2018 |

OTHER PUBLICATIONS

International Preliminary Report on Patentability of PCT Application No. PCT/JP2019/027260, dated Feb. 4, 2021, 09 pages of English Translation and 05 pages of IPRP.
Non-Final Office Action for U.S. Appl. No. 17/250,392, dated Sep. 7, 2021, 12 pages.
Notice of Allowance for U.S. Appl. No. 17/250,392, dated Jan. 7, 2022, 10 pages.

* cited by examiner

IMAGING DEVICE AND ELECTRONIC DEVICE

CROSS REFERENCE TO RELATED APPLICATIONS

This application is a continuation application of U.S. patent application Ser. No. 17/250,392, filed on Jan. 15, 2021, which is a U.S. National Phase of International Patent Application No. PCT/JP2019/027260 filed on Jul. 10, 2019, which claims priority benefit of Japanese Patent Application No. JP 2018-142341 filed in the Japan Patent Office on Jul. 30, 2018 and also claims priority benefit of Japanese Patent Application No. JP 2018-138644 filed in the Japan Patent Office on Jul. 24, 2018. Each of the above-referenced applications is hereby incorporated herein by reference in its entirety.

TECHNICAL FIELD

The present technology relates to an imaging device and an electronic device, and for example to an imaging device and an electronic device suitably applicable to image capturing on the basis of the global shutter system.

BACKGROUND ART

Imaging elements such as complementary metal oxide semiconductor (CMOS) image sensor and charge coupled device (CCD) have widely been used for digital still camera, digital video camera, and so forth.

Light incident, for example, on the CMOS image sensor is subjected to photoelectric conversion in a photodiode (PD) that resides in a pixel. Electric charge generated in the PD is then transferred through a transfer transistor to a floating diffusion (FD), and converted into a pixel signal at a level corresponded to the energy of received light.

Now, the prior CMOS image sensor has typically employed a so-called rolling shutter system by which pixel signals are read out from the individual pixels sequentially row by row, and has occasionally suffered from distorted images due to difference in exposure timing.

Hence, Patent Document 1 for example discloses a CMOS image sensor equipped with an electronic shutter function for all-pixel simultaneous exposure, enabled by employing a so-called global shutter system that reads pixel signals simultaneously from all pixels, with the aid of an electric charge holding part provided within the pixel. Employment of the global shutter system can equalize the exposure timing for all pixels, and can prevent the images from being distorted.

CITATION LIST

Patent Document

Patent Document 1: Japanese Patent Application Laid-Open No. 2008-103647

SUMMARY OF THE INVENTION

Problems to be Solved by the Invention

By the way, recent requirements for miniaturization of solid-state imaging devices have driven shrinkage of the individual pixels. In addition, employment of the global shutter system, with the electric charge holding part provided within the pixel, has been anticipated to reduce the amount of saturated charge (Qs) due to shrinkage of the photodiode.

The present technology was arrived at in consideration of such circumstances, and an object of which is to enable image capturing based on the global shutter system, without reducing the amount of saturated signal charge.

Solutions to Problems

An imaging device according to an aspect of the present technology includes: pixels each including: a photoelectric conversion unit that converts light received thereon into electric charge, and a holding unit that holds the electric charge transferred from the photoelectric conversion unit, a floating diffusion that is shared among a plurality of the pixels, and that holds the electric charge transferred from the holding unit, and a boost line through which the floating diffusion is boosted.

An electronic device according to an aspect of the present technology includes: an imaging device including: pixels each including: a photoelectric conversion unit that converts light received thereon into electric charge, and a holding unit that holds the electric charge transferred from the photoelectric conversion unit, a floating diffusion that is shared among a plurality of the pixels, and that holds the electric charge transferred from the holding unit, and a boost line through which the floating diffusion is boosted, and a processing unit that processes a signal from the imaging device.

In an imaging device according to an aspect of the present technology, pixels each including: a photoelectric conversion unit that converts light received thereon into electric charge, and a holding unit that holds the electric charge transferred from the photoelectric conversion unit, a floating diffusion that is shared among a plurality of the pixels, and that holds the electric charge transferred from the holding unit, and a boost line through which the floating diffusion is boosted are included.

The electronic device according to one aspect of the present technology is configured to contain the imaging device.

Note that the imaging device and the electronic device can be independent apparatuses or can be internal modules that constitute a single device.

Effects of the Invention

According to one aspect of the present technology, image capturing based on the global shutter system is enabled without reducing the amount of saturated signal charge.

Note that in this connection, the effects described here are not necessarily limited, and may be any of the effects described in the present disclosure.

MODE FOR CARRYING OUT THE INVENTION

Modes for carrying out the present technology (referred to as embodiments, hereinafter) will be explained below.

<Configuration of Imaging Element>

Figure 1:
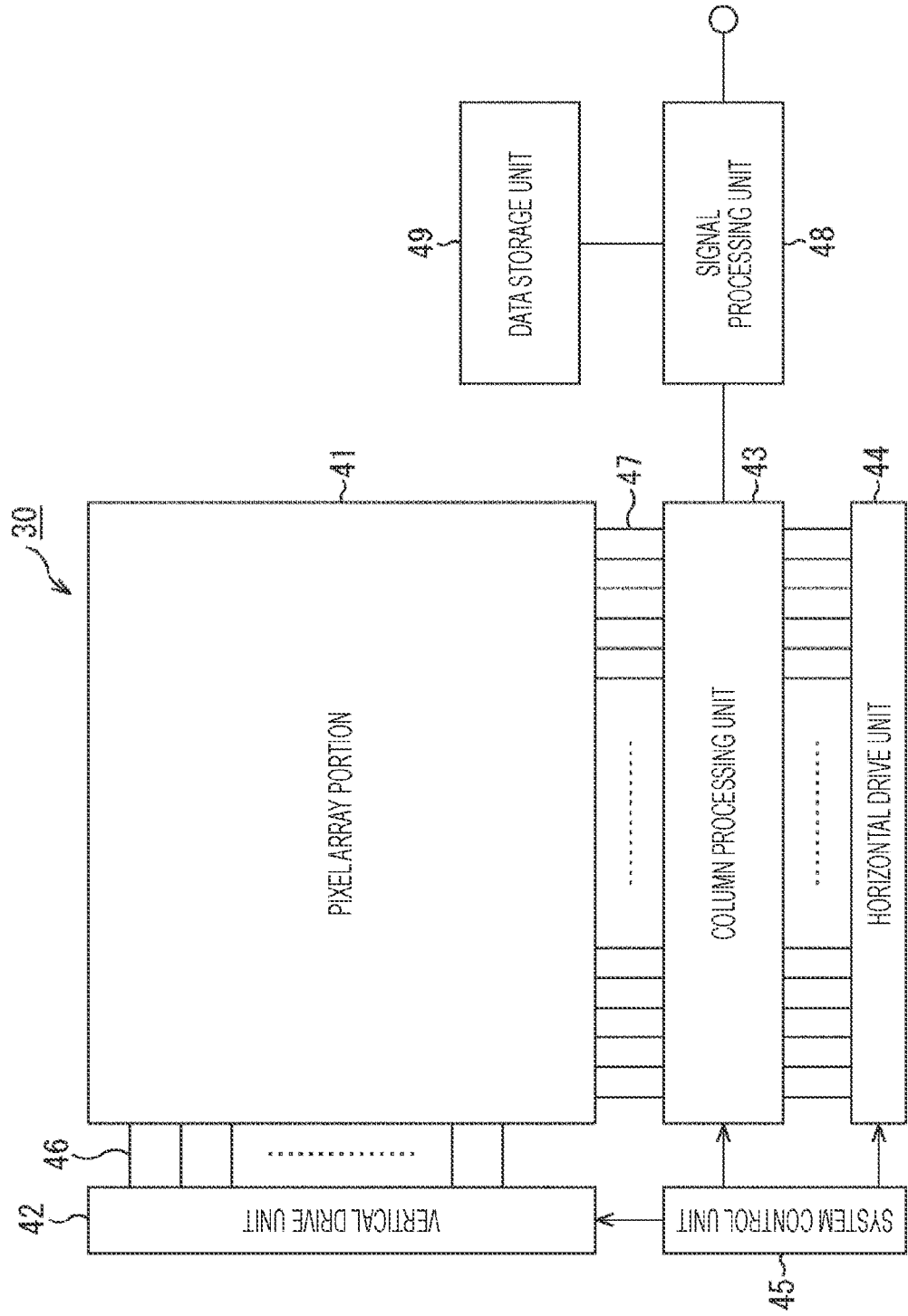
FIG. 1 is a diagram illustrating a configuration of an image sensor.

FIG. 1 is a block diagram for illustrating a configuration example of a complementary metal oxide semiconductor image sensor as an imaging element to which the present invention is applied.

A CMOS image sensor 30 includes a pixel array portion 41, a vertical drive unit 42, a column processing unit 43, a horizontal drive unit 44, and a system control unit 45. The pixel array portion 41, the vertical drive unit 42, the column processing unit 43, the horizontal drive unit 44, and the system control unit 45 are formed on a semiconductor substrate (chip) which is not illustrated.

In the pixel array portion 41, unit pixels (pixels 50 in FIG. 2) having photoelectric conversion elements in which photo-induced charges of a charge amount in accordance with an incident light amount are generated and accumulated inside are arranged in two dimensions in a matrix. Note that, in the following description, there is also a case where the photo-induced charges of the charge amount in accordance with the incident light amount will be simply referred to as "charges", and the unit pixels will be simply referred to as "pixels".

In the pixel array portion 41, further, pixel drive lines 46 are formed along a horizontal direction in the drawing (pixel arrangement direction of pixel rows) for each row of the pixel array in a matrix, and vertical signal lines 47 are formed along a vertical direction in the drawing (pixel arrangement direction of pixel columns) for each column. Respective one ends of the pixel drive lines 46 are connected to output terminals corresponding to the respective rows of the vertical drive unit 42.

The CMOS image sensor 30 further includes a signal processing unit 48 and a data storage unit 49. The signal processing unit 48 and the data storage unit 49 may be external signal processing units which are provided at a substrate different from the CMOS image sensor 30, for example, a digital signal processor (DSP) or a processing using software, or may be mounted on the same substrate as the CMOS image sensor 30.

The vertical drive unit 42 is a pixel drive unit which is constituted with a shift register, an address decoder, or the like, and which drives all pixels of the pixel array portion 41 at the same time or drives the pixels in units of row, or the like. While illustration of a specific configuration of the vertical drive unit 42 will be omitted, the vertical drive unit 42 has a configuration having a read scanning system, and a sweep scanning system or batch sweep and batch transmission.

The read scanning system sequentially selectively scans the unit pixels of the pixel array portion 41 in units of row to read out signals from the unit pixels. In a case of row driving (rolling shutter operation), sweep scanning is performed on a read row on which read scanning is to be performed by the read scanning system, ahead of the read scanning by a period corresponding to shutter speed. Further, in a case of global exposure (global shutter operation), batch sweep is performed ahead of batch transmission by a period corresponding to shutter speed.

By this sweep, unnecessary charges are swept (reset) from the photoelectric conversion elements in unit pixels of the read row. Then, by sweeping (reset) of unnecessary charges, so-called electronic shutter operation is performed. Here, the electronic shutter operation refers to operation of discarding photo-induced charges of the photoelectric conversion elements and starting new exposure (starting accumulation of photo-induced charges).

A signal read out by read operation by the read scanning system corresponds to an amount of light incident after the last read operation or the electronic shutter operation. In a case of row driving, a period from a read timing by the last read operation or a sweep timing by the electronic shutter operation until a read timing of read operation of this time becomes an accumulation period (exposure period) of photo-induced charges at the unit pixels. In a case of global exposure, a period from batch sweep until batch transmission becomes an accumulation period (exposure period).

A pixel signal output from each unit pixel of the pixel row which is selectively scanned by the vertical drive unit 42 is supplied to the column processing unit 43 through each vertical signal line 47. The column processing unit 43 performs predetermined signal processing on the pixel signal output from each unit pixel of the selected row through the vertical signal line 47 for each pixel column of the pixel array portion 41 and temporarily holds the pixel signal subjected to the signal processing.

Specifically, the column processing unit 43 performs at least noise removal processing, for example, correlated double sampling (CDS) processing as the signal processing. Through the correlated double sampling by this column processing unit 43, specific pattern noise specific to pixels, such as reset noise and threshold variation of an amplification transistor is removed. Note that it is also possible to provide, for example, an analog-digital (AD) conversion function other than the noise removal processing, to the column processing unit 43 and output a signal level using a digital signal.

The horizontal drive unit 44 is constituted with a shift register, an address decoder, or the like, and sequentially selects a unit circuit corresponding to the pixel column of the column processing unit 43. By selective scanning by this horizontal drive unit 44, the pixel signals subjected to the signal processing at the column processing unit 43 are sequentially output to the signal processing unit 48.

The system control unit 45 is constituted with a timing generator, or the like, which generates various kinds of timing signals, and controls drive of the vertical drive unit 42, the column processing unit 43, the horizontal drive unit 44, or the like, on the basis of the various kinds of timing signals generated at the timing generator.

The signal processing unit 48 has at least an addition processing function and performs various kinds of signal processing such as addition processing on the pixel signals output from the column processing unit 43. The data storage unit 49 temporarily stores data necessary for processing for the signal processing at the signal processing unit 48.

<Structure of Unit Pixel>

Figure 2:
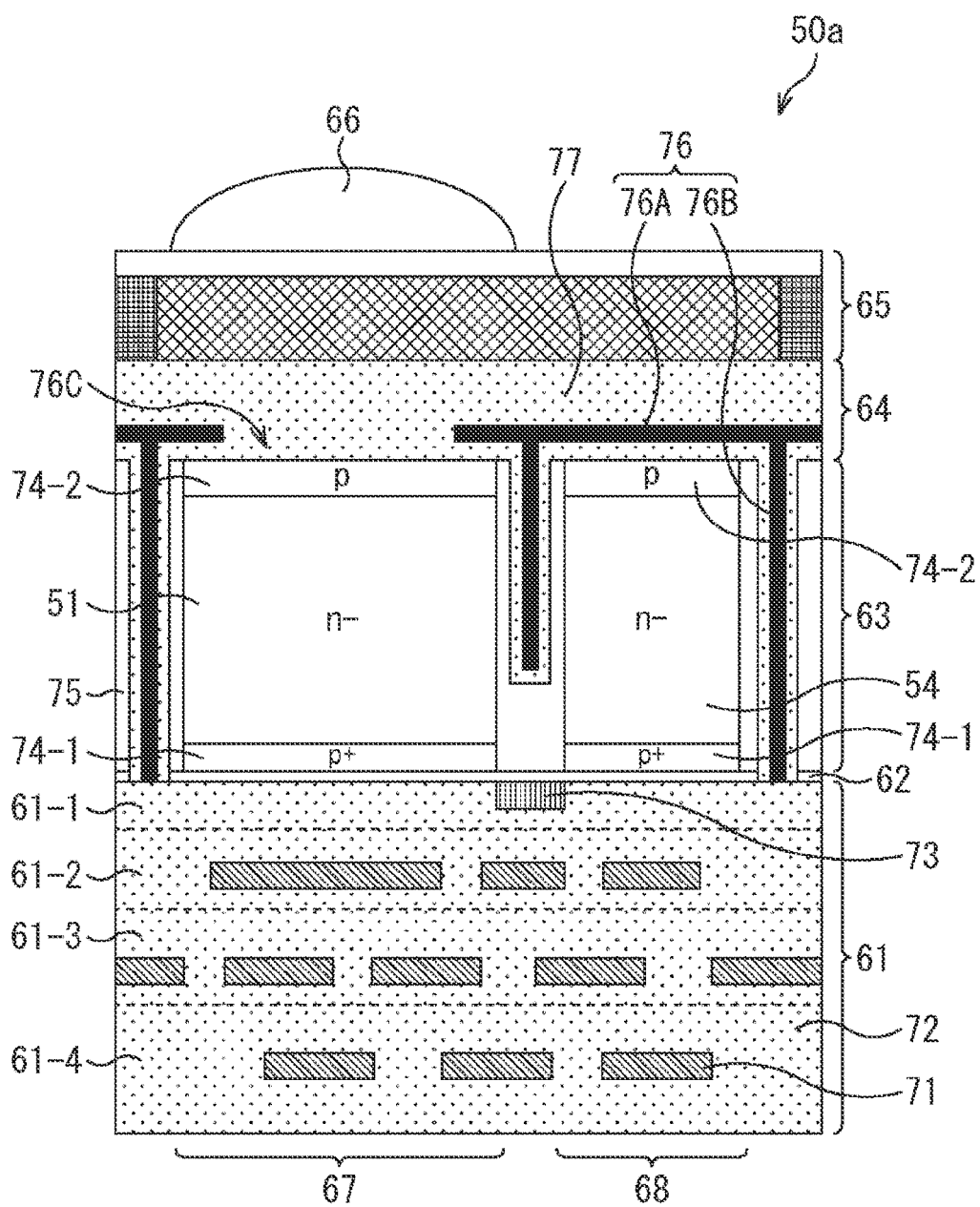
FIG. 2 is a cross sectional view illustrating a configuration of a pixel.

Next, a specific structure of the unit pixel 50 arranged in a matrix in the pixel array portion 41 illustrated in FIG. 1 will be explained. FIG. 2 is a cross-sectional view illustrating an example of a configuration of the pixel 50.

The pixel 50a illustrated in FIG. 2 has an electric charge holding part, in order to embody the global shutter. As illustrated in FIG. 2, a pixel 50a has an interconnect layer 61, an oxide film 62, a semiconductor substrate 63, a light shielding layer 64, a color filter layer 65, and an on-chip lens 66, all being stacked in this order from the bottom of FIG. 2. Moreover in the pixel 50a, a region in which a PD 51 is formed in the semiconductor substrate 63 is referred to as a PD region 67, and a region in which an electric charge holding part 54 is formed in the semiconductor substrate 63 is referred to as an electric charge holding region 68.

Note that the image sensor 30 is a so-called, backside-illuminated CMOS image sensor in which incident light is illuminated on the back face (upward face in FIG. 2) of the semiconductor substrate 63, which is opposite to the face of the semiconductor substrate 63 having the interconnect layer 61 arranged thereon. Although the explanation below will be continued dealing with the backside-illuminated CMOS image sensor, the present technology is also applicable to a front-illuminated image sensor.

The interconnect layer 61 is supported, for example, by a substrate support member (not illustrated) laid thereunder, and has, embedded in the interlayer dielectric 72, a plurality of interconnects 71 that typically takes part in readout operation of the electric charge in the PD 51 formed in the semiconductor substrate 63.

The interconnect layer 61 additionally has, in a region between the PD 51 and the electric charge holding part 54, a TRX gate 73 that configures a transfer transistor, arranged on the semiconductor substrate 63 while placing the oxide film 62 in between. With a predetermined voltage applied to the TRX gate 73, the electric charge accumulated in the PD 51 is transferred to the electric charge holding part 54.

The interconnect layer 61, exemplified in FIG. 2, has a four-layered structure that includes interconnect layers 61-1 to 61-4. The interconnect layer 61-1 is stacked on the semiconductor substrate 63, the interconnect layer 61-2 is stacked on the interconnect layer 61-1, the interconnect layer 61-3 is stacked on the interconnect layer 61-2, and the interconnect layer 61-4 is stacked on the interconnect layer 61-3. Interconnect patterns of the individual interconnect layers 61-1 to 61-4 will be described later.

The oxide film 62 has an insulating property, and electrically isolates the surface side of the semiconductor substrate 63. The semiconductor substrate 63 has formed therein an N-type region that configures the PD 51, and an N-type region that configures the electric charge holding part 54.

In addition, a surface pinning layer 74-1 is formed on the back face side of the PD 51 and the electric charge holding part 54, and a surface pinning layer 74-2 is formed on the front face side of the PD 51 and the electric charge holding part 54. The semiconductor substrate 63 further has formed therein an inter-pixel isolating region 75 that electrically isolates one pixel 50a and other neighboring pixel 50a, formed so as to surround the outer circumference of each pixel 50a.

The light shielding layer 64 includes a light shielding part 76 that includes a light shielding material, and is embedded in a high-k material film 77. For example, the light shielding part 76 typically includes a material such as tungsten (W), aluminum (Al), and copper (Cu), and is connected to an unillustrated GND. The high-k material film 77 includes a material such as silicon dioxide ($SiO_2$), hafnium oxide ($HfO_2$), tantalum pentoxide ($Ta_2O_5$), and zirconium dioxide ($ZrO_2$).

Further, the light shielding part 76 is formed including a cap part 76A that is arranged so as to cover the semiconductor substrate 63, and a buried part 76B that is arranged so as to be buried in a vertical trench formed in the semiconductor substrate 63 so as to surround the PD 51 and the electric charge holding part 54. That is, the cap part 76A is formed nearly in parallel to the individual layers that configure the pixel 50a, meanwhile the buried part 76B is formed nearly orthogonal to the cap part 76A down to a predetermined depth.

Now, the buried part 76B of the light shielding part 76 may be formed not only in the inter-pixel isolating region 75 so as to surround the PD 51 and the electric charge holding part 54, but also may be formed so as to surround the electric charge holding part 54, or so as to be formed between the PD 51 and the electric charge holding part 54, for example. That is, it suffices that the buried part 76B is formed at least between the PD 51 and the electric charge holding part 54, and therefore the PD 51 and the electric charge holding part 54 can be electrically isolated by the buried part 76B.

The light shielding part 76 additionally has formed therein an opening 76C through which light is incident on the PD 51. That is, the opening 76C is formed in a region faced to the PD 51, whereas the other region, which is for example a region having formed therein the electric charge holding part 54, an FD 55, and so forth, is shaded from light by the light shielding part 76.

Note that in the example illustrated in FIG. 2, the light shielding part 76 is formed so that a part of the buried part 76B extends through the semiconductor substrate 63. That is, the light shielding part 76 is formed so that the buried part 76B thereof, which falls outside the region between the PD 51 and the electric charge holding part 54, that is, outside the region that serves as a transfer path for transferring the electric charge from the PD 51 to the electric charge holding part 54, is formed so as to extend through the semiconductor substrate 63.

More specifically, although the region between the PD 51 and the electric charge holding part 54, which is used for transferring the electric charge, is not allowed for formation of the light shielding part, the residual region is allowed for formation of the buried part 76B, making it possible to effectively prevent light leaked elsewhere from outside the PD 51 of the same pixel 50a, from entering the electric charge holding part 54.

The color filter layer 65 has arranged therein, pixel 50a by pixel 50a, filters through which lights having respectively corresponded colors can transmit. For example, the filters that allow green, blue, and red lights to transmit therethrough are arranged according to so-called Bayer arrangement for every pixel 50a. The on-chip lens 66 is a small sized lens that condenses the light incident on the pixel 50a, onto the PD 51.

<Layout on Semiconductor Substrate>

Figure 3:
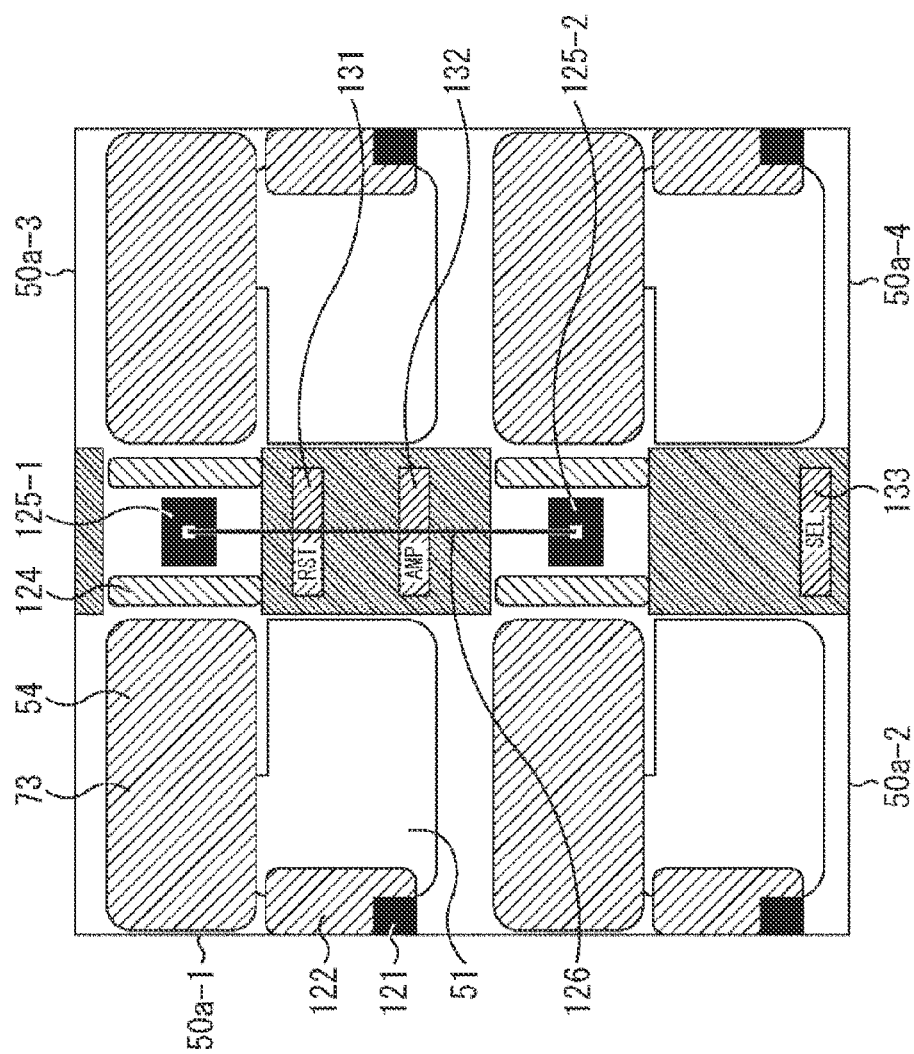
FIG. 3 is a plan view illustrating a configuration of a pixel.

FIG. 3 is a plan view of the pixel 50 illustrated in FIG. 2 when viewed from the bottom (lower side of FIG. 2). Since the present technology demonstrates its effect particularly when applied to a configuration having a predetermined transistor shared among a plurality of pixels, so that first of all, a plan view in a case where predetermined transistors or the like are shared by four pixels arranged in a 2×2 matrix will be illustrated in FIG. 3. Note although plan views that follow FIG. 3 will not depict the light shielding part 76, there are actually formed a penetrating-type light shielding part 76 and a non-penetrating-type light shielding part 76 around the PD 56 and the electric charge holding part 54.

FIG. 3 illustrates four pixels 50a-1 to 50a-4 arranged in a pixel array portion 41. The pixel 50a-1 is arranged on the top left of the drawing, the pixel 50a-2 is arranged on the bottom left of the drawing, the pixel 50a-3 is arranged on the top right of the drawing, and the pixel 50a-4 is arranged on the bottom right of the drawing. Since the individual pixels 50a basically have the same structure, so that the explanation below will be made referring to the pixel 50a-1 arranged on the top left of the drawing.

An OFD 121 is arranged on the bottom left side of the pixel 50a-1. The OFD 121 represents the drain connected to the reset gate of the PD 51. The OFD 121 is connected through an OFG gate 122 to the PD 51.

On the top side of the PD 51, there is arranged the electric charge holding part 54. The pixel 50a, when viewed from the bottom (on the side of the interconnect layer 61), has the TRX gate 73 arranged in a region where the electric charge holding part 54 is arranged. The TRX gate 73 is provided in order to control transfer of the electric charge from the PD 51 to the electric charge holding part 54.

On the right side, in the drawing, of the electric charge holding region 68, there is arranged a floating diffusion region 125 (FD 125) while placing the TRX gate 73 in between. A TRG gate 124 is provided to transfer the electric charge from the electric charge holding part 54 to the FD 125.

An FD 125-1 is arranged between the pixel 50a-1 and the pixel 50a-3, and an FD 125-2 is arranged between the pixel 50a-2 and the pixel 50a-4. In addition, the FD 125-1 and the FD 125-2 are connected through an FD interconnect 126. The FD 125-1 and the FD 125-2 are connected through the FD interconnect 126 and thereby function as a single FD. Moreover, the FD 125-1 and the FD 125-2, thus functioning as a single FD, are shared among the pixels 50a-1 to 50a-4.

Between the pixel 50a-1 and the pixel 50a-3, arranged are a reset transistor 131 (indicated as RST in the drawing) and an amplification transistor 132. In addition, between the pixel 50a-2 and the pixel 50a-4, arranged is a selection transistor 133 (indicated as SEL in the drawing). Although not illustrated in FIG. 3, a conversion efficiency switching transistor may alternatively be arranged between the pixel 50a-2 and the pixel 50a-4. A configuration having the conversion efficiency switching transistor will be described later. In addition, in the configuration free of the conversion efficiency switching transistor as illustrated in FIG. 3, a dummy may be arranged for design symmetry.

The example illustrated in FIG. 3 is configured to share the reset transistor 131, the amplification transistor 132, and the selection transistor 133, among four pixels 50a.

With such a configuration in which the transistors are shared among the plurality of pixels, a region assigned to a single transistor may be expanded. By making the region assigned to each transistor expandable, obtainable is a configuration having larger source-drain distance of the transistor, or a configuration prevented from leakage.

Further, the configuration with the transistors shared among the plurality of pixels also enables downsizing.

In the configuration of co-owning pixels illustrated in FIG. 3, the reset transistor 131, the amplification transistor 132, and the selection transistor 133 are arranged vertically in the drawing, and assuming now the FD interconnect 126 as an axis of symmetry, the PD 51, the electric charge holding part 54, the OFD 121, and so forth are arranged bilaterally symmetrical.

Figure 4:
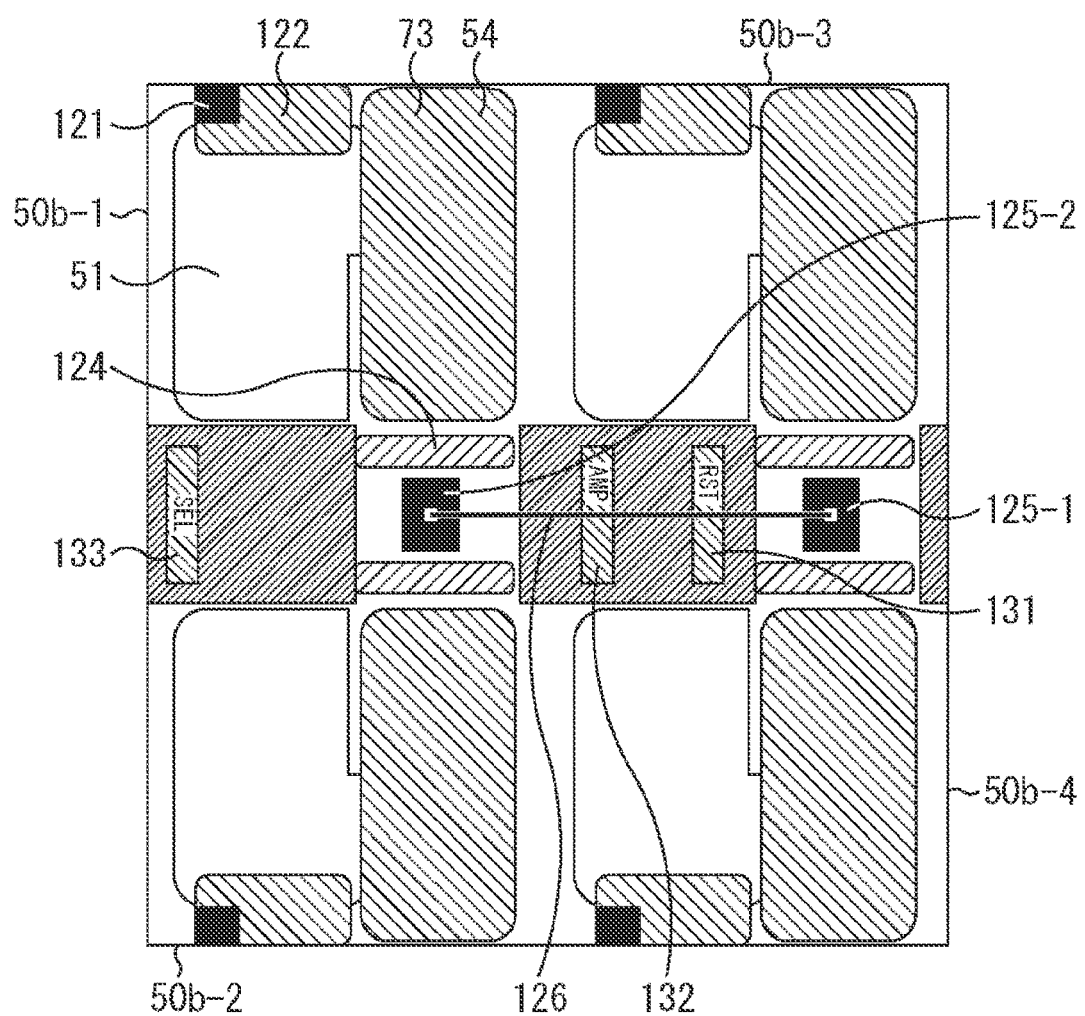
FIG. 4 is a plan view illustrating another configuration of the pixels.

The present technology is applicable to the bilaterally symmetrical structure illustrated in FIG. 3, and also to a vertically symmetrical structure illustrated in FIG. 4. FIG. 4 is a plan view illustrating another exemplary layout of the pixel 50. A pixel 50b-1 is arranged on the top left of FIG. 4, a pixel 50b-2 is arranged on the bottom left of the drawing, a pixel 50b-3 is arranged on the top right of the drawing, and a pixel 50b-4 is arranged on the bottom right of the drawing.

An FD 125-1 is arranged between the pixel 50b-3 and the pixel 50b-4, an FD 125-2 is arranged between the pixel 50*b*-1 and the pixel 50*b*-2, and the FD 125-1 and the FD 125-2 are connected through the FD interconnect 126. Assuming the FD interconnect 126 as an axis of symmetry, the PD 51, the electric charge holding part 54, the OFD 121, and so forth are arranged vertically symmetrical.

In addition, the reset transistor 131 and the amplification transistor 132 are arranged between the pixel 50*b*-3 and the pixel 50*b*-4, and selection transistor 133 is arranged between the pixel 50*b*-1 and the pixel 50*b*-2. In the configuration of co-owning pixels illustrated in FIG. 4, the reset transistor 131, the amplification transistor 132, and the selection transistor 133 are arranged in the transverse direction of the drawing.

The present technology is also applicable to a case where the pixels are arranged vertically symmetrical, as illustrated in FIG. 4.

While FIGS. 3 and 4 have illustrated the configurations in which predetermined transistors are shared by four pixels arranged in a 2×2 matrix, the present technology is also applicable to a case where the predetermined transistors are shared by two pixels.

Figure 5:
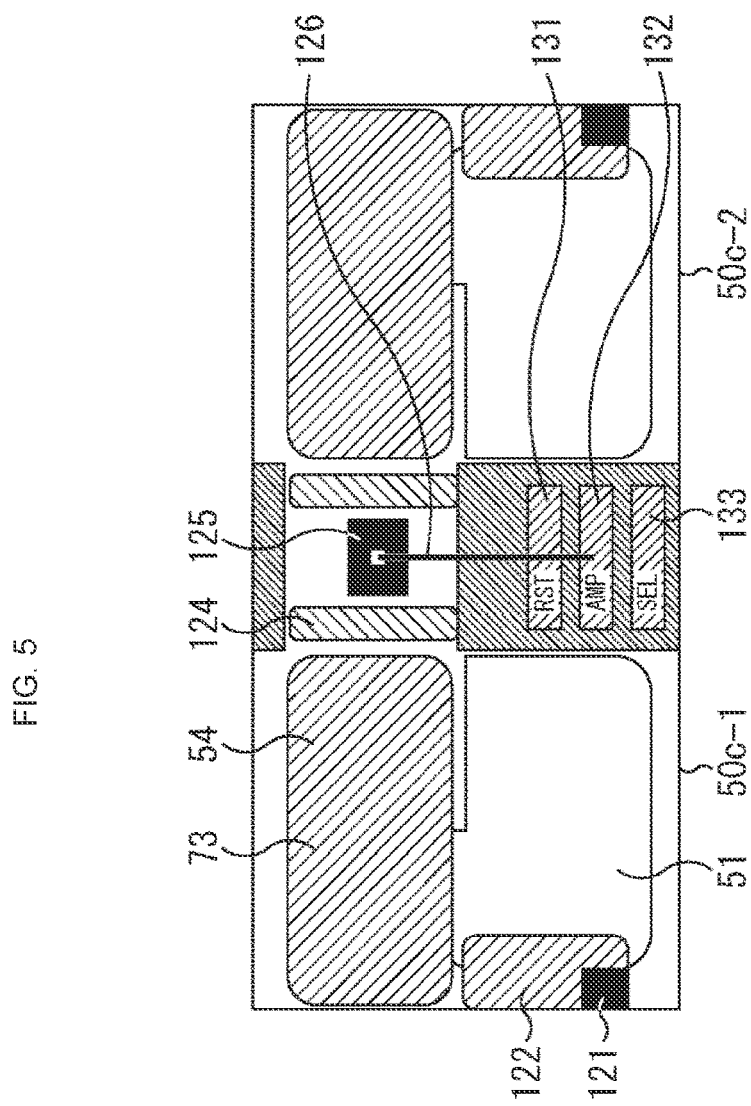
FIG. 5 is a plan view illustrating another configuration of the pixels.

FIG. 5 is a plan view illustrating an exemplary layout of the pixel 50*c* in a two-pixel shared configuration. A pixel 50*c*-1 is arranged on the left side of FIG. 5, and a pixel 50*c*-2 is arranged on the right side of the drawing.

Between the pixel 50*c*-1 and the pixel 50*c*-2 arranged laterally in the drawing, there are arranged the FD 125, the reset transistor 131, the amplification transistor 132, and the selection transistor 133. The FD 125 and the amplification transistor 132 are connected through the FD interconnect 126.

Assuming the FD interconnect 126 as the axis of symmetry, the PD 51, the electric charge holding part 54, the OFD 121, and so forth are arranged bilaterally symmetrical. The present technology is applicable not only to the two-pixel-shared, bilaterally symmetrical structure illustrated in FIG. 5, but also to a two-pixel-shared, vertically symmetrical structure illustrated in FIG. 6.

Figure 6:
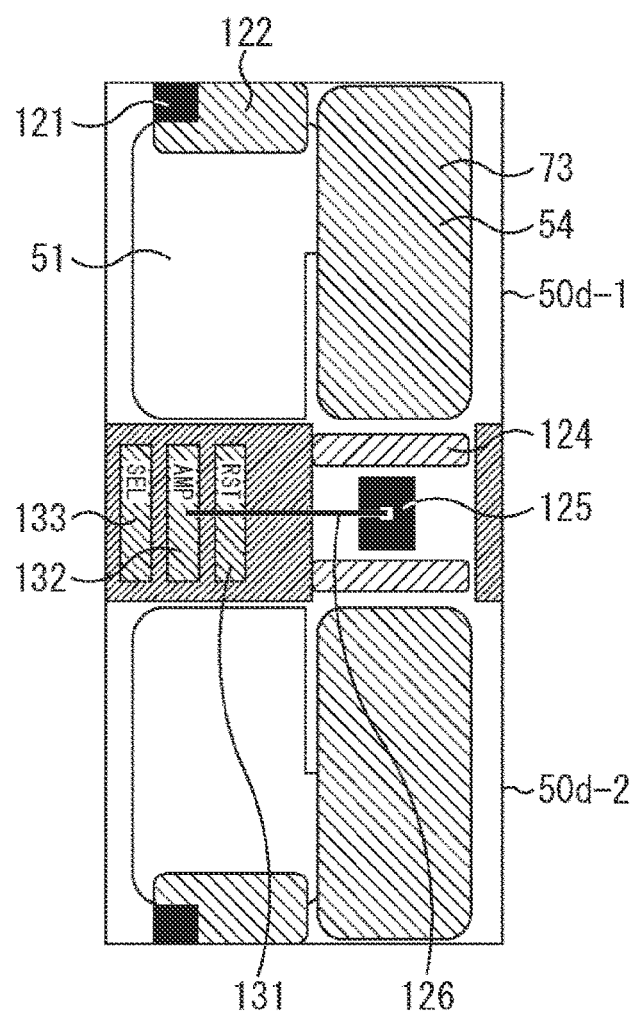
FIG. 6 is a plan view illustrating another configuration of the pixels.

FIG. 6 is a plan view illustrating another exemplary layout of the pixel 50. A pixel 50*d*-1 is arranged on the top side of FIG. 6, and a pixel 50*d*-2 is arranged on the bottom side of the drawing. Between the pixel 50*d*-1 and the pixel 50*d*-2 arranged vertically in the drawing, there are arranged the FD 125, the reset transistor 131, the amplification transistor 132, and the selection transistor 133. The FD 125 and the amplification transistor 132 are connected through the FD interconnect 126.

Assuming the FD interconnect 126 as an axis of symmetry, the PD 51, the electric charge holding part 54, the OFD 121, and so forth are arranged vertically symmetrical. The present technology is applicable not only to the two-pixel-shared, bilaterally symmetrical structure illustrated in FIG. 5, but also to a two-pixel-shared, vertically symmetrical structure illustrated in FIG. 6.

Furthermore, in the two co-owning pixel configuration in which the predetermined transistors and so forth are shared by vertically arranged two pixels, the electric charge holding part 54 may be arranged so as to be shifted by a half pitch relative to the PD 51.

Figure 7:
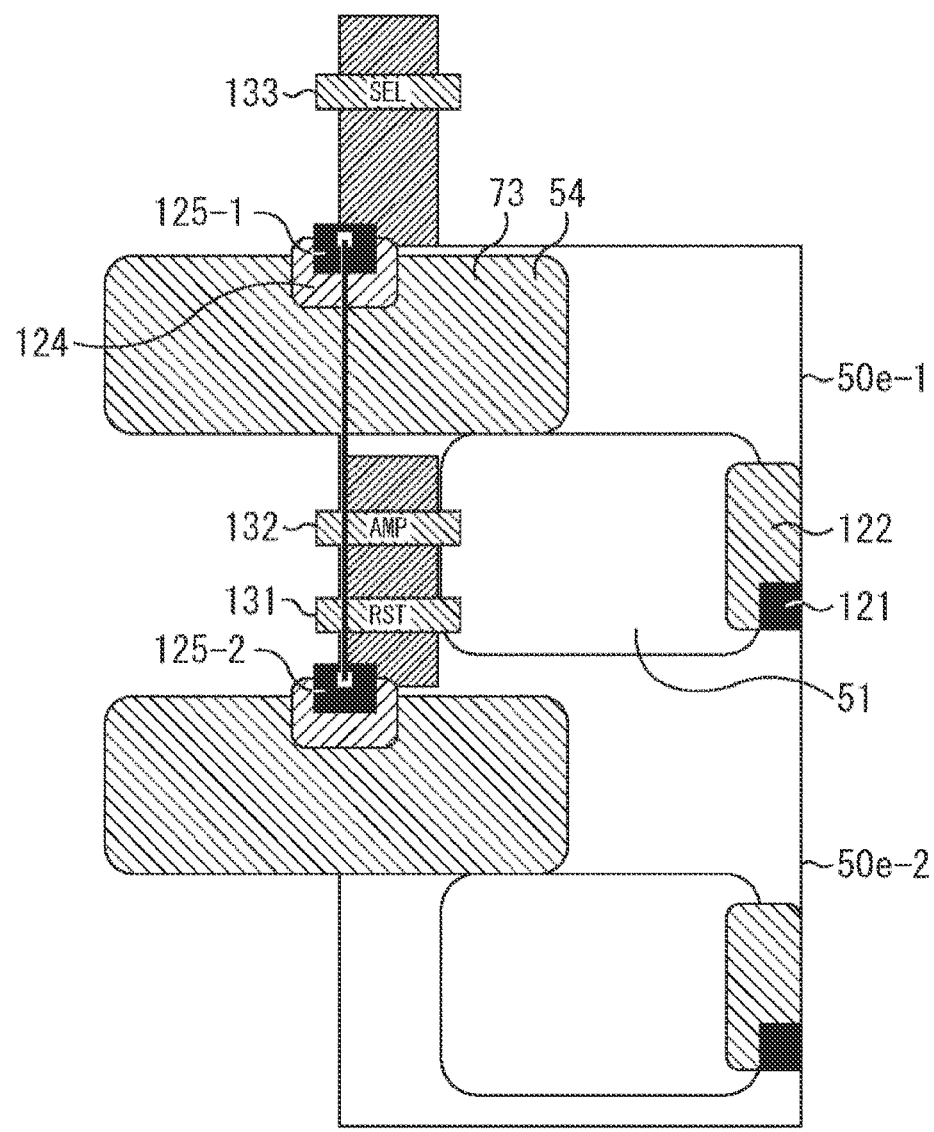
FIG. 7 is a plan view illustrating another configuration of the pixels.

FIG. 7 is a plan view illustrating another exemplary layout of the pixels 50. A pixel 50*e*-1 is arranged on the top side of FIG. 7, meanwhile a pixel 50*e*-2 is arranged on the bottom side of the drawing. In the exemplary layout illustrated in FIG. 7, the OFD 121 and the OFG gate 122 are arranged on the bottom right side of the pixel 50*e*-1.

The electric charge holding part 54 is arranged on the top left side of the PD 51, and at a position shifted by a half pitch from the PD 51. The pixel 50*e*, when viewed from the bottom (on the side of the interconnect layer 61), has the TRX gate 73 arranged in a region where the electric charge holding part 54 is arranged. The TRG gate 124 is arranged on the center top side in the drawing of the TRX gate 73. Furthermore, the FD 125 is formed on the center top side in the drawing of the TRG gate 124.

The pixel 50*e*-2 also has a configuration similar to that of the pixel 50*e*-1. The pixel 50*e*-1 has the FD 125-1 arranged therein, and the pixel 50*e*-2 has the FD 125-2 arranged therein. The FD 125-1 and the FD 125-2 are connected through the FD interconnect 126.

Between the pixel 50*e*-1 and the pixel 50*e*-2, there are arranged the reset transistor 131 and the amplification transistor 132, and on the top side in the drawing of the pixel 50*e*-1, the selection transistor 133 is arranged. In the exemplary configuration illustrated in FIG. 7, the reset transistor 131, the amplification transistor 132, and the selection transistor 133 are shared by two pixels 50*e*.

If focused on the pixel 50*e*-1, a destination to which the electric charge, accumulated in the PD 51 of the pixel 50*e*-1, will be transferred is the electric charge holding part 54 that is formed below the TRX gate 73 arranged on the top left side in the drawing of the pixel 50*e*-1. Similarly, if focused on the pixel 50*e*-2, a destination to which the electric charge, accumulated in the PD 51 of the pixel 50*e*-2, will be transferred is the electric charge holding part 54 that is formed below the TRX gate 73 arranged on the top left side in the drawing of the pixel 50*e*-2.

The PD 51 and the electric charge holding part 54 are in a positional relation shifted by a half pitch. With the electric charge holding part 54 arranged so as to be shifted by a half pitch relative to the PD 51, now the TRG gate 124 can be arranged at the center part of the electric charge holding part 54 (TRX gate 73). With the TRG gate 124 positioned at the center part of the electric charge holding part 54, it now becomes possible to shorten the transfer length inside the electric charge holding part 54, and to improve the transfer efficiency.

Figure 8:
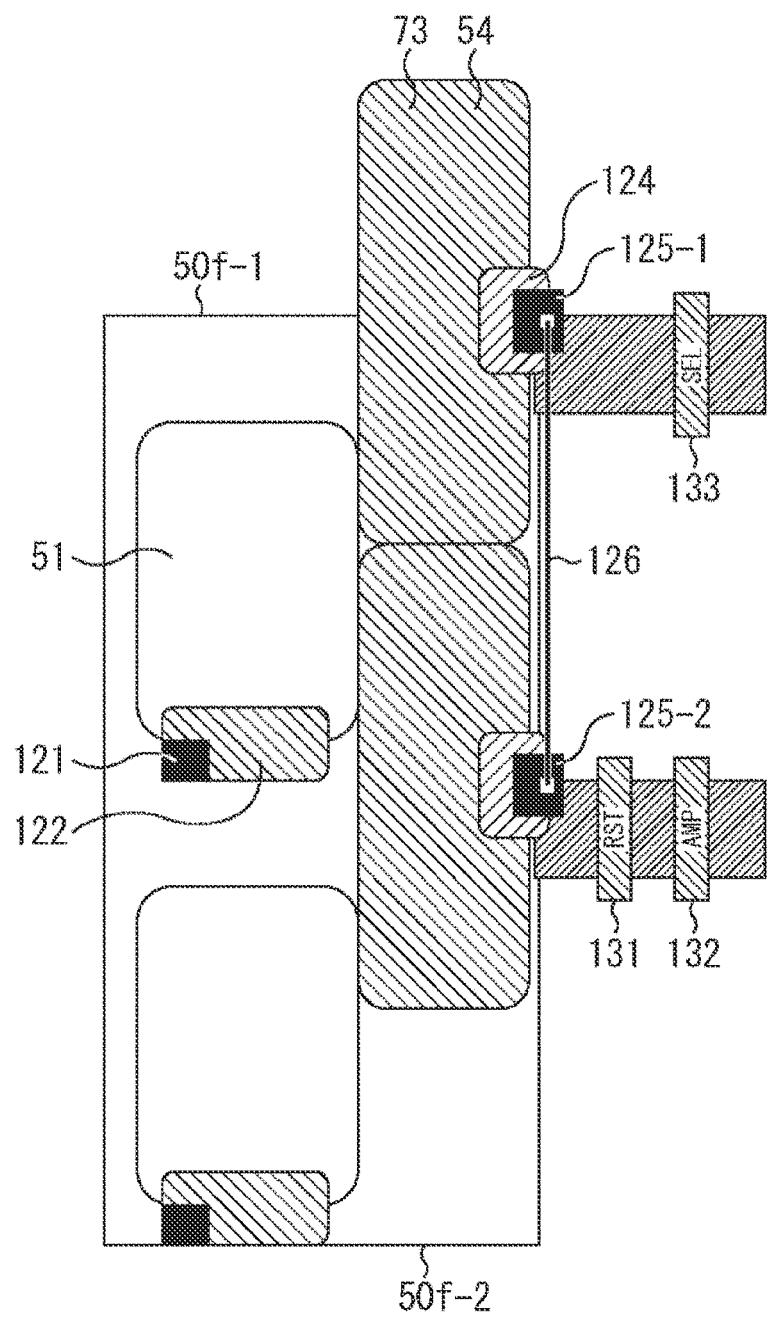
FIG. 8 is a plan view illustrating another configuration of the pixels.

Although FIG. 7 has illustrated an exemplary case where the PD 51 is arranged with the long edge aligned laterally, and with the electric charge holding part 54 arranged on the long edge side of the PD 51 while shifted by a half pitch, the present technology is also applicable to a case illustrated in FIG. 8, where the PD 51 is arranged with the long edge aligned in the vertical direction, and the electric charge holding part 54 is arranged on the long edge side of the PD 51 while shifted by a half pitch.

FIG. 8 is a plan view illustrating another exemplary layout of the pixel 50. A pixel 50*f*-1 and a pixel 50*f*-2 are arranged in the vertical direction, similarly to the exemplary layout illustrated in FIG. 7. In the exemplary layout illustrated in FIG. 8, the OFD 121 and the OFG gate 122 are arranged on the bottom side of the pixel 50*f*.

The electric charge holding part 54 (TRX gate 73) is arranged on the right side in the drawing of the PD 51, and at an upper position shifted by a half pitch from the PD 51. The TRX gate 124 is arranged on the center right side in the drawing of the TRX gate 73. Furthermore, the FD 125 is formed on the center right side in the drawing of the TRG gate 124.

The pixel 50*f*-2 also has a configuration similar to that of the pixel 50*f*-1. The pixel 50*f*-1 has the FD 125-1 arranged therein, and the pixel 50*f*-2 has the FD 125-2 arranged therein. The FD 125-1 and the FD 125-2 are connected through the FD interconnect 126.

A configuration for boosting the FD described below is applicable to the configurations illustrated in FIGS. 3 to 8. Although not illustrated in FIGS. 3 to 8, such a configuration is further applicable, for example, to a configuration where the FD 125, the reset transistor 131, and so forth are shared among eight pixels. Application of the present technology is therefore not limited to the configurations illustrated in FIGS. 3 to 8.

<Configuration for Boosting FD>

The aforementioned pixel 50 has the global shutter structure that makes the electric charge holding part 54 temporarily hold the electric charge accumulated in the PD 51. The pixel equipped with the electric charge holding part 54 tends to reduce an area that can keep a necessary amount of saturated charge (Qs), as compared with the pixel in a structure free of the electric charge holding part 54. The pixel provided with the electric charge holding part 54, with the potential deepened so as to keep the necessary amount of saturated charge, would make it difficult to attain a necessary level of dynamic range, and pump-up property of the FD 125.

A necessary level of dynamic range of the FD 124 will be attained, and the pump-up property is prevented from degrading, by arranging an interconnect for boosting the FD 125 in the vicinity of the FD interconnect 126 so as to boost the FD 125, as explained below.

The explanation below will be continued dealing with a configuration capable of boosting the FD 125, referring to the configuration illustrated in FIG. 3, out of the configurations of the pixel 50 illustrated in FIGS. 3 to 8.

Figure 9:
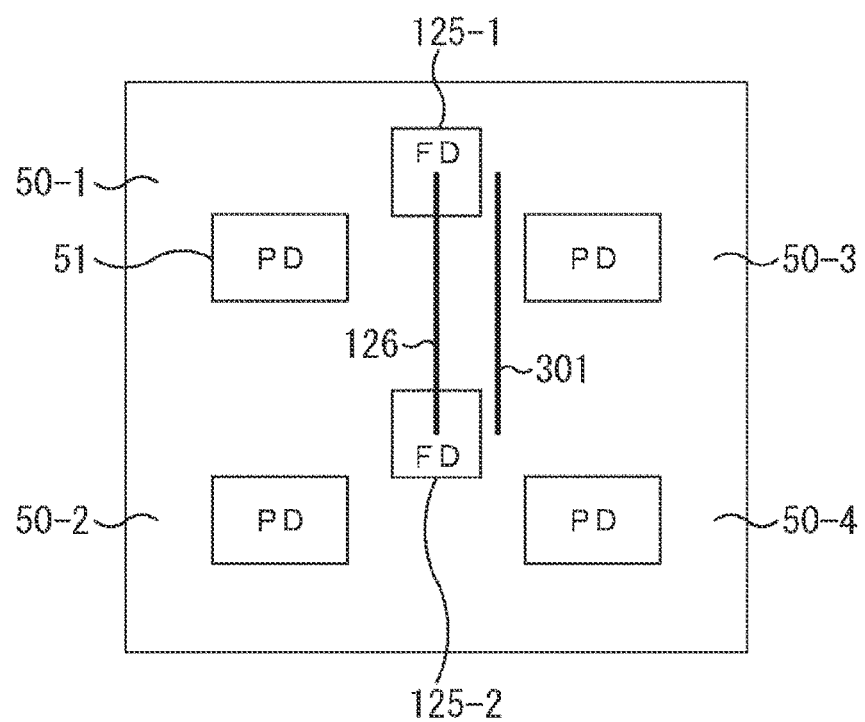
FIG. 9 is a diagram for explaining an FD boost interconnect.

FIG. 9 is a diagram illustrating a four co-owning pixel structure for boosting the FD 125. Although FIG. 9 illustrates the PD 51, the FD 125, and the FD interconnect 126 for the convenience of explanation, also the TRX gate 73 and so forth are actually arranged as illustrated in FIG. 3.

The PD 51 and the FD 125 that configure the pixel 50 illustrated in FIG. 9 are formed in the semiconductor substrate 63 (FIG. 2). The FD interconnect 126 that connects the FD 125-1 and the FD 125-2 is formed in the interconnect layer 61. The explanation here will be continued referring to an exemplary case where the FD interconnect 126 is formed in the interconnect layer 61-1 that configures the interconnect layer 61.

Assuming now that four pixels 50-1 to 50-4 configure a single co-owning unit, there are formed two FD's 125 (two FD regions) per a single co-owning unit in the semiconductor substrate 63, and such two FD regions are connected through the FD interconnect 126 that is formed in the underlying interconnect layer 61-1. The FD 125 and the FD interconnect 126 are connected through a via formed in the vertical direction (from the semiconductor substrate 63 towards the interconnect layer 61-1).

As illustrated in FIG. 9, an FD boost interconnect 301 is formed in parallel to the FD interconnect 126. The FD boost interconnect 301 is formed in the same layer with the FD interconnect 126, that is, in the interconnect layer 61-1 in this case. In addition, the FD boost interconnect 301 is formed so as to have, at least in a part thereof, a section laid in parallel to the FD interconnect 126.

The FD interconnect 126 and the FD boost interconnect 301, although illustrated in FIG. 9 as being straight for the convenience of explanation, may alternatively be formed according to a pattern that includes a combination of straight lines with predetermined angles (kinked line), or according to a non-linear pattern, such as a pattern including arc, depending for example on a layout and pattern of the transistors, and positional relation with the vias through which connection with the interconnects in the other layers is established. A specific layout will be described later referring to an exemplary case.

As illustrated in FIG. 9, at least a part of the FD boost interconnect 301 is in the form of straight line in parallel to the FD interconnect 126. Such a parallel and straight section of the FD boost interconnect 301 may have a length equivalent to, or shorter than, or longer than the length of the FD interconnect 126.

In addition, the FD boost interconnect 301 may have a thickness equivalent to, or thicker than, or thinner than the thickness of the FD interconnect 126. The length, thickness, and pattern of the FD boost interconnect 301 are properly designed, while being suited to the length, thickness, and pattern of the FD interconnect 126 as described above.

Figure 10:
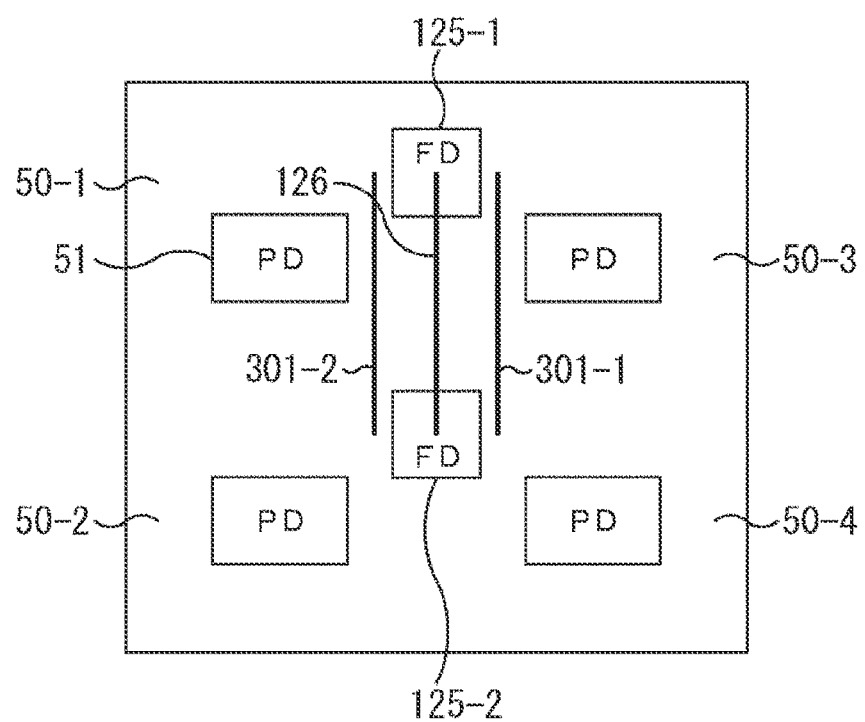
FIG. 10 is a diagram for explaining an FD boost interconnect.

Moreover as illustrated in FIG. 9, the FD boost interconnect 301 may be formed as a single line laid on the right side of the FD interconnect 126. Alternatively, as illustrated in FIG. 10, the FD boost interconnect 301 may be formed as a single line (referred to as FD boost interconnect 301-1) laid on the right side of the FD interconnect 126, and again as a single line (referred to as FD boost interconnect 301-2) on the left side. The FD boost interconnect 301-1 and the FD boost interconnect 301-2, in a case where there is no need to discriminate them from each other, will be simply referred to as the FD boost interconnect 301, hereinafter.

In a case where the FD boost interconnect 301-1 and the FD boost interconnect 301-2 are formed respectively on the right and left sides of the FD interconnect 126 as illustrated in FIG. 10, the FD boost interconnect 301-1 and the FD boost interconnect 301-2 are formed symmetrical about the FD interconnect 126 which is assumed as the axis of symmetry. Further, they may alternatively be formed asymmetrical. For example, acceptable is an asymmetrical configuration in which the FD boost interconnect 301-1 is formed on the top right side of the FD interconnect 126, meanwhile the FD boost interconnect 301-2 is formed on the bottom left side of the FD interconnect 126.

The FD boost interconnects 301-1 and 301-2, although illustrated in FIGS. 9 and 10 so as not to overlap the FD 125 and the PD 51, may alternatively arranged in an overlapped manner. Note, however that the distance between the FD interconnect 126 and the FD boost interconnect 301 preferably falls in the range from 100 to 420 nm. With the distance set to 100 nm or shorter, the FD interconnect 126 and the FD boost interconnect 301 will need high accuracy of formation, making the formation difficult.

On the other hand, with the distance set to 420 nm or wider, the FD boost interconnect 301 if formed somehow would become difficult to properly boost the FD 125, or, since there will be a room for forming any other interconnect between the FD interconnect 126 and the FD boost interconnect 301, so that formation of such other interconnect would make it difficult to properly boost the FD 125.

Moreover, keeping a distance of 420 nm or wider between the FD interconnect 126 and the FD boost interconnect 301, with no other interconnect formed in between, will prevent downsizing of the pixel.

The distance between the FD interconnect 126 and the FD boost interconnect 301 is therefore determined within the range from 100 to 420 nm. Note, however, that these values are only illustrative, and are not restrictive.

The FD interconnect 126 and the FD boost interconnect 301 illustrated in FIGS. 9 and 10 are individually formed in the interconnect layer 61-1. In other words, the FD interconnect 126 and the FD boost interconnect 301 are formed in the same layer. The FD interconnect 126 and the FD boost interconnect 301 may alternatively be formed in different layers as illustrated in FIG. 11.

Figure 11:
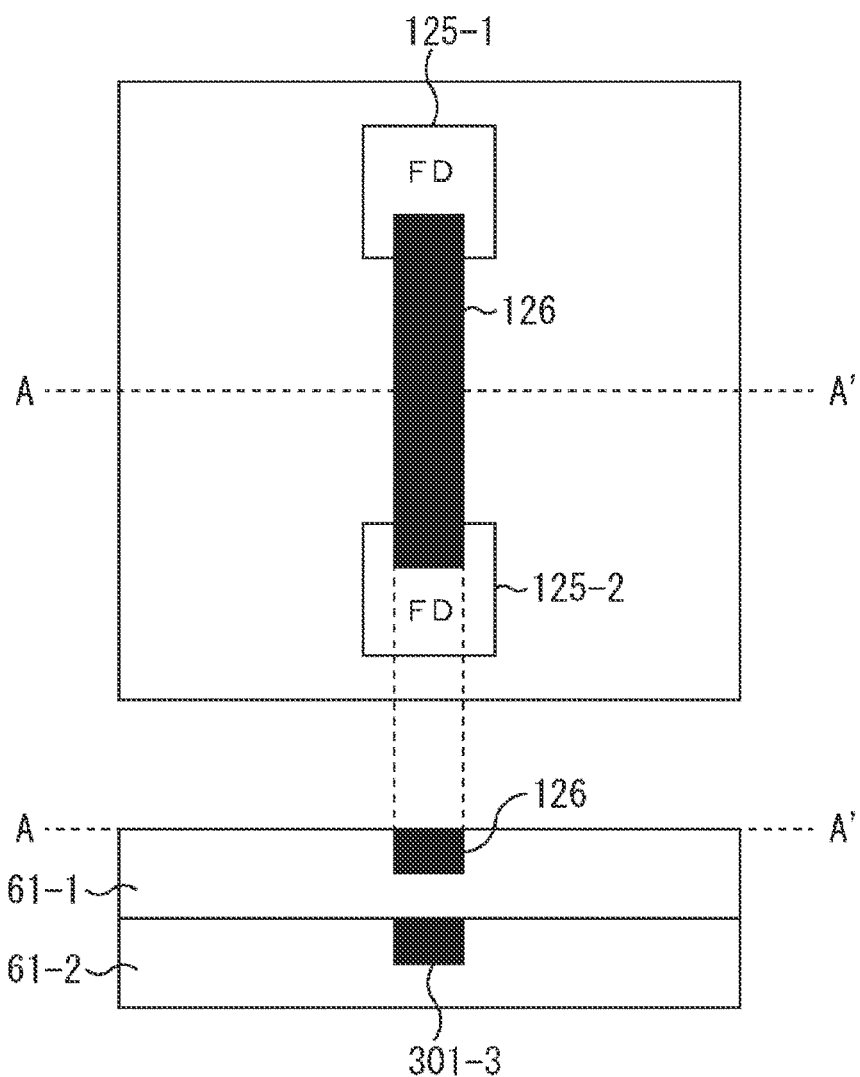
FIG. 11 is a view for explaining an FD boost interconnect.

The upper drawing of FIG. 11 is a plan view enlarging a part of the FD interconnect 126 in a single co-owning unit in a four co-owning pixel configuration, meanwhile the lower drawing of FIG. 11 is a cross sectional view taken along line A-A' in the plan view. Similarly to as described above, the FD 125-1 and the FD 125-2 are connected through the FD interconnect 126. The FD interconnect 126 is formed in the interconnect layer 61-1, as illustrated in the lower drawing.

The FD interconnect 126 is formed in the interconnect layer 61-1, and the FD boost interconnect 301-3 is formed in the interconnect layer 61-2 which is stacked directly below the interconnect layer 61-1. A relation between the FD interconnect 126 and the FD boost interconnect 301-3 is same as the aforementioned relation between the FD interconnect 126 and the FD boost interconnect 301-1 (or FD boost interconnect 301-2). That is, the FD interconnect 126 and the FD boost interconnect 301-3 are formed straight, at least partially in parallel to each other.

Such a parallel and straight section of the FD boost interconnect 301-3 may have a length equivalent to, or shorter than, or longer than the length of the FD interconnect 126. In addition, the FD boost interconnect 301-3 may have a thickness equivalent to, or thicker than, or thinner than the thickness of the FD interconnect 126. The length, thickness, and pattern of the FD boost interconnect 301 are properly designed, while being suited to the length, thickness, and pattern of the FD interconnect 126 as described above.

By forming the FD interconnect 126 and the FD boost interconnect 301-3 in the different layers as illustrated in FIG. 11, the FD boost interconnect 301-3 may also be a structure allowed to shield the FD interconnect 126.

As illustrated in FIGS. 9 to 11, the FD boost interconnect 301 for boosting the FD 125 is formed in the same layer with the FD interconnect 126, or in the different layers, or in the vicinity of the FD interconnect 126.

Note now, in the description of the FD interconnect 126, having explained the FD interconnect 126 as an "interconnect" as its terminology implies, also the FD interconnect 126 per se can function to accumulate the electric charge transferred from the PD 51, and can function as the FD 125. The FD interconnect 126, although being termed as the FD interconnect 126, is therefore not a mere interconnect, but the FD interconnect 126 also configures a part of the FD 125.

That is, in the present technology, in the vicinity of the FD 125, the FD boost interconnect 301 for boosting the FD 125 is formed in the vicinity of the FD 125. Now in a case where the FD 125 is shared among the pixels, FD regions are formed in different regions in the semiconductor substrate 63 and then the FD regions are connected through an interconnect, so that the description here has exemplified the case where the FD boost interconnect 126 is formed in the vicinity of the interconnect (FD interconnect 126).

Figure 12:
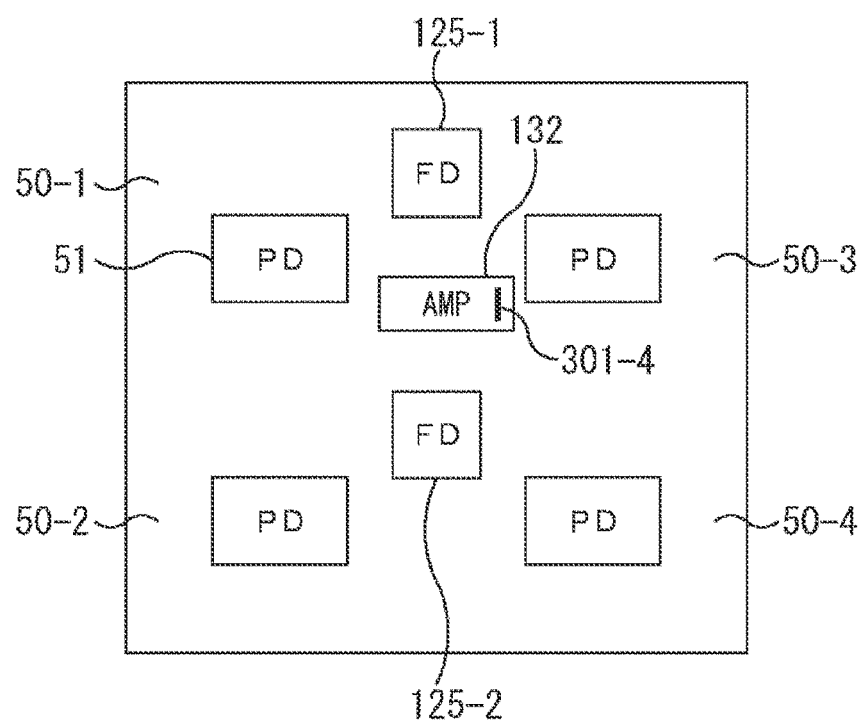
FIG. 12 is a diagram for explaining an FD boost interconnect.

Moreover as illustrated in FIG. 12, the FD boost interconnect 126 may be connected to a part of the amplification transistor 132 to which the FD 125 is connected. Referring now to the pixel of one co-owning unit illustrated in FIG. 12, an FD boost interconnect 301-4 is formed so as to be connected to the amplification transistor 132 shared among the pixel 50-1 to 50-4.

An amplification transistor gate, which is the part of the amplification transistor 132, is formed in the interconnect layer 61-1. The FD boost interconnect 301-4 is formed so as to be connected to such an amplification transistor gate. The FD boost interconnect 301-4 may have a linear pattern. Alternatively, it may be formed so as to come into contact with the amplification transistor gate at a point, for example through a via, and so as to connect also with an interconnect which is provided in the other layer and is connected to a power source for boosting FD, in which a part which is brought into point contact with the amplification transistor gate may be utilized as the FD boost interconnect 301-4.

Figure 13:
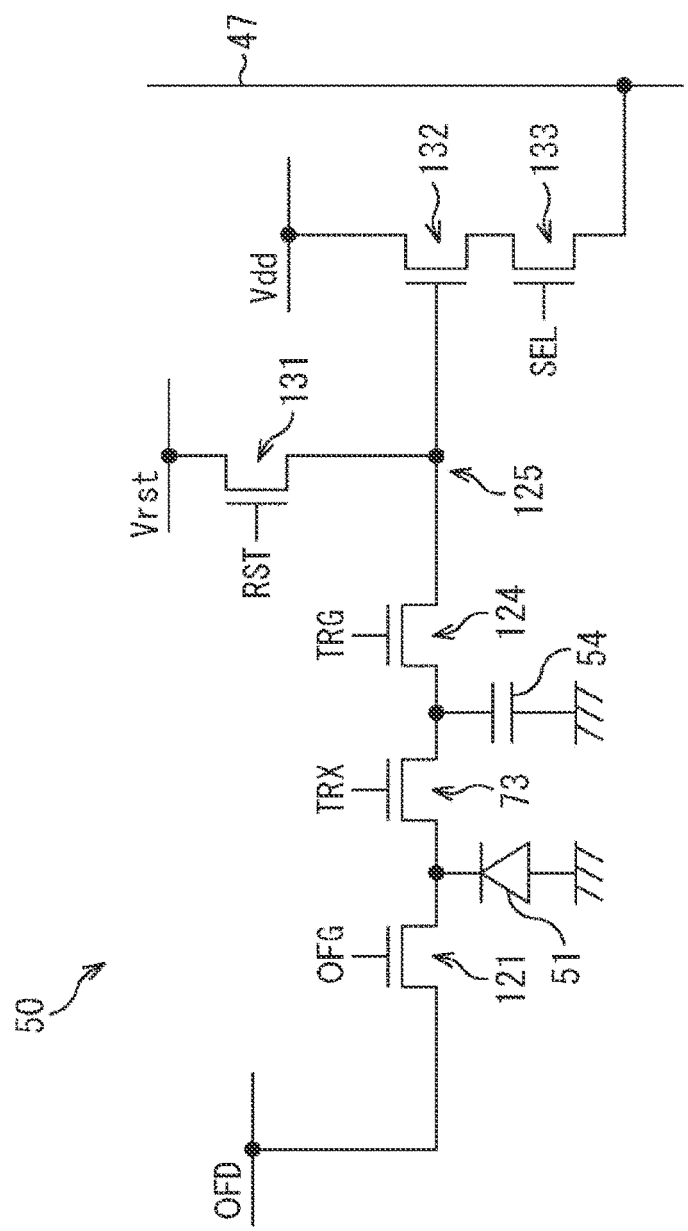
FIG. 13 is a circuit diagram illustrating a configuration of the pixel.

Referring now to FIG. 13 that illustrates a circuit diagram of a single pixel 50, an explanation will be made how the FD 125 can be boosted by a configuration in which the FD boost interconnect 301-4 is brought into contact with the amplification transistor gate.

The pixel 50 is configured including the PD 51, a first transfer transistor 73 (transfer transistor that contains the TRX gate 73), the electric charge holding part 54, a second transfer transistor 124 (transfer transistor that contains the TRG gate 124), the FD 125, the amplification transistor 132, the selection transistor 133, the reset transistor 131, and a discharge transistor 121 (OFG 121).

The PD 51 is a photoelectric conversion unit that converts, and then accumulates, incident light into electric charge by photoelectric conversion, with the anode terminal grounded, and with the cathode terminal connected to the first transfer transistor 73 and the discharge transistor 121.

The first transfer transistor 73 operates in response to transfer signal TRX supplied from the vertical drive circuit 13. Upon turning ON of the first transfer transistor 73, the electric charge accumulated in the PD 51 is transferred to the electric charge holding part 54.

The electric charge holding part 54 temporarily holds the electric charge transferred through the first transfer transistor 73 from the PD 51.

The second transfer transistor 124 operates in response to transfer signal TRG supplied from the vertical drive circuit 13. Upon turning ON of the second transfer transistor 124, the electric charge accumulated in the electric charge holding part 54 is transferred to the FD 125.

The FD 125 is a floating diffusion region having a predetermined capacitance, which is connected to the gate electrode of the amplification transistor 132, and accumulates the electric charge transferred from the electric charge holding part 54.

The amplification transistor 132 outputs a pixel signal at a level corresponded to the electric charge accumulated in the FD 125 (that is, potential of the FD 125), through the selection transistor 133 to the vertical signal line 47. That is, according to a configuration having the FD 125 connected to the gate electrode of the amplification transistor 132, now the FD 125 and the amplification transistor 132 can function as a converter that converts the electric charge that occurs in the PD 51, into the pixel signal at a level corresponded to the electric charge.

The selection transistor 133 operates in response to selection signal SEL supplied from a vertical drive unit 42 (FIG. 1). Upon turning ON of the selection transistor 133, the pixel signal output from the amplification transistor 132 becomes ready to be output to the vertical signal line 47.

The reset transistor 131 operates in response to reset signal RST supplied from the vertical drive unit 42. Upon turning ON of the reset transistor 131, the electric charge accumulated in the FD 125 is discharged to the reset power source Vrst, and the FD 125 is thus reset.

The discharge transistor 121 is connected in series between the PD 51 and the overflow drain OFD (discharge unit). In addition, the discharge transistor 121 operates in response to discharge signal OFG supplied from the vertical drive unit 42.

As described above, the FD 125 is connected to the gate electrode of the amplification transistor 132. The FD 125 can therefore be boosted, by connecting the FD boost interconnect 301-4 to a point where the FD 125 is connected to the gate electrode of the amplification transistor 132, or to a part of an interconnect that connects the FD 125 with the gate electrode of the amplification transistor 132.

The FD 125 can be boosted by a configuration having formed therein any of the FD boost interconnects 301-1 to 301-4 illustrated in FIGS. 9 to 13. Alternatively, two or more of the FD boost interconnects 301-1 to 301-4 may be formed. For example, the pixel may have the FD boost interconnect 301-1 and the FD boost interconnect 301-2 formed therein as illustrated in FIG. 10, or the pixel may additionally have an FD 301-3 formed therein.

Another possible configuration may be such as having any one of, or two or more of the FD boost interconnects 301-1 to 301-3, as well as the FD boost interconnect 301-4 connected to the gate electrode of the amplification transistor 132.

With the configuration provided with a plurality of FD boost interconnects 301, the FD 125 will be boosted more efficiently.

The FD boost interconnect 301 is formed in other layer (any one of the interconnect layers 61-2 to 61-4 in the configuration illustrated in FIG. 2), and is connected to an interconnect which is connected to a voltage source that supplies a predetermined voltage. Timing according to which voltage is applied to the FD boost interconnect 301 will be explained below, referring to the timing chart illustrated in FIG. 14.

Figure 14:
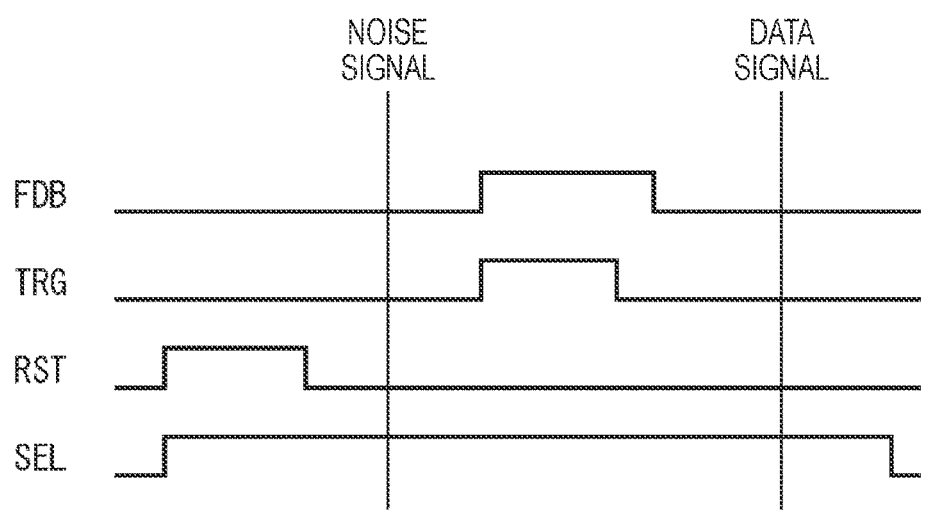
FIG. 14 is a diagram illustrating operation of the pixel.

In FIG. 14, a control signal that is turned ON (High) when voltage is applied to the FD boost interconnect 301 is represented by signal FDB; a control signal that is turned ON (High) when the second transfer transistor 124 transfers the electric charge is represented by control signal TRG; a control signal that is turned ON (High) when the reset transistor 131 carries out reset operation is represented by signal RST; and a control signal that is turned ON (High) when the selection transistor 133 is selected is represented by signal SEL.

In the readout operation directed to the pixel 50, unnecessary electric charge is swept out (reset) from a photoelectric conversion element of the unit pixel that falls on a row to be read. In the reset operation, the signal SEL is brought High, and the signal RST is brought High only over a predetermined length of time. A noise signal is acquired as a result of the reset operation.

Upon acquisition of the noise signal, light exposure starts, and the electric charge is accumulated in the PD 51. Although not illustrated in FIG. 14, the electric charge is transferred from the PD 51 to the electric charge holding part 54 upon completion of the light exposure, and the electric charge is then accumulated in the electric charge holding part 54. Such transfer of the electric charge from the PD 51 to the electric charge holding part 54 occurs all at once in all pixels, thus embodying the global shutter.

When the electric charge held in the electric charge holding part 54 is transferred to the FD 125, the signal TRG that controls the second transfer transistor 124 is brought High, and a signal FOB that controls voltage to be applied to the FD boost interconnect 301 is brought High. When the electric charge is transferred from the electric charge holding part 54 to the FD 125 in response to operation of the second transfer transistor 124, voltage is applied to the FD boost interconnect 301, and thus the FD 125 is boosted.

At a point in time shortly after the signal TRG is returned Low, the signal FOB is returned Low. The electric charge transferred to the FD 125 is supplied as the data signal, through the vertical signal line 47 to the column processing unit 43 (FIG. 1). As a result of processes including removal of noise signal from the data signal carried out by the column processing unit 43, a pixel value of the pixel 50 is calculated.

As described above, when the electric charge is transferred to the FD 125, voltage is applied to the FD boost interconnect 301 to boost the FD 125. Hence, according to the present technology, it now becomes possible to keep a necessary level of boosting, and to improve the conversion efficiency. The present technology is also effective to keep a necessary level of dynamic range, and to reduce noise.

<Application to Vertical Transistor>

Figure 15:
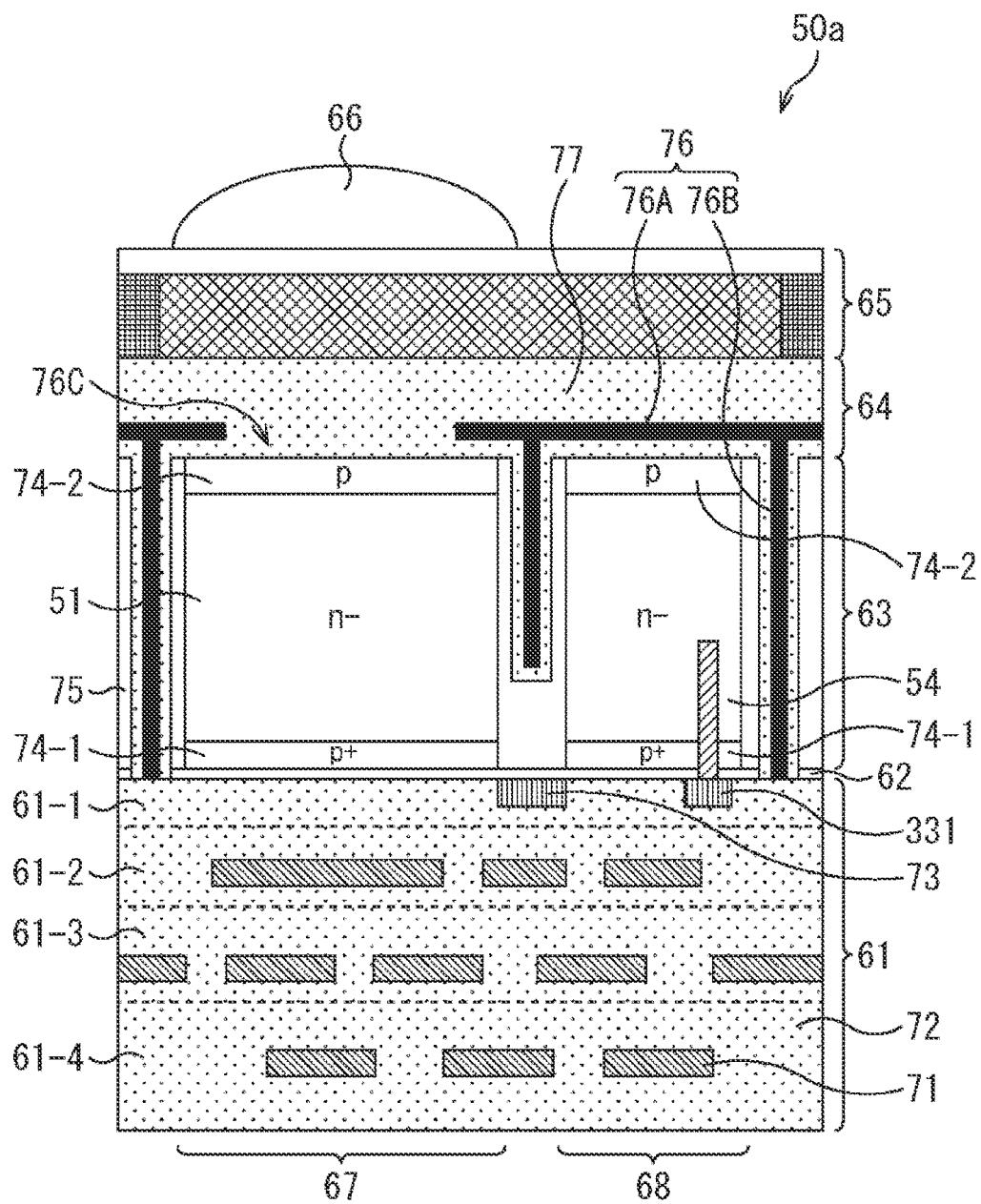
FIG. 15 is a cross sectional view illustrating a configuration of the pixel.

In the pixel 50 equipped with the aforementioned FD boost interconnect 301, the transistor that takes part in the readout operation may be configured as a vertical transistor. FIG. 15 illustrates a cross sectional view of the pixel 50, with the second transfer transistor 124, which reads the electric charge out from the electric charge holding part 54, configured with the vertical transistor.

The pixel 50 illustrated in FIG. 15 is different from the pixel 50 illustrated in FIG. 2, only in that a vertical transistor is added, while leaving the residual aspects remained unchanged, and for which the explanation will be skipped. A readout gate 331 that configures the second transfer transistor 124 is formed so as to reach deep inside the electric charge holding part 54. That is, the readout gate 331 that reads the electric charge out from the electric charge holding part 54 is formed vertically and horizontally relative to the electric charge holding part 54, in which the readout gate 331 aligned vertically is formed so as to come into contact with the electric charge holding part 54.

By using such a vertical transistor, modulating power may be enhanced, and the potential may be deepened. On the other hand, this configuration free of the FD boost interconnect 301 is anticipated to attenuate pumping up from the FD 125, when the FD 125 is not boosted. This will be explained referring to FIGS. 16A, 16B, and 16C.

Figures 16A, 16B, 16C:
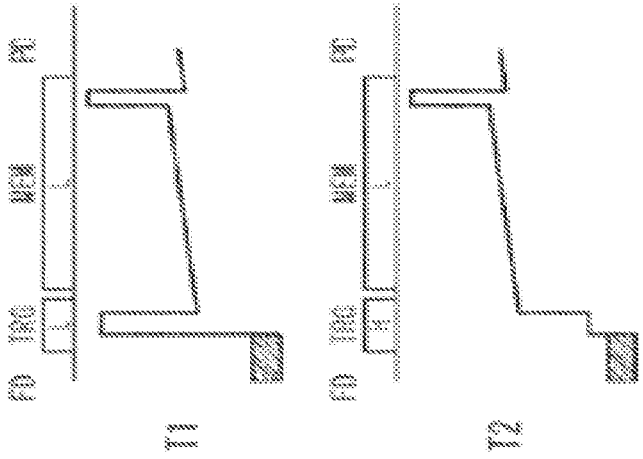
FIGS. 16A, 16B, and 16C are diagrams for explaining potential transition of the pixel.

In FIGS. 16A, 16B, and 16C, FD represents the FD 125, TRG represents the second transfer transistor 124, MEM represents the electric charge holding part 54, and PD represents the PD 51. FIG. 16A illustrates a change of potential in a case where the second transfer transistor 124 is not the vertical transistor, FIG. 16B illustrates a change of potential in a case where the second transfer transistor 124 is the vertical transistor, and FIG. 16C represents a change of potential in a case where the second transfer transistor 124 is the vertical transistor, under boosting by the FD boost interconnect 301.

Referring now to FIG. 16A, the second transfer transistor 124 and the electric charge holding part 54 are kept Low at time T1. When the second transfer transistor 124 is brought High at time T2, the potential will become shallow below the gate of the second transfer transistor 124 but a barrier would unfortunately appear, possibly preventing the transfer from the electric charge holding part 54 to the FD 125.

Referring now to FIG. 16B, the second transfer transistor 124 and the electric charge holding part 54 are kept Low, similarly to the case at time T1 in FIG. 16A. When the second transfer transistor 124 is brought High at time T2, there will be no barrier as a result of improved modulating power due to the vertical transistor. The potential will, however, become deeper below the gate, possibly leaving the electric charge undischarged below the gate.

Referring now to FIG. 16C, when the second transfer transistor 124 and the electric charge holding part 54 are kept Low similarly to the case at time T1 in FIG. 16A, the FD 125 has a predetermined electric charge accumulated therein. When the second transfer transistor 124 is brought High at time T2, and voltage is applied to the FD boost interconnect 301, the FD 125 is boosted. Upon boosting of the FD 125, the FD 125 will have deepened potential. Hence, even if the potential below the gate were deepened similarly to the case at time T2 in FIG. 16B, the FD 125 will have still deeper potential, successfully preventing an event where the electric charge remains undischarged below the gate from occurring.

As described above, even in a case where the vertical transistor is employed, a necessary level of boosting will be attainable and the conversion efficiency will be improved, by forming the FD boost interconnect 301 and by boosting the FD 125, making it possible to attain a necessary level of dynamic range and to reduce the noise.

<Application to Readout Using CCD System>

The pixel 50 equipped with the aforementioned FD boost interconnect 301 is applicable to an image sensor that carries out the readout operation using a CCD system. The readout operation using the CCD system relates to a system in which the electric charge (signal) accumulated in the PD 51 is read out by sequentially shifting the electric charge to the next element, making use of electrical coupling between the neighboring elements.

Figure 17:
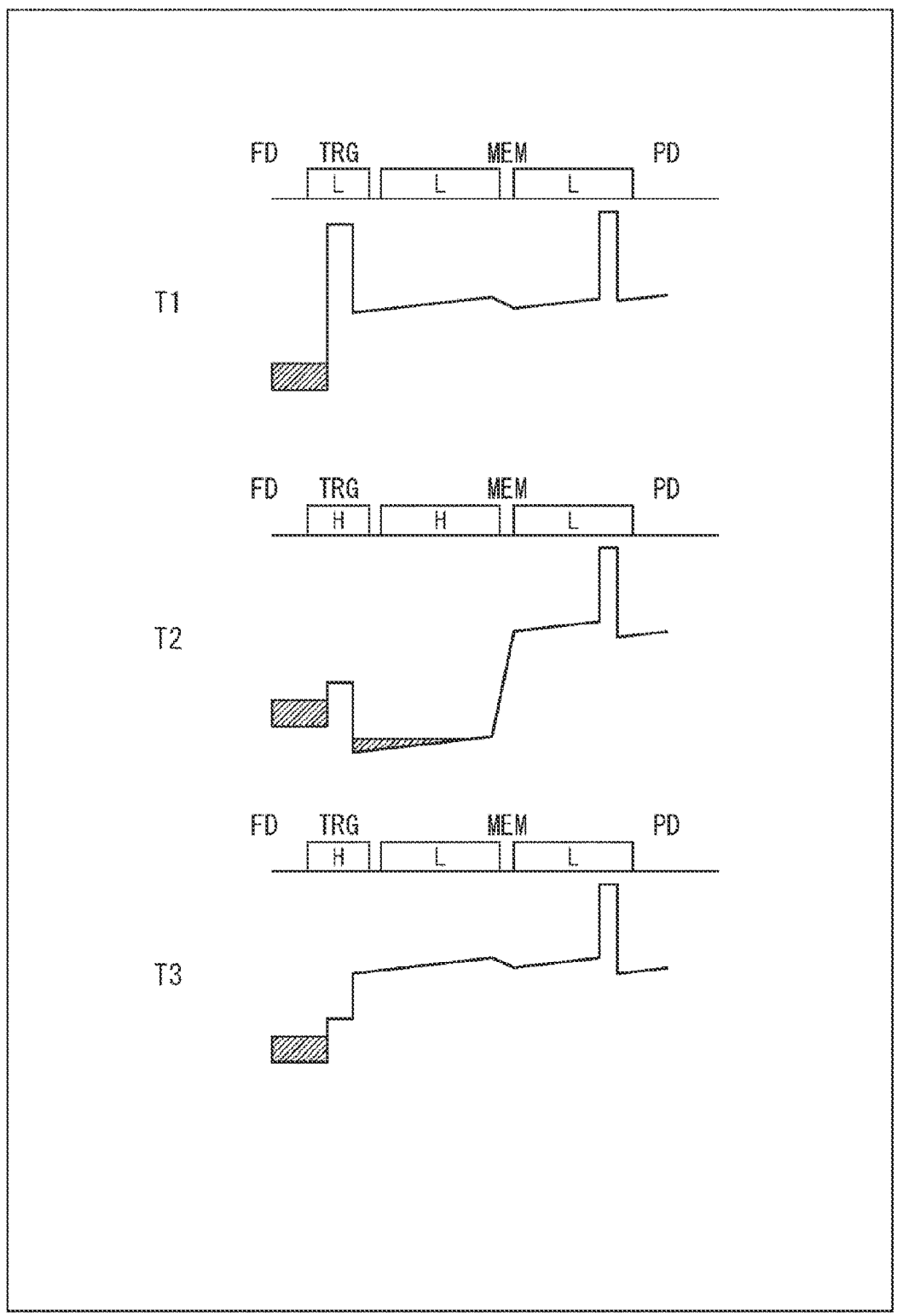
FIG. 17 is a diagram for explaining potential transition of the pixel.

FIG. 17 is a diagram explaining change of potential during the readout operation using the CCD system. FIG. 17 illustrates an exemplary case where there are two electric charge holding parts 54 (indicated as MEM in the drawing) formed therein, allowing the electric charge to transfer through the PD 51, the first electric charge holding part 54, the second electric charge holding part 54, and the FD 125 in this order. When the first electric charge holding part 54, the second electric charge holding part 54, and the second transfer transistor 124 are kept Low at time T1, a predetermined electric charge is accumulated in the FD 125.

From this state, when the second electric charge holding part 54 and the second transfer transistor 124 are brought High at time T2, the potential will become deeper at the second electric charge holding part 54 than at the FD 125. If such a situation occurred, the electric charge would flow backward from the FD 125 to the second electric charge holding part 54.

At time T3 that comes behind time T2, the second electric charge holding part 54 returns Low, with the second transfer transistor 124 remained High. At this time, application of voltage to the FD boost interconnect 301 will boost the FD 125, making the potential of the FD 125 deeper than the potential of the electric charge holding part 54.

In order to prevent the electric charge from flowing backward, the FD 125 may only be boosted to make the potential deeper than that of the electric charge holding part 54. Also boosting of this FD 125 may be achieved by employing the aforementioned structure having the FD boost interconnect 301 formed therein.

Hence, also to the readout operation of the CCD system, the present technology is applicable to achieve a necessary level of boosting and to enhance the conversion efficiency, making it possible to attain a necessary level of dynamic range and to reduce the noise.

Operation of the pixel 50 to which the vertical transistor and the CCD system are applied will be explained referring to FIGS. 18A and 18B.

Figure 18B:
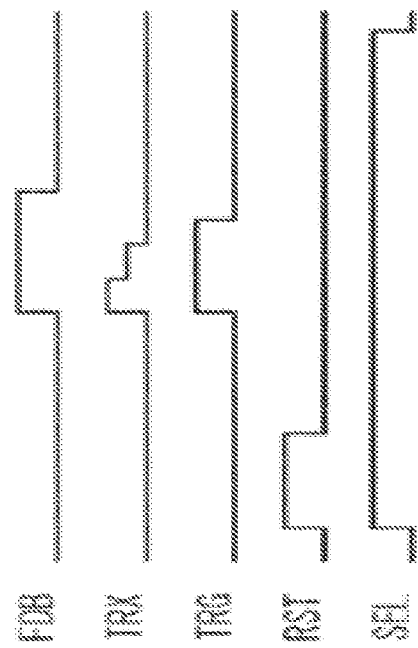
FIGS. 18A and 18B are diagrams for explaining operation of the pixel.
Figure 18A:
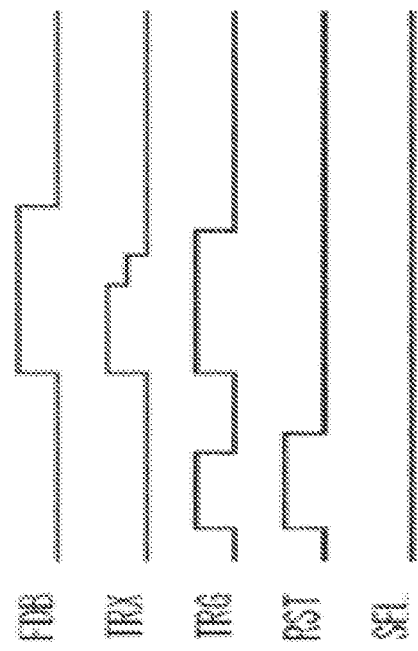

FIG. 18A illustrates High/Low timing of the individual control signals when the electric charge is transferred from the PD 51 to the electric charge holding part 54, and FIG. 18B illustrates High/Low timing of the individual control signals when the electric charge is transferred from the electric charge holding part 54 to the FD 125. In FIGS. 18A and 18B, FOB, TRG, RST, and SEL are same as those in FIG. 14. In FIGS. 18A and 18B, TRX is a control signal that controls the first transfer transistor 73, and represents a control signal that is turned ON (High) when the electric charge is transferred from the PD 51 to the electric charge holding part 54.

Referring now to FIG. 18A, with the signal TRG and the signal RST brought High, the FD 125 is reset. After the resetting, the signal FOB, the signal TRX, and the signal TRG are brought High to apply a predetermined voltage to the FD boost interconnect 301 and to boost the FD 125, enabling transfer of the electric charge from the PD 51 to the electric charge holding part 54, and further enabling transfer of the electric charge from the electric charge holding part 54 to the FB125.

Since the readout operation of the electric charge from the PD 51 to the electric charge holding part 54 occurs all at once for all pixels, so that the signal SEL remains Low. Referring now to FIG. 18B, since the electric charge accumulated in the electric charge holding part 54 is transferred sequentially pixel by pixel, so that the signal SEL corresponded to the selection transistor 133 of the pixel to be read is brought High. When the signal SEL is brought High, also the signal RST is brought High, keeping the reset transistor 131 turned ON only for a certain period.

When the electric charge is transferred from the electric charge holding part 54 to the FD 125, the signal FOB, the signal TRX, and the signal TRG are brought High. Hence, with a predetermined voltage applied to the FD boost interconnect 301 to boost the FD 125, the electric charge is transferred from the PD 51 to the electric charge holding part 54, and further transferred from the electric charge holding part 54 to the FB 125.

As a result of such operations sequentially repeated, the electric charge accumulated in the PD 51 is successively transferred to the electric charge holding part 54 and to the FD 125. In addition, since the FD 125 is boosted when the electric charge is transferred, it now becomes possible to keep a necessary level of boosting, to improve the conversion efficiency, to keep a necessary level of dynamic range, and to reduce the noise.

Note that, if there is a need to suppress pumping up during resetting, the reset operation may alternatively be carried out, after once creating a floating state. Meanwhile in a case where the CCD system is applied with the vertical transistor, complete resetting of the electric charge holding part 54 may be achieved by once applying voltage to the FD boost interconnect 301 timely when the FD 125 comes into the floating state, so as to boost the FD 125.

<Specific Patterns of Interconnect>

Examples of specific patterns of the FD interconnect 126 and the FD boost interconnect 301 will be explained below. As described above, pattern and layout of the FD boost interconnect 301 are set, depending on the layout of the PD 51 and the electric charge holding part 54, and relationship with other interconnects. Specific layouts and patterns of the PD 51, the electric charge holding part 54, other interconnects, and so forth will now be exemplified below, with additional comments on the patterns and layouts of the FD boost interconnect 301.

Figure 19:
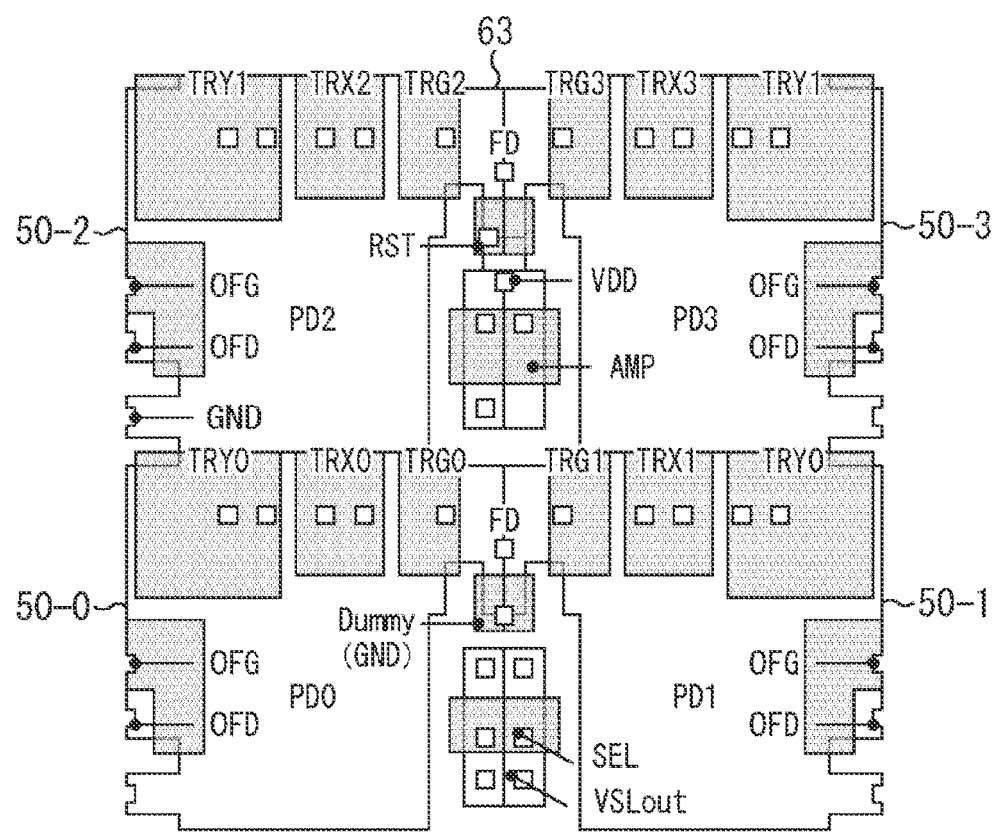
FIG. 19 is a view for explaining a layout and patterns of interconnects for the pixels.
Figure 20:
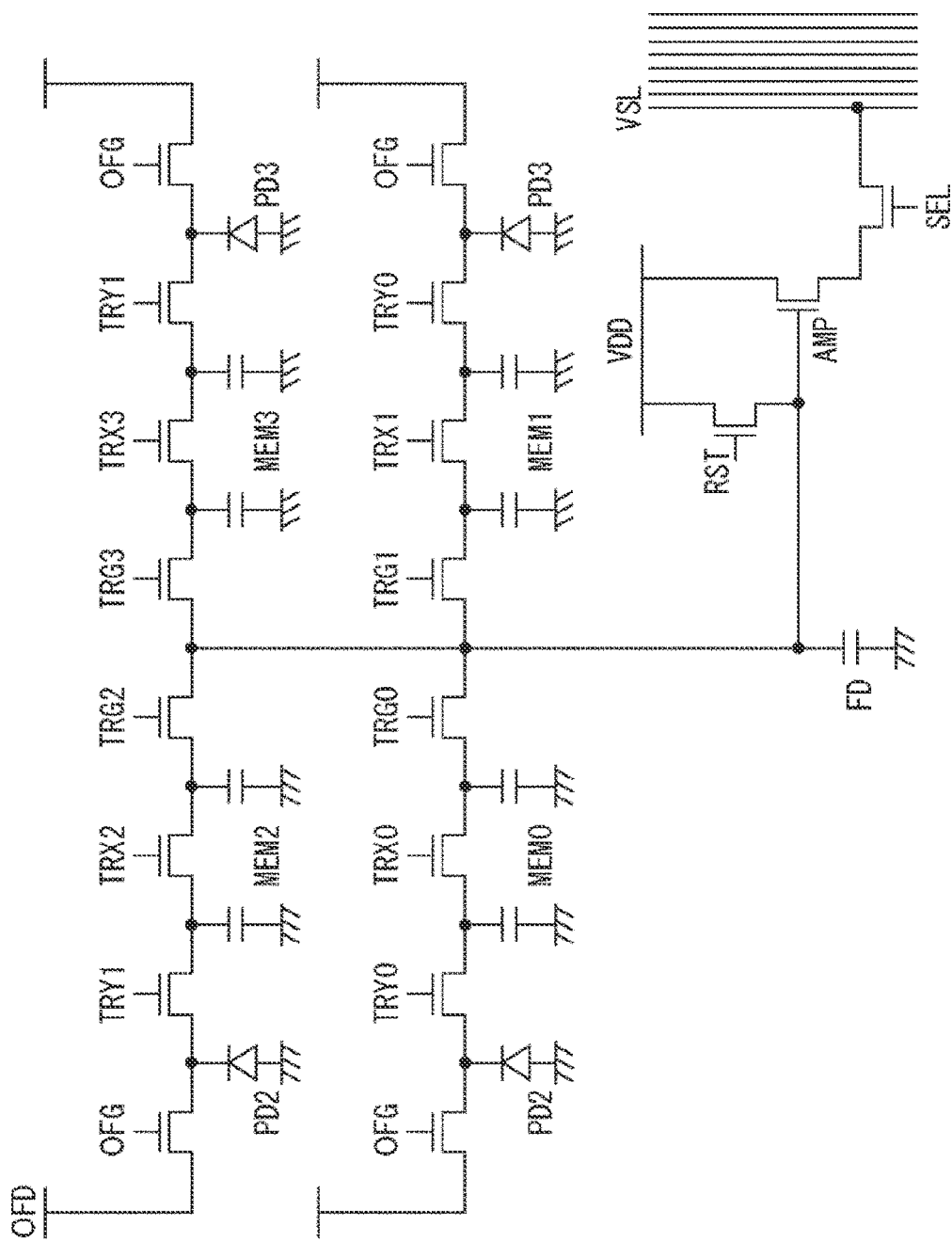
FIG. 20 is a circuit diagram illustrating a configuration of the pixel.

FIG. 19 is a plan view of the semiconductor substrate 63, illustrating a specific example of layout and pattern of the PD 51 and so forth. FIG. 20 is a circuit diagram corresponded to the configuration illustrated in FIG. 19. FIG. 19 illustrates four pixels arranged in a 2×2 matrix to form a single co-owning unit. A pixel 50-0 is arranged on the bottom left, a pixel 50-1 is arranged on the bottom right, a pixel 50-2 is arranged on the top left, and a pixel 50-3 is arranged on the top right.

The pixel 50-1 contains PD2. FIGS. 19 to 24 will employ common reference signs, which are different from those having been used in the previous explanation, in order to clarify relation of connection among the interconnects in the individual layers. PD0 contained in the pixel 50-0 corresponds to the PD 51 in the foregoing explanation. Also, other parts are similar as those described in the foregoing explanation, except for the reference signs, so that the explanation therefor will properly be skipped.

On the left side of PD0 in the pixel 50-0, formed are OFG and OFG, and on the upper side, formed are TRY0, TRX0, and TRG0. Although not illustrated in FIG. 19, MEM0 (corresponded to the electric charge holding part 54) is formed in the region were the TRY0 and TRX0 are formed.

PD0, OFD, OFG, PD0, TRY0, TRX0, TRG0, and MEM0 formed in the pixel 50-0 are connected as illustrated in the circuit diagram of FIG. 20. A circuit configuration for a single pixel has been explained previously referring to FIG. 13, and will therefore be not explained again.

In the configuration illustrated in FIGS. 19 and 20, TRY0 is added. TRY0 functions as a gate that prevents backflow of the electric charge from the electric charge holding part 54 to the PD 51 (from MEM0 to PD0, in the pixel 50-0 illustrated in FIGS. 19 and 20), and is arranged between PD0 and TRX0, as illustrated in FIGS. 19 and 20.

Backflow of the electric charge towards PD0 can be prevented by providing TRY0 (properly referred to as third transfer transistor), and by turning TRY0 ON when the electric charge is transferred from PD0 to MEM0, and then turning it OFF so as to prevent the backflow of the electric charge to PD0.

Further, TRY0 may also be configured to have a memory function that enables accumulation of the electric charge. As illustrated in the circuit diagram of FIG. 20, MEM0 is formed each of between TRY0 and TRX0, and between TRX0 and TRG0. The electric charge holding part 54 includes two units of electric charge holding part 54, one of which being formed between TRY0 and TRX0, and can be assumed to demonstrate a memory function owned by TRY0.

Similarly to the pixel 50-0, also the pixel 50-1 has formed therein PD1, OFD, OFG, TRY0, TRX1, TRG1, and MEM1. The pixel 50-2 has formed therein PD2, OFD, OFG, TRY1, TRX2, TRG2, and MEM2. The pixel 50-3 has formed therein PD3, OFD, OFG, TRY1, TRX3, TRG3, and MEM3.

Similarly to as described above referring to FIG. 3 and so forth, layout of PD and so forth illustrated in FIG. 19 is understood to have a bilateral symmetry if focused on the laterally arranged pixels such as the pixel 50-0 and the pixel 50-1, and is understood to have periodical symmetry if focused on the vertically arranged pixels such as the pixel 50-0 and the pixel 50-2.

The periodical symmetry means that the same components are arranged at the same positions when viewed within a single pixel, such that, for example, TRX0 in the pixel 50-0 is arranged above PD0, and TRX2 in the pixel 50-2 is arranged above PD2.

Furthermore as illustrated in FIG. 19, SEL (corresponded to the selection transistor 133) and FD (corresponded to the FD 125) are formed between the pixel 50-0 and the pixel 50-1. Meanwhile, AMP (corresponded to the amplification transistor 132), RST (corresponded to the reset transistor 131), and FD are formed between the pixel 50-2 and the pixel 50-3.

Since SEL, FD, AMP and RST are shared among the pixels 50-0 to 50-3, so that as illustrated in FIG. 20, TRG0, TRG1, TRG2, and TRG3 are connected to FD and AMP. The circuit diagram of FIG. 20 illustrates a configuration that enables simultaneous readout from eight VSL's (corresponded to the vertical signal line 47). That is, there are formed eight VSL's as illustrated in FIG. 20, and SEL is connected to one of them.

TRY0 exemplified here is formed in each of the pixel 50-0 and the pixel 50-1, in which TRY0 of the pixel 50-0, and TRY0 of the pixel 50-1 are connected to a TRY0 interconnect (FIG. 23) described later. That is, TRY's connected to the same interconnect are given the same sign (for TRY0, 0 represents the sign). The same will apply to other parts.

Figure 21:
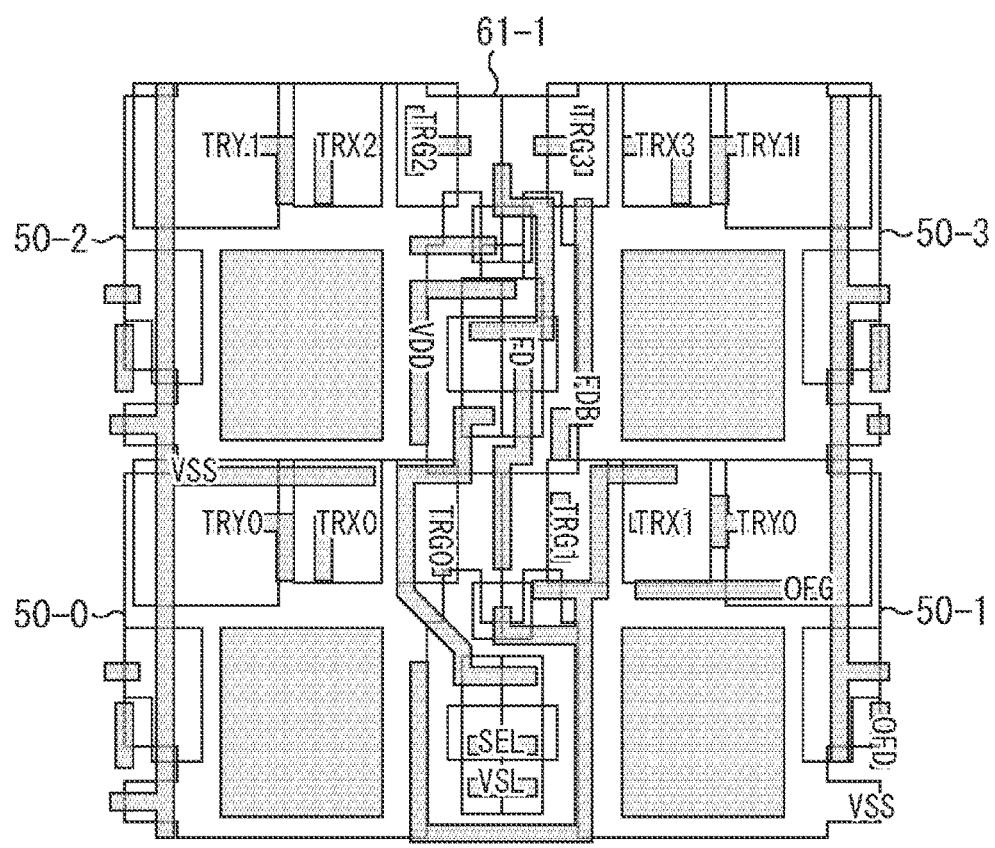
FIG. 21 is a view for explaining a layout and patterns of interconnects for the pixels.

FIG. 21 is a view illustrating layout and pattern of the interconnects and so forth that are laid in the interconnect layer 61-1 stacked on the semiconductor substrate 63 illustrated in FIG. 19. The interconnect layer 61-1 has formed therein a light shielding film typically including metal, for example, at a position corresponded to PD formed in the semiconductor substrate 63.

In addition, for example, corresponding to a part where TRY0 of the pixel 50-0 is formed in the semiconductor substrate 63 illustrated in FIG. 19, now formed is the gate of TRY0 in the interconnect layer 61-1. Similarly, the interconnect layer 61-1 also has formed therein the gate of TRX0, corresponding to a part where TRX0 of the pixel 50-0 is formed in the semiconductor substrate 63 illustrated in FIG. 19. Again, the interconnect layer 61-1 also has formed therein the gate of TRG0, corresponding to a part where TRG0 of pixel 50-0 is formed in the semiconductor substrate 63 illustrated in FIG. 19.

In the interconnect layer 61-1, also the gates of TRY, TRX, and TRG individually formed in other pixels 50-1 to 50-3 are formed in the corresponded parts. Furthermore, also the gates of the selection transistor (SEL), the amplification transistor (AMP), and the reset transistor (RST) are individually formed in the interconnect layer 61-1.

The interconnect layer 61-1 additionally has formed therein the FD interconnect 126 that connects FD's formed in the semiconductor substrate 63. The FD interconnect 126 (indicated by FD in the drawing), although typically illustrated in FIG. 3 as a straight pattern, has now in FIG. 21 a kinked line pattern that combines straight lines, which is formed so as to connect FD illustrated on the upper side of the drawing and FD illustrated on the lower side of the drawing.

The FD interconnect 126 illustrated in FIG. 21 is patterned so as to avoid the VDD interconnect connected to AMP. The VDD interconnect is connected to a via indicated by VDD, which is formed above AMP in FIG. 19. As described above, the FD interconnect 126 in the patterns of PD, interconnects and so forth illustrated in FIGS. 19 and 21 is formed partially so as to avoid the other interconnects, depending on relation with such other interconnects.

The FD boost interconnect 301 (line indicated by FDB in the drawing) is formed in the vicinity of, and in parallel to the FD interconnect 126. The FD boost interconnect 301 is formed while aligning at least a part thereof in parallel to the FD interconnect 126.

Figure 22:
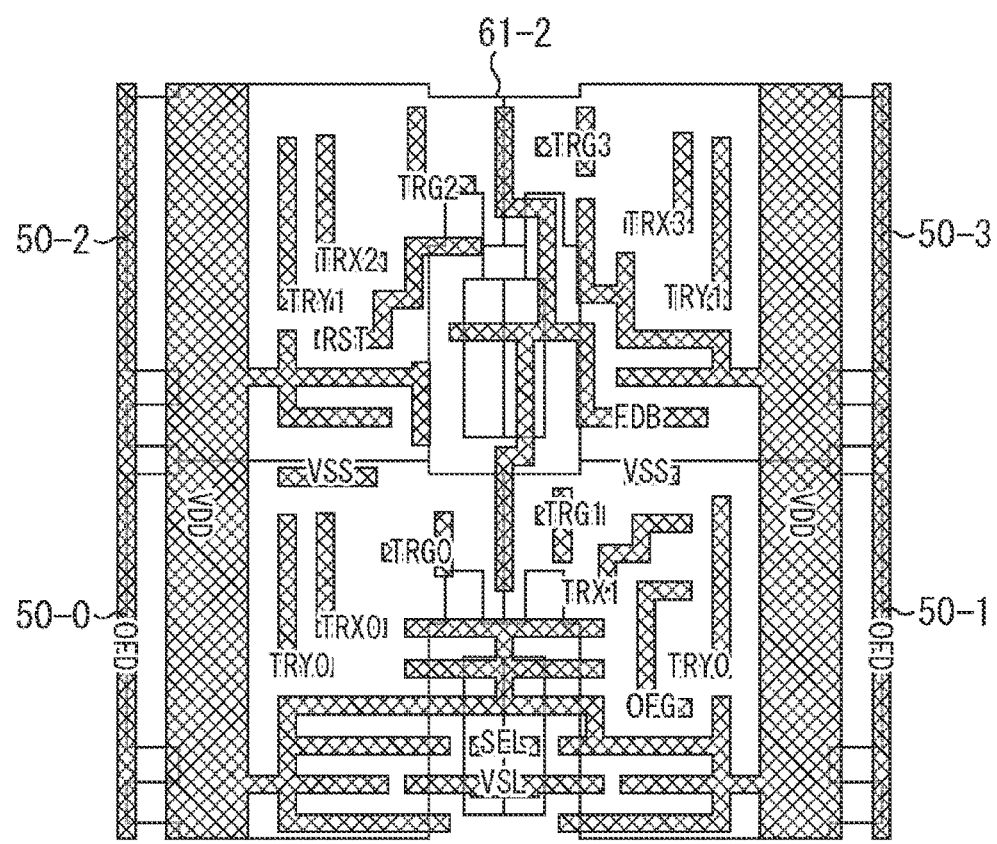
FIG. 22 is a view for explaining a layout and patterns of interconnects for the pixels.

FIG. 22 is a view illustrating layout and pattern of the interconnects and so forth that are laid in the interconnect layer 61-2 stacked on the interconnect layer 61-1 illustrated in FIG. 21. The interconnect layer 61-2 has formed therein interconnects that connect the interconnect formed in the interconnect layer 61-1, with the interconnects formed in the interconnect layer 61-3 and the interconnect layer 61-4.

Since FIG. 22 illustrates a case where the FD boost interconnect 301-3 is formed in other layer as explained referring to FIG. 11, so that also the interconnect layer 61-2 has formed therein the FD boost interconnect 301 (line indicated by FDB in the drawing). That is, the examples illustrated in FIGS. 21 and 22 represent cases equipped with the FD boost interconnect 301-1 having been explained referring to FIG. 9, and the FD boost interconnect 301-3 having been explained referring to FIG. 11.

As has been explained referring to FIG. 11, the FD boost interconnect 301 formed in the interconnect layer 61-2, which is different from the interconnect layer 61-1 having the FD interconnect 126 formed therein, is formed nearly at the same position of the FD interconnect 126, with an almost equivalent pattern.

Figure 23:
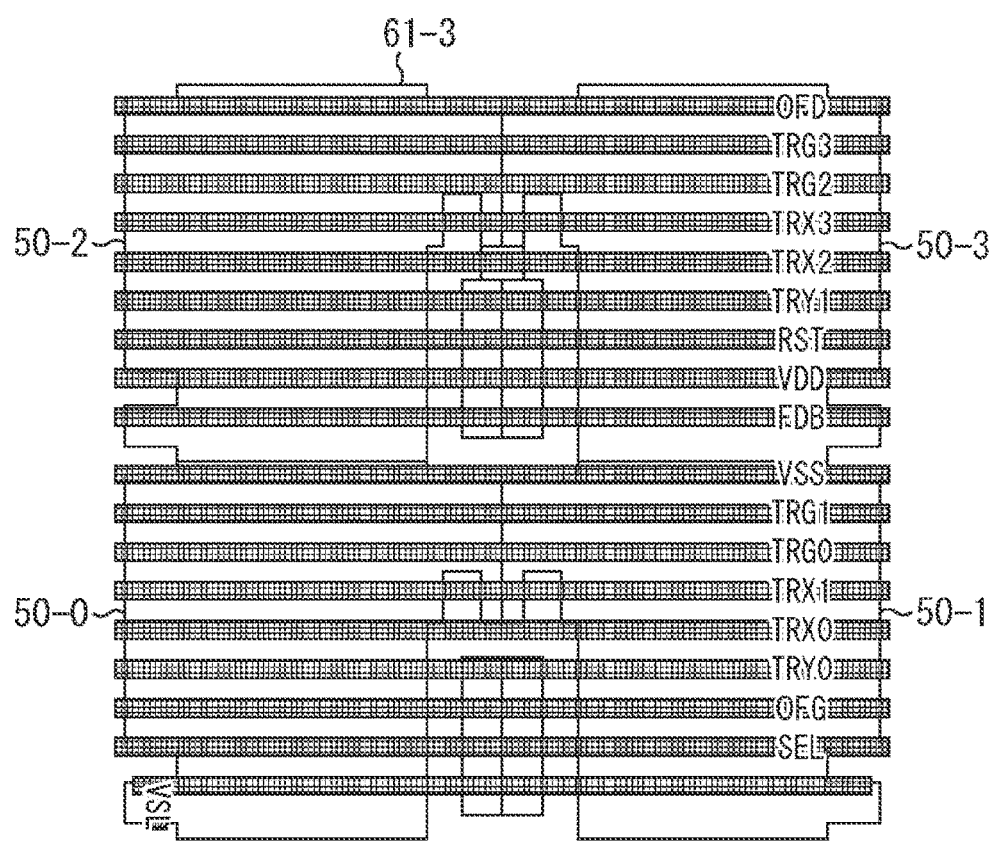
FIG. 23 is a view for explaining a layout and patterns of interconnects for the pixels.

FIG. 23 is a view illustrating layout and pattern of the interconnects and so forth that are laid in the interconnect layer 61-3 stacked on the interconnect layer 61-2 illustrated in FIG. 22. The interconnect layer 61-3 has formed therein signal lines through which the control signals flow.

In the interconnect layer 61-3 illustrated in FIG. 23, the control signal lines are formed straight in the lateral direction in the drawing. In the upper part of the drawing, there are formed OFD regions individually formed in the semiconductor substrate 63 (FIG. 19), the interconnect layer 61-1 (FIG. 21), and the interconnect layer 61-2 (FIG. 22); and the signal line OFD connected through vertical vias.

On the lower side in the drawing of the OFD signal line, there are TRG3 regions (gates) individually formed in the semiconductor substrate 63 (FIG. 19), the interconnect layer 61-1 (FIG. 21), and the interconnect layer 61-2 (FIG. 22); and the signal line TRG3 connected through the vertical vias. The signal line TRG3 is a signal line through which a signal that controls the second transfer transistor (TRG3) of the pixel 50-3 (FIG. 19) is supplied.

On the lower side in the drawing of the signal line TRG3, there are TRG2 regions (gates) individually formed in the semiconductor substrate 63 (FIG. 19), the interconnect layer 61-1 (FIG. 21), and the interconnect layer 61-2 (FIG. 22); and the signal line TRG2 connected through the vertical vias. The signal line TRG2 is a signal line through which a signal that controls the second transfer transistor (TRG2) of the pixel 50-2 (FIG. 19) is supplied.

On the lower side in the drawing of the signal line TRG2, there are TRX3 regions (gates) individually formed in the semiconductor substrate 63 (FIG. 19), the interconnect layer 61-1 (FIG. 21), and the interconnect layer 61-2 (FIG. 22); and the signal line TRX3 connected through the vertical vias. The signal line TRX3 is a signal line through which a signal that controls the first transfer transistor (TRX3) of the pixel 50-3 (FIG. 19) is supplied.

On the lower side in the drawing of the signal line TRX3, there are TRX2 regions (gates) individually formed in the semiconductor substrate 63 (FIG. 19), the interconnect layer 61-1 (FIG. 21), and the interconnect layer 61-2 (FIG. 22); and the signal line TRX2 connected through the vertical vias. The signal line TRX2 is a signal line through which a signal that controls the first transfer transistor (TRX2) of the pixel 50-2 (FIG. 19) is supplied.

On the lower side in the drawing of the signal line TRX2, there are TRY1 regions (gates) individually formed in the semiconductor substrate 63 (FIG. 19), the interconnect layer 61-1 (FIG. 21), and the interconnect layer 61-2 (FIG. 22); and the signal line TRY1 connected through the vertical vias. The signal line TRY1 is a signal line through which a signal that controls the third transfer transistor (TRY1) of the pixel 50-3 and the pixel 50-2 (FIG. 19) is supplied.

On the lower side in the drawing of the signal line TRY1, there are RST regions (gates) individually formed in the semiconductor substrate 63 (FIG. 19), the interconnect layer 61-1 (FIG. 21), and the interconnect layer 61-2 (FIG. 22); and the signal line RST connected through the vertical vias. The signal line RST is a signal line through which a signal that controls the reset transistor (RST) shared by the pixels 50-0 to 50-4 (FIG. 19) is supplied.

On the lower side in the drawing of the signal line RST, there are VDD regions (interconnects) individually formed in the semiconductor substrate 63 (FIG. 19), the interconnect layer 61-1 (FIG. 21), and the interconnect layer 61-2 (FIG. 22); and the signal line VDD connected through the vertical vias. The signal line VDD is a signal line through which a predetermined voltage VDD is supplied to predetermined parts of the pixels 50-0 to 50-4 (FIG. 19).

On the lower side in the drawing of the signal line VDD, there are FDB regions (interconnects) individually formed in the semiconductor substrate 63 (FIG. 19), the interconnect layer 61-1 (FIG. 21), and the interconnect layer 61-2 (FIG. 22); and the signal line FDB connected through the vertical vias. The signal line FDB is a signal line through which a predetermined voltage is supplied to the FD boost interconnect 301 (FDB).

All interconnect having been described above (interconnects arranged in the upper half in the drawing) are signal lines mainly relevant to the pixel 50-2 and the pixel 50-3, which are pixels arranged in the upper area out of four pixels in a 2×2 matrix, and also relevant to the transistors arranged between the pixel 50-2 and the pixel 50-3.

On the lower side in the drawing of the signal line FDB, there are VSS regions (interconnects) individually formed in the semiconductor substrate 63 (FIG. 19), the interconnect layer 61-1 (FIG. 21), and the interconnect layer 61-2 (FIG. 22); and the signal line VSS connected through the vertical vias. The signal line VSS is a signal line through which a predetermined voltage VSS is supplied to predetermined parts of the pixels 50-0 to 50-4 (FIG. 19). Note that voltage VDD represents positive voltage, and voltage VSS represents negative voltage.

On the lower side in the drawing of the signal line VSS, there are TRG1 regions (gates) individually formed in the semiconductor substrate 63 (FIG. 19), the interconnect layer 61-1 (FIG. 21), and the interconnect layer 61-2 (FIG. 22); and the signal line TRG1 connected through the vertical vias. The signal line TRG1 is a signal line through which a signal that controls the second transfer transistor (TRG1) of the pixel 50-1 (FIG. 19) is supplied.

On the lower side in the drawing of the signal line TRG1, there are TRG0 regions (gates) individually formed in the semiconductor substrate 63 (FIG. 19), the interconnect layer 61-1 (FIG. 21), and the interconnect layer 61-2 (FIG. 22); and the signal line TRG0 connected through the vertical vias. The signal line TRG0 is a signal line through which a signal that controls the second transfer transistor (TRG0) of the pixel 50-0 (FIG. 19) is supplied.

On the lower side in the drawing of the signal line TRG0, there are TRX1 regions (gates) individually formed in the semiconductor substrate 63 (FIG. 19), the interconnect layer

61-1 (FIG. 21), and the interconnect layer 61-2 (FIG. 22); and the signal line TRX1 connected through the vertical vias. The signal line TRX1 is a signal line through which a signal that controls the first transfer transistor (TRX1) of the pixel 50-1 (FIG. 19) is supplied.

On the lower side in the drawing of the signal line TRX1, there are TRX0 regions (gates) individually formed in the semiconductor substrate 63 (FIG. 19), the interconnect layer 61-1 (FIG. 21), and the interconnect layer 61-2 (FIG. 22); and the signal line TRX0 connected through the vertical vias. The signal line TRX0 is a signal line through which a signal that controls the first transfer transistor (TRX0) of the pixel 50-0 (FIG. 19) is supplied.

On the lower side in the drawing of the signal line TRX0, there are TRY0 regions (gates) individually formed in the semiconductor substrate 63 (FIG. 19), the interconnect layer 61-1 (FIG. 21), and the interconnect layer 61-2 (FIG. 22); and the signal line TRY0 connected through the vertical vias. The signal line TRY0 is a signal line through which a signal that controls the third transfer transistor (TRY0) of the pixel 50-1 and the pixel 50-0 (FIG. 19) is supplied.

On the lower side in the drawing of the signal line TRY0, there are OFG regions individually formed in the semiconductor substrate 63 (FIG. 19), the interconnect layer 61-1 (FIG. 21), and the interconnect layer 61-2 (FIG. 22); and the signal line OFG connected through the vertical vias.

On the lower side in the drawing of the signal line OFG, there are SEL regions (gates) individually formed in the semiconductor substrate 63 (FIG. 19), the interconnect layer 61-1 (FIG. 21), and the interconnect layer 61-2 (FIG. 22); and the signal line SEL connected through the vertical vias. The signal line SEL is a signal line through which a signal that controls the selection transistor (SEL) shared by the pixels 50-0 to 50-4 (FIG. 19) is supplied.

Interconnects arranged in the bottom half in the drawing are signal lines mainly relevant to the pixel 50-1 and the pixel 50-0, which are pixels arranged in the bottom area out of four pixels in a 2×2 matrix, and also relevant to the transistors arranged between the pixel 50-1 and the pixel 50-0.

As described above, the interconnect layer 61-3 has formed therein the signal lines.

Now, if focused on the signal line FDB laid in the interconnect layer 61-3 illustrated in FIG. 23, and on the FD interconnect 126 (FD boost interconnect 301), there may be structures in which the signal line FDB and the FD interconnect 126 are laid orthogonally, and laid in parallel.

The FD interconnect 126 illustrated in each of FIGS. 3, 5, 7, and 8 is formed in the vertical direction in the drawing, and will be a structure laid orthogonally, if employed in the pixels, to the signal line FDB that is formed in the lateral direction in FIG. 23. In such a case, since also the FD boost interconnect 301 is formed in the same direction as the FD interconnect 126, so that also the FD boost interconnect 301 will be laid orthogonally to the signal line FDB.

On the other hand, the FD interconnect 126 illustrated in each of FIGS. 4 and 6 is formed in the lateral direction in the drawing, and will be a structure laid in parallel, if employed in the pixels, to the signal line FDB that is formed in the lateral direction in FIG. 23. In such a case, since also the FD boost interconnect 301 is formed in the same direction as the FD interconnect 126, so that also the FD boost interconnect 301 will be a structure laid in parallel to the signal line FDB.

Figure 24:
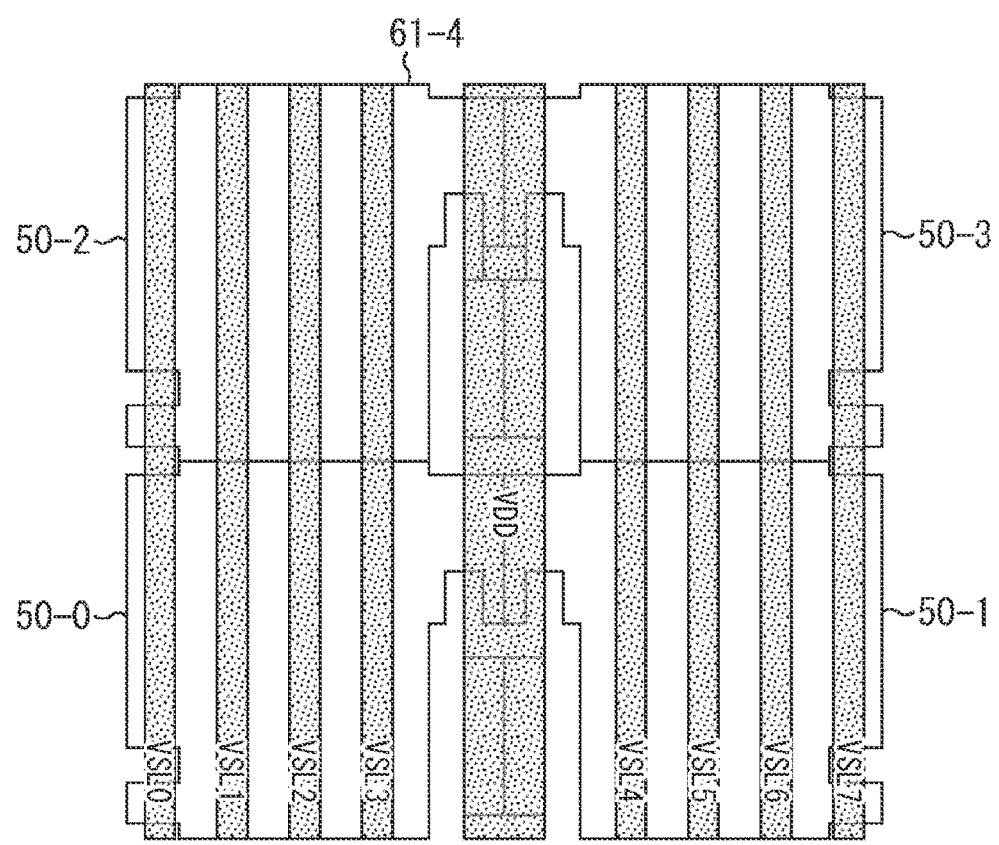
FIG. 24 is a view for explaining a layout and patterns of interconnects for the pixels.

FIG. 24 is a view illustrating layout and pattern of the interconnects and so forth that are laid in the interconnect layer 61-4 stacked on the interconnect layer 61-3 illustrated in FIG. 23. The interconnect layer 61-4 has formed therein vertical signal lines.

As has been explained referring to the circuit diagram of FIG. 20, in the case where the eight vertical signal lines are formed, there are formed the vertical signal lines VSL0 to 7 in the interconnect layer 61-4, in the vertical direction in the drawing. Referring back to FIG. 19 again, there is formed, on the lower side of the selection transistor (SEL), a via VSLout through which an output from the selection transistor is output to the vertical signal line, and the via VSLout is connected through an interconnect, which is indicated as VSL in the interconnect layer 61-2 (FIG. 22), to the signal line VSL in the interconnect layer 61-3 (FIG. 23).

The signal line VSL in the interconnect layer 61-3 is formed below the signal line SEL, which is formed straight in the lateral direction similarly to the other signal lines. The signal line VLS is connected through a via to any one of seven vertical signal lines VSL0 to 7 in the interconnect layer 61-4.

The aforementioned layout and pattern of the interconnects are only illustrative, but not restrictive.

In the examples illustrated in FIGS. 19 to 23, TRY which is the third transfer transistor is formed as TRY0 in each of the pixel 50-0 and the pixel 50-1, and TRY0's are connected to a single signal line TRY0. Meanwhile, TRY1 is formed in each of the pixel 50-2 and the pixel 50-3, and TRY1's are connected to a single signal line TRY1.

The third transfer transistor (TRY) is a transistor used when the electric charge is transferred from the PD 51 (PD0 to 3) to the electric charge holding part 54 (MEM0 to 3). In the global shutter system, the transfer of electric charge from the PD 51 to the electric charge holding part 54 occurs all at once for all pixels. Hence, the third transfer transistor (TRY) can alternatively be controlled commonly for all pixels. If the control common to all pixels were employed, a possible structure may have the signal line TRY shared among all pixels.

As described above, by making the horizontally arranged pixels, such as the pixel 50-0 and the pixel 50-1 exemplified in FIG. 19, share the signal line TRY0, and by making the pixel 50-2 and the pixel 50-3 share the signal line TRY1, it now becomes possible to place the horizontally arranged pixels 50 under the same control, meanwhile to place the vertically arranged pixels 50 under a separate control.

Such possibility enables readout control that is suited row by row. Such possibility even enables control such as varying exposure time row by row. Note, as described above, a possible configuration may have formed therein the signal line TRY that is shared among all pixels, in which employment of the signal line TRY shared among all pixels can reduce the number of signal lines. Hence, if there were a need for space saving, the signal line TRY may be commonalized both in the horizontal direction and in the vertical direction.

<Application of Vertical Transistor>

As has been described referring to FIGS. 15, 16A, 16B, and 16C, by employing a vertical transistor with the gate extended deep inside the silicon substrate, for use as a transistor for reading out the electric charge from the electric charge holding part 54, the readout operation may be enabled while improving the modulating power, and while deepening the potential.

Such a vertical transistor is also applicable to the readout operation from the photodiode (PD). When applied to the readout operation from PD, also such readout operation becomes enabled while improving the modulating power, and while deepening the potential.

Figure 25:
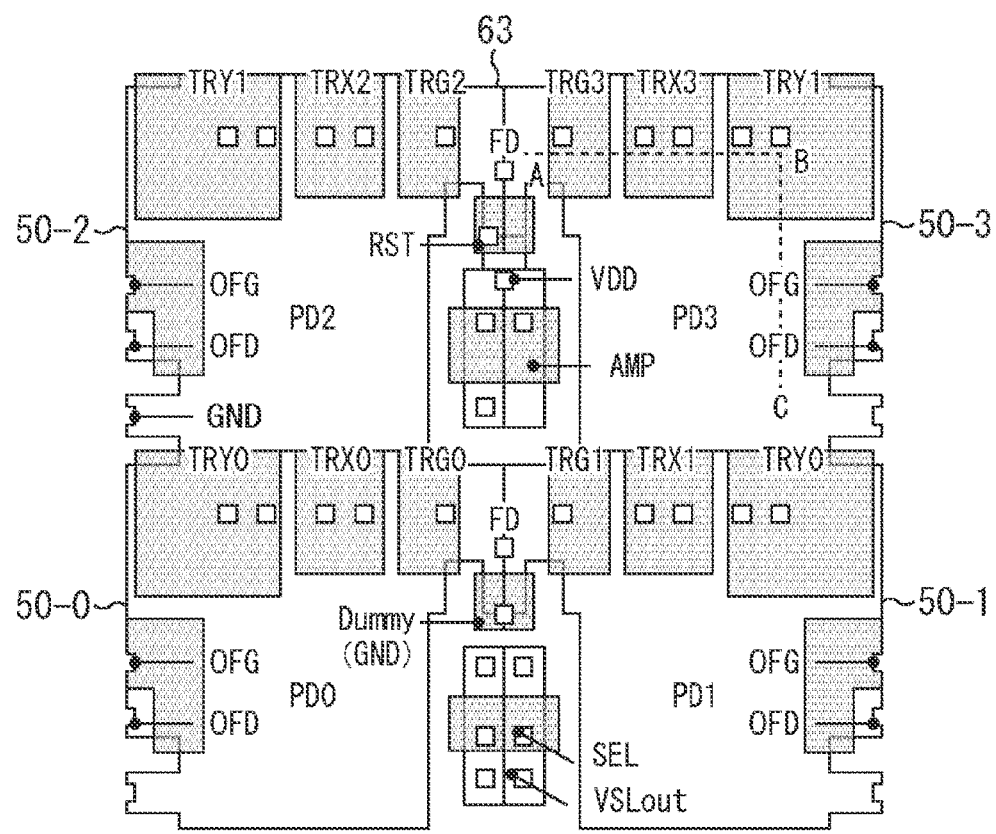
FIG. 25 is a plan view illustrating a configuration of the pixels.

A structure of the pixel 50 that applies the vertical transistor also to the readout operation from PD, will be explained referring to FIGS. 25 and 26. FIG. 25 is a view same as the plan view of the semiconductor substrate 63 illustrated in FIG. 19, except for adding line segment A-B-C to the pixel 50-3. A cross sectional view taken along the line segment A-B-C is illustrated in FIG. 26.

Figure 26:
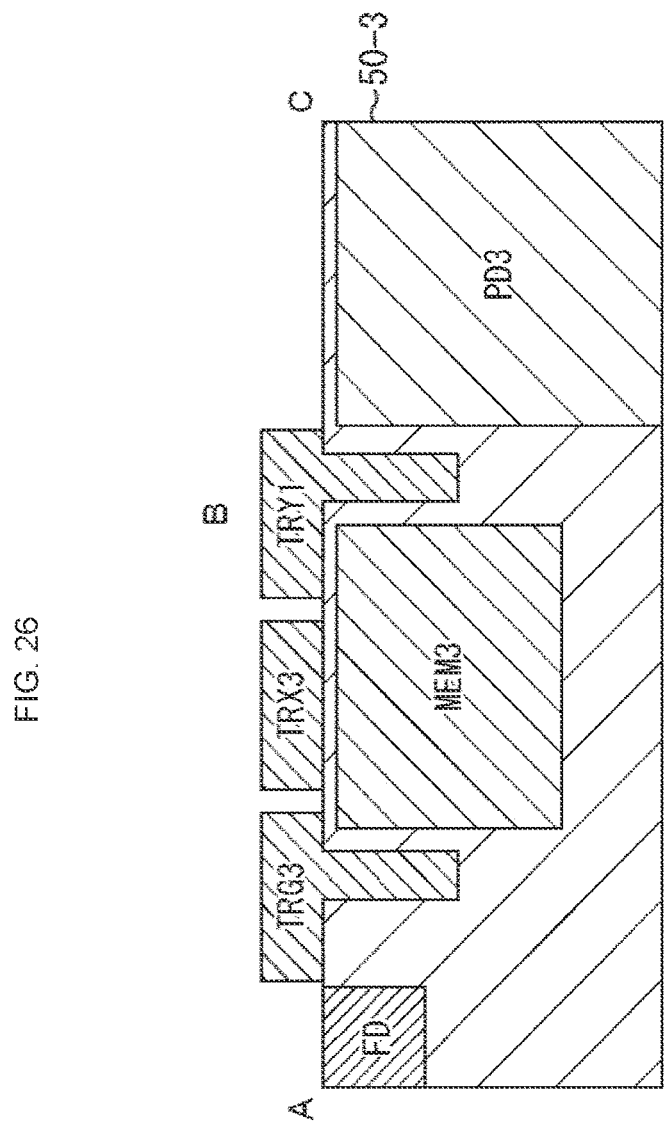
FIG. 26 is a cross sectional view illustrating a configuration of the pixel.

Referring now to FIGS. 25 and 26, FD, TRG3, TRX3, TRY1, and PD3 are arranged in this order along the line segment A-B-C, starting from point A. Note that FD, TRG3, TRX3, TRY1, and PD3 are given reference signs same as those given in FIGS. 19 to 24.

Between FD and MEM3, there is formed TRG3 that includes the vertical transistor. As has been explained referring to FIG. 15, the vertical transistor is formed in the vertical direction and in the horizontal direction relative to MEM3, in which the part formed in the vertical direction extends deep inside the silicon.

Similarly, between PD3 and MEM3, there is formed TRY1 that includes the vertical transistor and is formed in the vertical direction and in the horizontal direction relative to MEM3, in which the part formed in the vertical direction extends deep inside the silicon.

TRY1 is a transistor used when the electric charge is transferred from PD3 to MEM3. By configuring TRY1 as the vertical transistor, the readout operation of the electric charge from PD3 is enabled, while improving the modulating power, and while deepening the potential.

By configuring the transistor (TRY) that takes part in reading out from PD3 (photodiode 51), and the transistor (TRG) that takes part in reading out from MEM3 (electric charge holding part 54) individually using the vertical transistor as described above, now the reading out from the photodiode 51 and the reading out from the electric charge holding part 54 are enabled, while enhancing the modulating power, and while deepening the potential.

Hence, the saturation levels (dynamic ranges) of the photodiode 51 and the electric charge holding part 54 can be widened.

Formation of the transistor, which takes part in reading out from the photodiode 51, using the vertical transistor is applicable to the aforementioned embodiments, and below-mentioned embodiments.

<Configuration Having Conversion Efficiency Switching Transistor>

Figure 27:
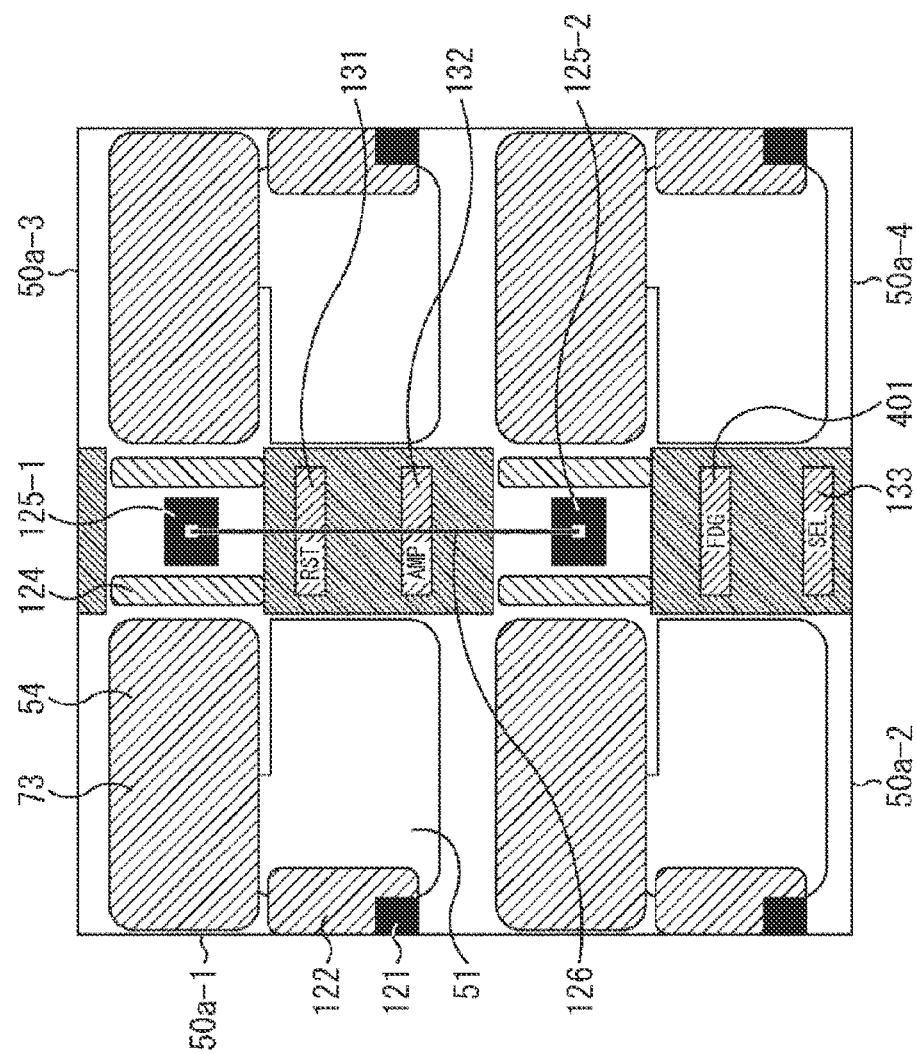
FIG. 27 is a plan view illustrating another configuration of the pixels.

Next, the pixel (a pixel group of the co-owning unit) having a conversion efficiency switching transistor will be explained. FIG. 27 is a view illustrating a configuration of the pixel group in a single co-owning unit having a conversion efficiency switching transistor 401.

The configuration of the pixel group in a single co-owning unit illustrated in FIG. 27 is basically similar to the configuration of the pixel group in a single co-owning unit having been illustrated in FIG. 3, except for that the conversion efficiency switching transistor 401 is added, so that explanation therefor will be skipped.

The conversion efficiency switching transistor 401, when turned ON, can expand the floating diffusion region of the FD 125, and can increase the capacitance of the FD 125, making it possible to reduce the conversion efficiency.

Figure 28:
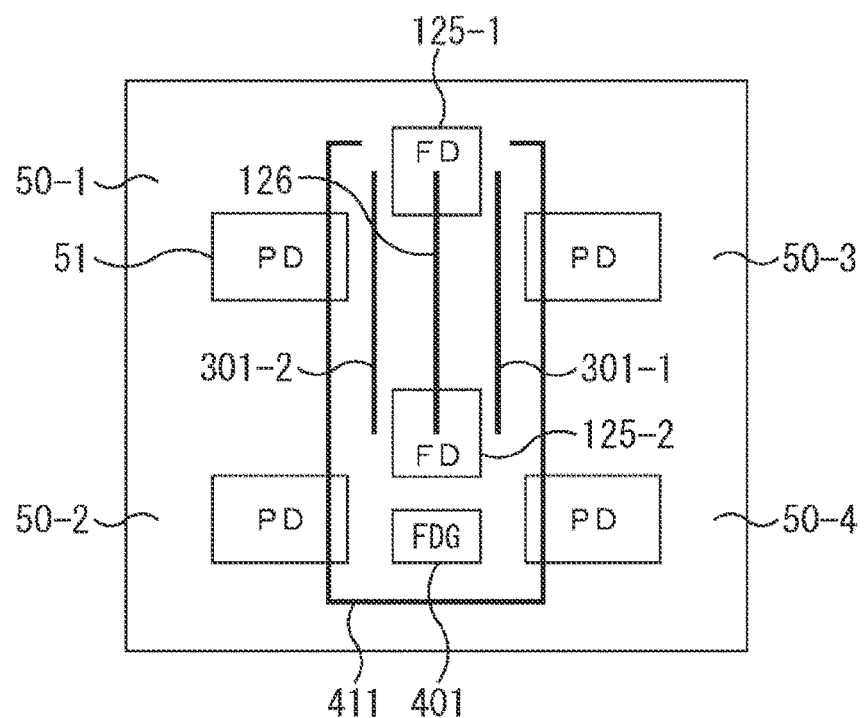
FIG. 28 is a diagram for explaining an FD conversion interconnect.

FIG. 28 is, same as FIG. 10, a diagram illustrating a four co-owning pixel structure for boosting the FD 125. Although FIG. 28 illustrates the PD 51, the FD 125, and the FD interconnect 126 for the convenience of explanation, also the TRX gate 73 and so forth are actually arranged as illustrated in FIG. 27.

FD 125-1 and the FD 125-2 are connected through the FD interconnect 126. The FD boost interconnect 301-1 is formed on the right side of the FD interconnect 126, and the FD boost interconnect 301-2 is formed on the left side. Such a configuration is same as that illustrated in FIG. 10.

In the configuration illustrated in FIG. 28, there is further formed a FD conversion interconnect 411 outside of the FD boost interconnect 301. Furthermore, the conversion efficiency switching transistor 401 (indicated by FDG in the drawing) is formed below the FD 125-2.

With the conversion efficiency switching transistor 401 turned OFF, the FD interconnect 126 and the FD conversion interconnect 411 are not connected to each other, in which the capacitance of the FD 125 is given by a total capacitance of the FD 125-1, the FD 125-2, and the FD interconnect 126.

With the conversion efficiency switching transistor 401 turned ON, the FD interconnect 126 and the FD conversion interconnect 411 are connected, in which the capacitance of the FD 125 is given by a total capacitance of the FD 125-1, the FD 125-2, the FD interconnect 126, and the FD conversion interconnect 411.

With the conversion efficiency switching transistor 401 turned ON, the floating diffusion region will expand just by a contribution of the FD conversion interconnect 411, therefore reducing the conversion efficiency of the FD 125.

The pixel having the conversion efficiency switching transistor 401 and the FD conversion interconnect 411 may be configured so that the FD 125 can be boosted by the FD boost interconnect 301 when the conversion efficiency switching transistor 401 is kept turned OFF. Alternatively, the FD 125 may be boosted by the FD boost interconnect 301 when the conversion efficiency switching transistor 401 is kept turned ON. Again alternatively, the FD 125 may be boosted by the FD boost interconnect 301, irrespective of ON/OFF of the conversion efficiency switching transistor 401.

When the conversion efficiency switching transistor 401 is kept turned ON, the floating diffusion region of the FD 125 expands to reduce the conversion efficiency, in which boosting of the FD 125 by using the FD boost interconnect 301 can prevent the conversion efficiency from degrading.

In a case where the FD 125 can be boosted by using the FD boost interconnect 301, irrespective of ON/OFF of the conversion efficiency switching transistor 401, it is acceptable to separately provide, as different interconnects, the FD boost interconnect 301 used for boosting the FD 125 when the FD conversion efficiency switching transistor 401 is kept turned ON, and the FD boost interconnect 301 used for boosting the FD 125 when the conversion efficiency switching transistor 401 is kept turned OFF.

In an exemplary case where the FD boost interconnect 301-1 and the FD boost interconnect 301-2 are formed as illustrated in FIG. 27, it is acceptable to boost the FD 125 by using the FD boost interconnect 301-1, when the conversion efficiency switching transistor 401 is kept turned OFF; meanwhile to boost the FD 125 by using the FD boost interconnect 301-1 and the FD boost interconnect 301-2, when the conversion efficiency switching transistor 401 is kept turned ON.

Alternatively, voltage applied to the FD boost interconnect 301 may be varied depending on whether the conversion efficiency switching transistor 401 is kept turned ON or OFF.

<Specific Patterns of Interconnect>

Figure 29:
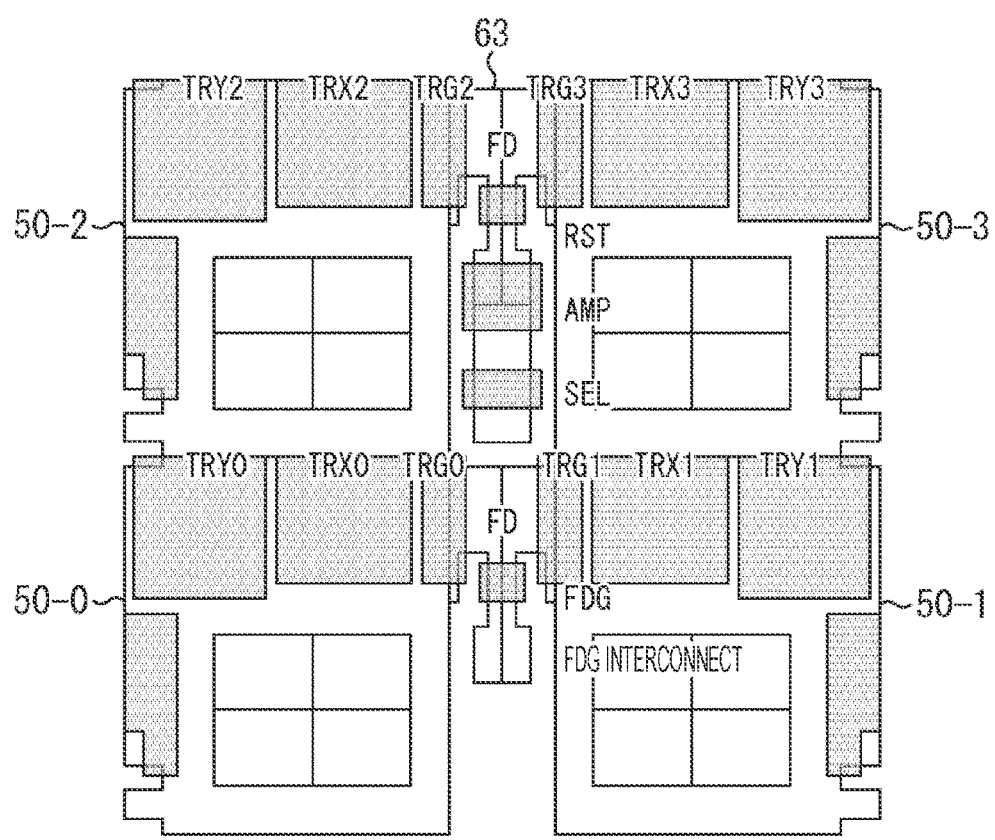
FIG. 29 is a view for explaining a layout and patterns of interconnects for the pixels.
Figure 30:
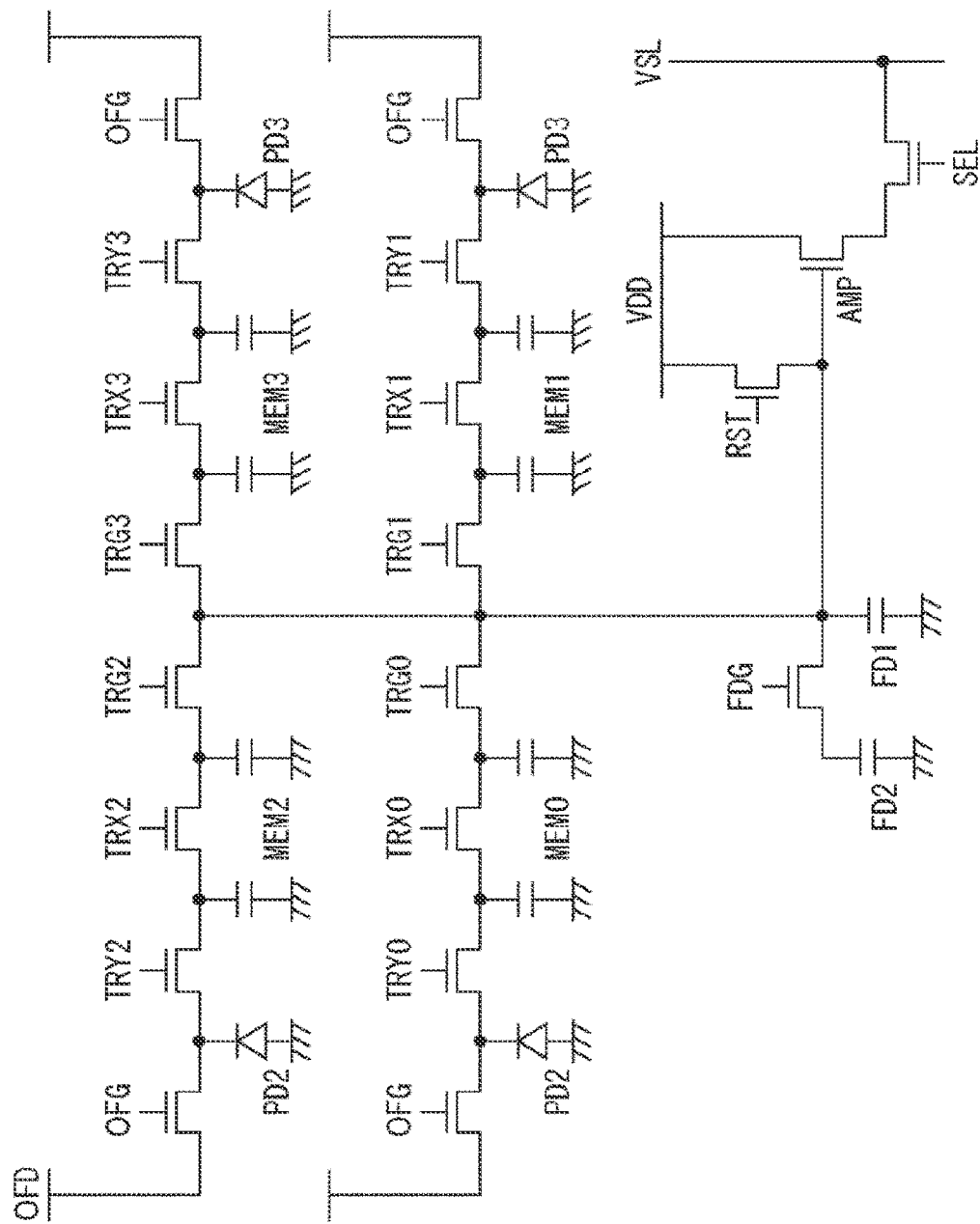
FIG. 30 is a circuit diagram illustrating a configuration of the pixel.
Figure 31:
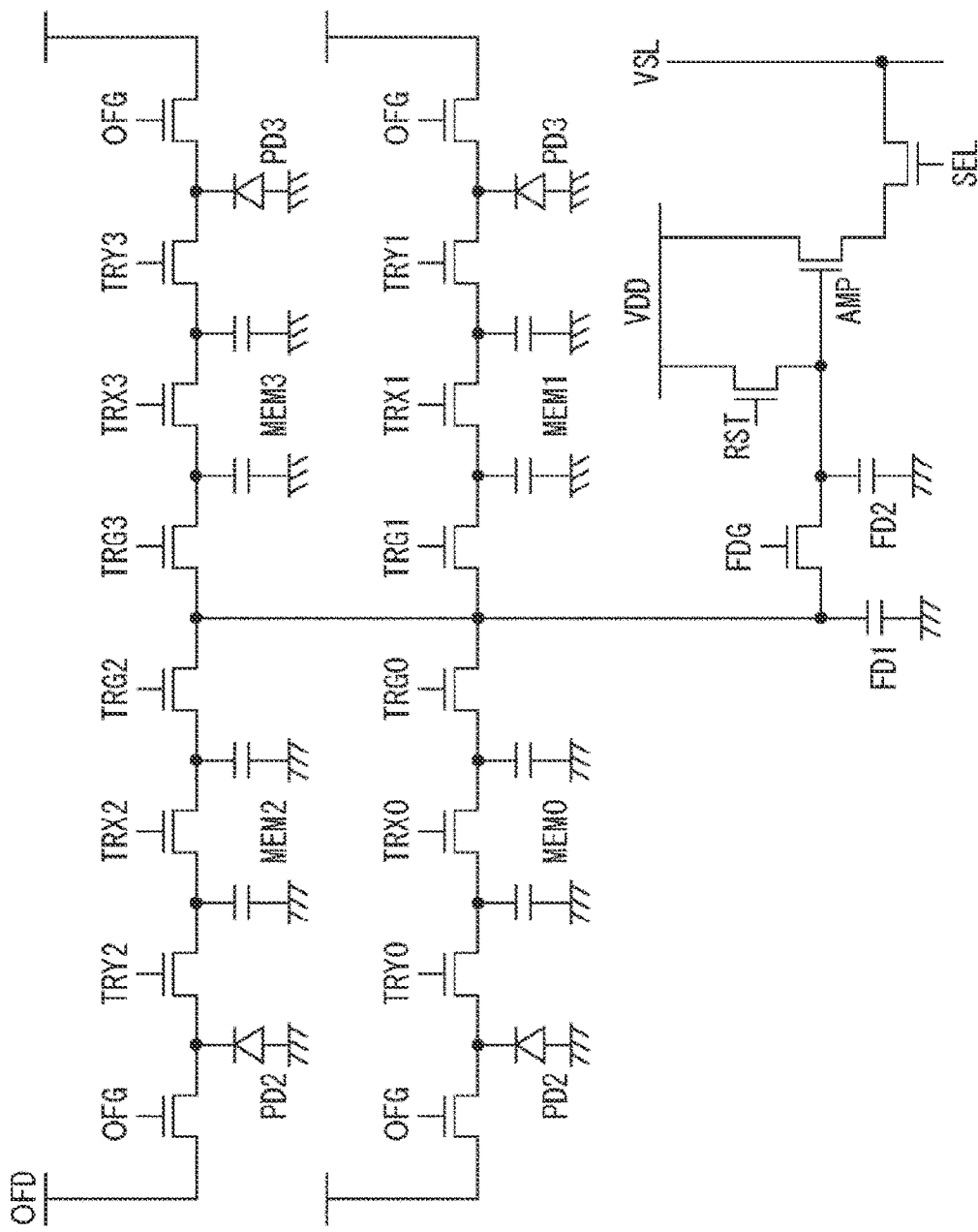
FIG. 31 is a circuit diagram illustrating a configuration of the pixel.

Next, exemplary specific patterns of the FD interconnect 126 and the FD boost interconnect 301, in the pixel having the conversion efficiency switching transistor 401 will be explained. FIG. 29 is a plan view of the semiconductor substrate 63, illustrating an exemplary specific layout and pattern of the PD 51 and so forth. FIGS. 30 and 31 are circuit diagrams corresponded to the configuration illustrated in FIG. 29.

FIG. 29 illustrates four pixels arranged in a 2×2 matrix to form a single co-owning unit. A pixel 50-0 is arranged on the bottom left, a pixel 50-1 is arranged on the bottom right, a pixel 50-2 is arranged on the top left, and a pixel 50-3 is arranged on the top right. The basic layout and the pattern are all the same as those of the pixels illustrated in FIG. 19, except for that the conversion efficiency switching transistor 401 is added to the pixels illustrated in FIG. 19.

The conversion efficiency switching transistor 401 (indicated by FDG in FIG. 29) is formed between the pixel 50-0 and the pixel 50-1. Between the pixel 50-2 and the pixel 50-3, there are formed the SEL (corresponded to the selection transistor 133), the AMP (corresponded to the amplification transistor 132), the RST (corresponded to the reset transistor 131), and the FD (corresponded to the FD 125).

Each pixel 50 has formed therein PD, OFD, OFG, TRY, TRX, and TRG. In addition, MEM (corresponded to the electric charge holding part 54) is formed in a region where TRY and TRX are formed.

PD, OFD, OFG, TRY, TRY, TRG, and MEM formed in the pixels 50 are connected as illustrated in the circuit diagram of FIGS. 30 and 31. A circuit configuration for a single pixel has been explained previously referring to FIG. 13, and will therefore be not explained again. Note, however, that all configurations of the pixels exemplified in FIG. 29 and subsequent drawings have TRY which is formed in every pixel and is controllable pixel by pixel.

In the circuit diagrams illustrated in FIGS. 30 and 31, FD1 represents a part corresponded to the FD 125, and FD2 represents the FD conversion interconnect 411. Upon turning ON of the conversion efficiency switching transistor 401, FD1 and FD2 can function as a single FD.

Figure 32:
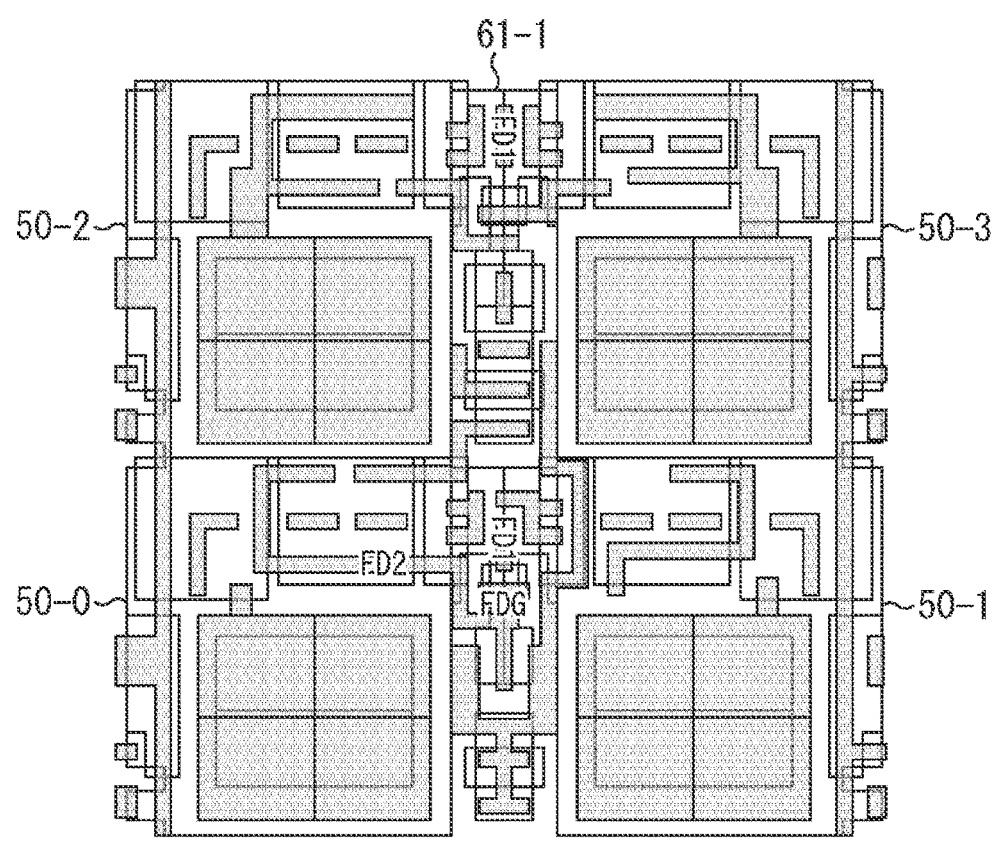
FIG. 32 is a view for explaining a layout and patterns of interconnects for the pixels.

FIG. 32 is a view illustrating layout and pattern of the interconnects and so forth that are laid in the interconnect layer 61-1 stacked on the semiconductor substrate 63 illustrated in FIG. 29. The interconnect layer 61-1 has formed therein a light shielding film typically including metal, for example, at a position corresponded to PD formed in the semiconductor substrate 63.

The interconnect layer 61-1 also has formed therein the gate of TRY, in a part of the semiconductor substrate 63 illustrated in FIG. 29 where TRY of the pixel 50 is formed. Again in the interconnect layer 61-1 has formed therein the gate TRX and the gate of TRG. In addition, the interconnect layer 61-1 has formed therein the gate of the conversion efficiency switching transistor 401 (FDG).

Moreover, the interconnect layer 61-1 also has formed therein the via through which the FD region formed in the semiconductor substrate 63 is connected to the FD interconnect 126 formed in the interconnect layer 61-2. Furthermore, the interconnect layer 61-1 has formed therein the FD conversion interconnect 411 (interconnect named FD2 in FIG. 32).

Figure 33:
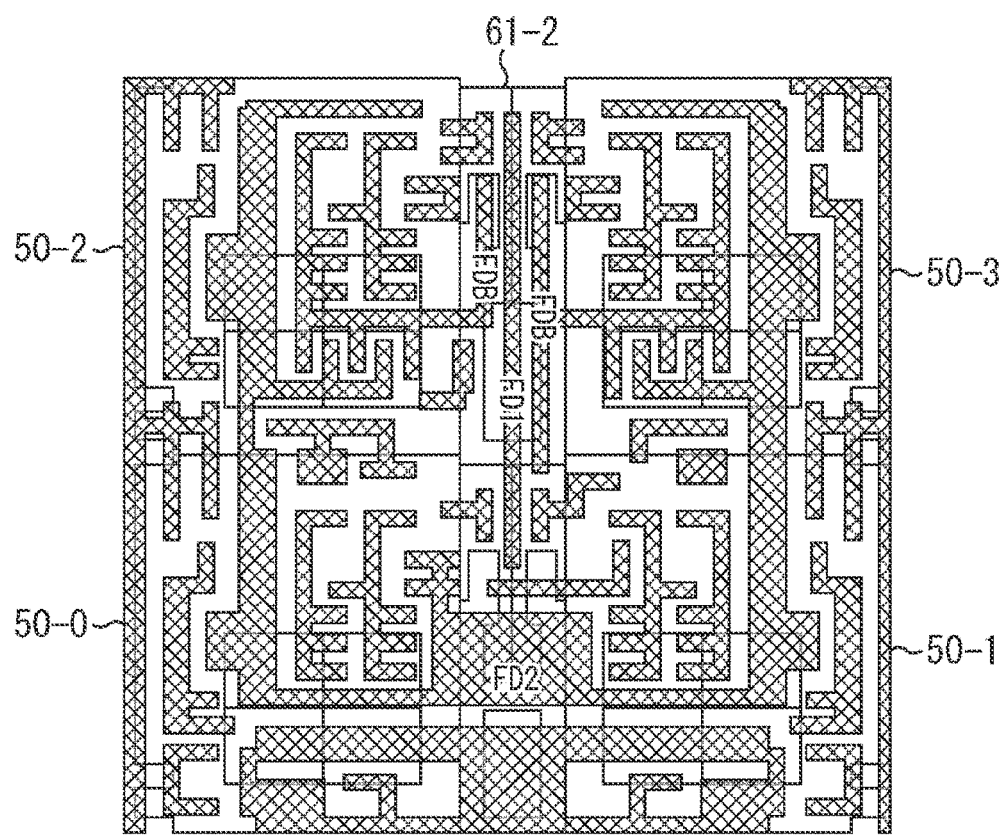
FIG. 33 is a view for explaining a layout and patterns of interconnects for the pixels.

FIG. 33 is a view illustrating layout and pattern of the interconnects and so forth that are laid in the interconnect layer 61-2 stacked on the interconnect layer 61-1 illustrated in FIG. 32. The interconnect layer 61-2 has formed therein the FD interconnect 126 (interconnects named FD1 in the drawing) that connects regions of the FD 125 formed in the semiconductor substrate 63. The FD boost interconnect 301 (interconnect named FOB in FIG. 33) is formed in the vicinity of, and in parallel to the FD interconnect 126. The example illustrated in FIG. 33 represents a case where the FD boost interconnects 301 are formed, with the FD interconnect 126 centered in between.

Figure 34:
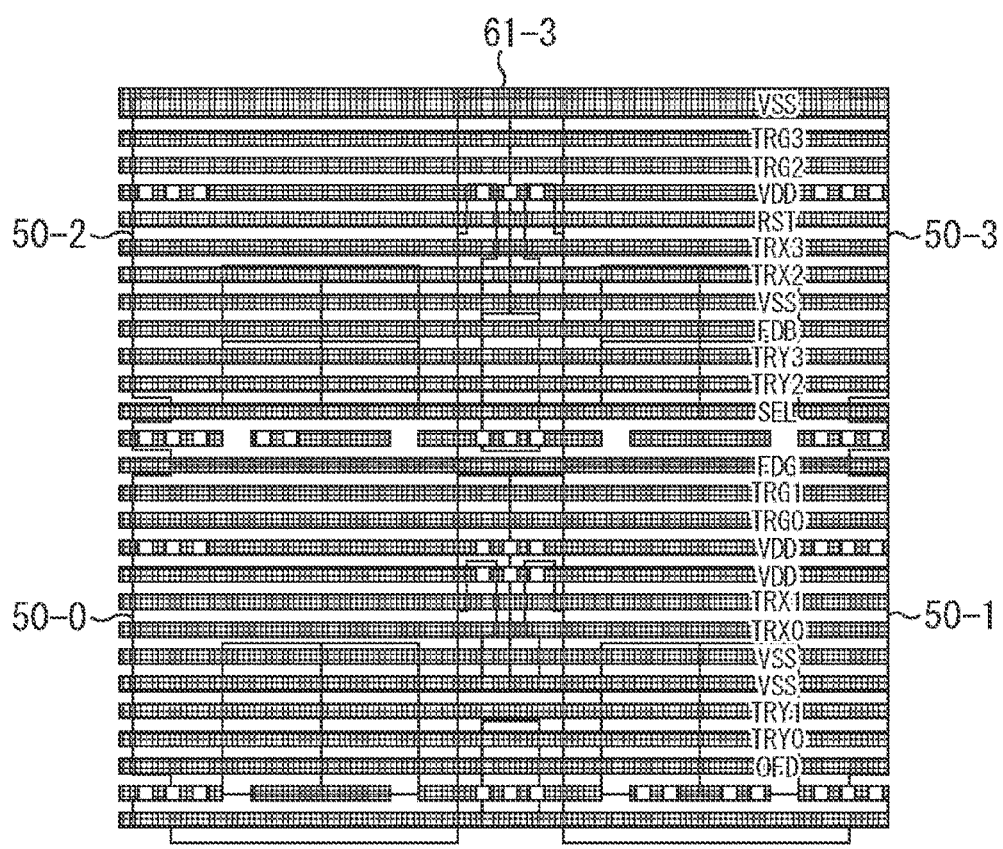
FIG. 34 is a view for explaining a layout and patterns of interconnects for the pixels.

FIG. 34 is a view illustrating layout and pattern of the interconnects and so forth that are laid in the interconnect layer 61-3 stacked on the interconnect layer 61-2 illustrated in FIG. 33. In the interconnect layer 61-3, there is formed the control signal lines laid in the lateral direction (horizontal direction) in the drawing. Similarly to the interconnect layer 61-3 of the pixels free of the conversion efficiency switching transistor 401 as illustrated in FIG. 23, there are formed, as the control signal lines, the signal line OFD, the signal line OFG, the signal line TRY, the signal line TRX, the signal line RST, the signal line VDD, the signal line VSS, and the signal line SEL. In addition, also the signal line FDG through which a signal for controlling the conversion efficiency switching transistor is supplied is formed. Again in addition, also TRY0 to TRY3 are formed, since TRY is provided to every pixel.

Figure 35:
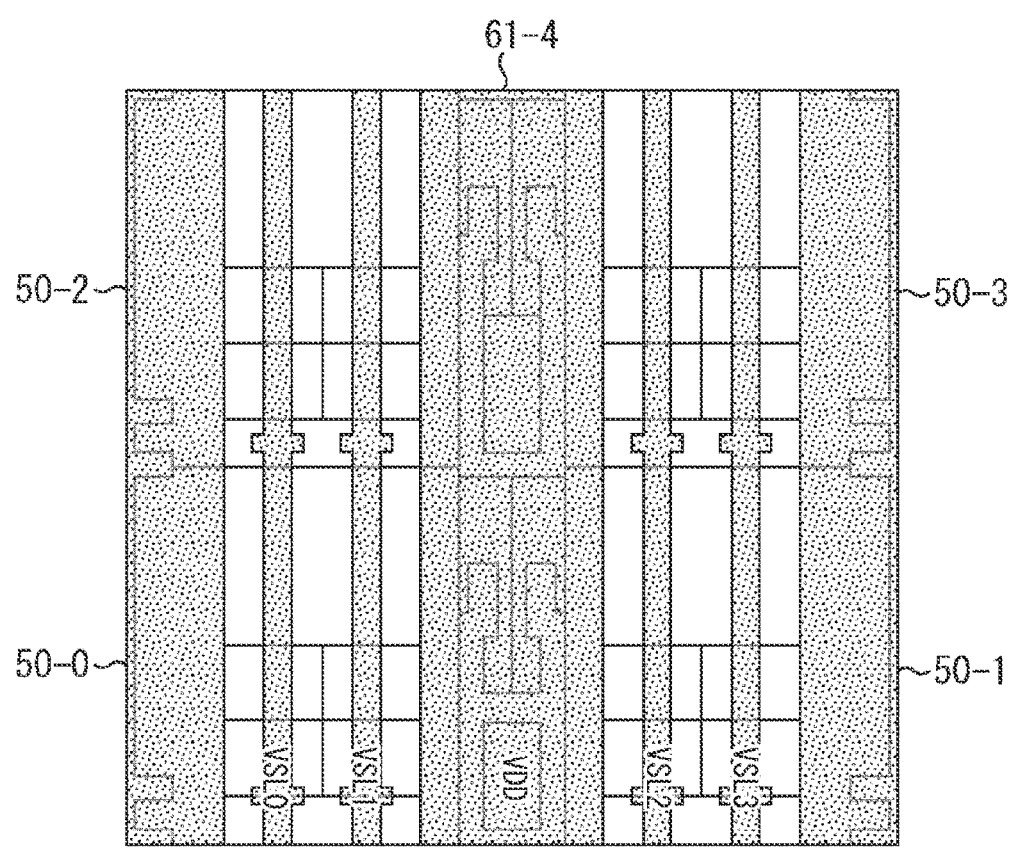
FIG. 35 is a view for explaining a layout and patterns of interconnects for the pixels.

FIG. 35 is a view illustrating layout and pattern of the interconnects and so forth that are laid in the interconnect layer 61-4 stacked on the interconnect layer 61-3 illustrated in FIG. 34. The interconnect layer 61-4 has formed therein vertical signal lines. In the interconnect layer 61-4, the vertical signal lines VSL0 to 3 are formed in the vertical direction (perpendicular direction) in the drawing.

The aforementioned layout and pattern of the interconnects are only illustrative, but not restrictive.

The present technology has the electric charge holding part that temporarily accumulates the electric charge from the PD, and, when used for image capturing on the basis of the global shutter system, can attain a necessary level of boosting of the FD, and can improve the conversion efficiency. In addition, the present technology, when applied to a configuration having FDs shared among a plurality of pixels, can attain a necessary level of boosting of the FDs, by forming the interconnect for boosting the FDs in the vicinity of the interconnect that connects the FDs to be shared.

According to the present technology, it now becomes possible to attain a necessary level of dynamic range, and to reduce the noise.

<Electronic Device>

Application of the present technology is not limited to application to an imaging device, and the present technology can be applied to general electronic devices using an imaging device as an image capturing unit (photoelectric converting unit), such as an imaging device such as a digital still camera and a video camera, a mobile terminal device such as a mobile phone, which has an imaging function, and a copier using an imaging device as an image reading unit. Note that there is a case where a module-like form mounted on an electronic device, that is, a camera module is used as an imaging device.

Figure 36:
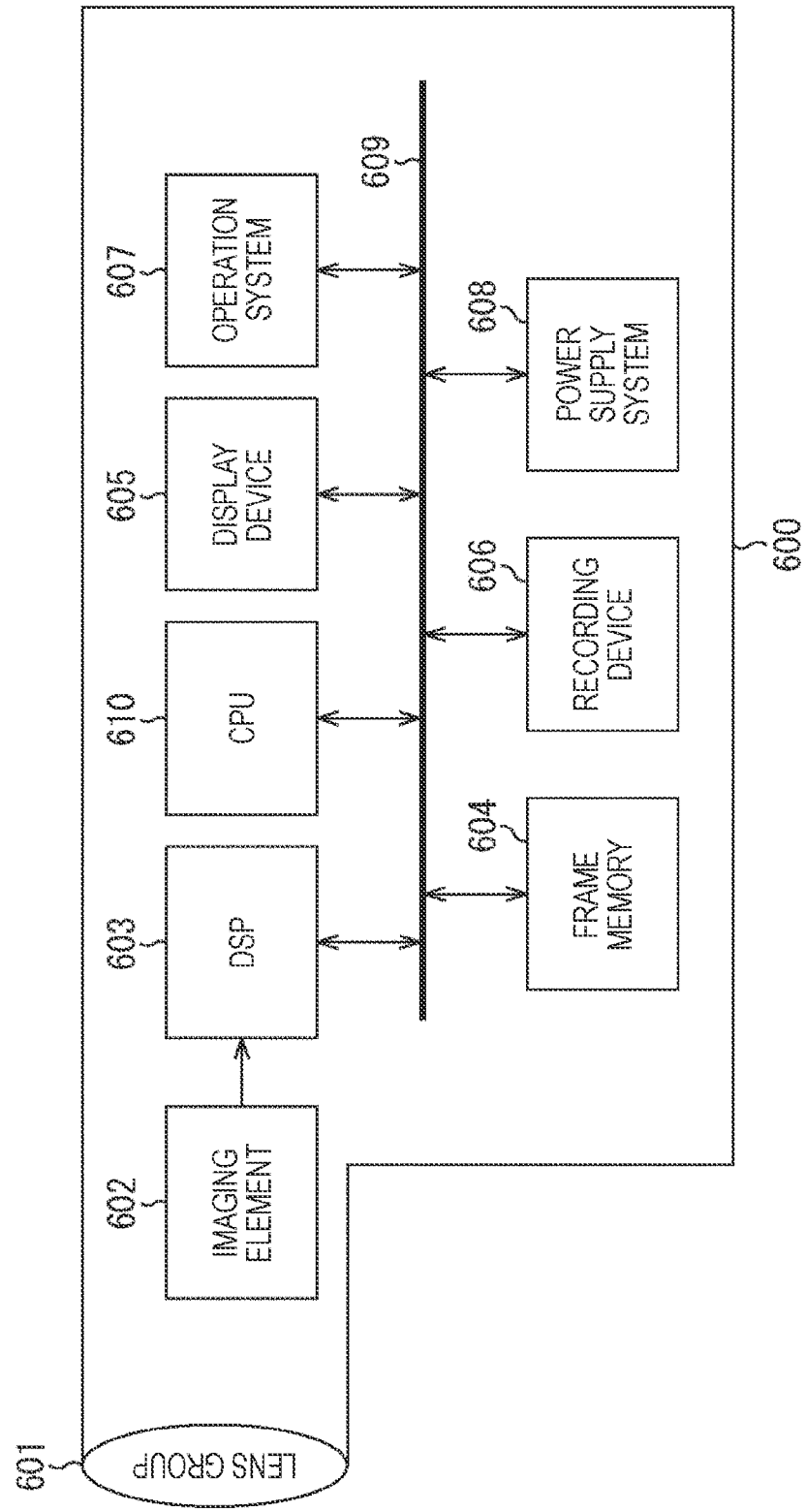
FIG. 36 is a diagram for explaining a configuration of an electronic device.

FIG. 36 is a block diagram illustrating a configuration example of an imaging device which is an example of an electronic device of the present disclosure. As illustrated in FIG. 36, an imaging device 600 according to the present disclosure includes an optical system including a lens group 601, or the like, an imaging element 602, a DSP circuit 603 which is a camera signal processing unit, a frame memory 604, a display device 605, a recording device 606, an operation system 607, a power supply system 608, or the like.

Further, the DSP circuit 603, the frame memory 604, the display device 605, the recording device 606, the operation system 607, and the power supply system 608 are connected to each other via a bus line 609. A CPU 610 controls respective units within the imaging device 600.

The lens group 601 captures incident light (image light) from a subject to form an image on an imaging surface of the imaging element 602. The imaging element 602 converts a light amount of the incident light whose image is formed on the imaging surface by the lens group 601 into an electric signal in units of pixel and outputs the electric signal as a pixel signal. As this imaging element 602, an imaging element (image sensor) including pixels which have been described above can be used.

The display device 605 is formed with a panel-type display device such as a liquid crystal display device and an organic electro luminescence (EL) display device, and displays a moving image or a still image captured at the imaging element 602. The recording device 606 records the moving image or the still image captured at the imaging element 602 in a recording medium such as a video tape and a digital versatile disk (DVD).

The operation system 607 issues operation commands for various functions provided at the present imaging device under operation by a user. The power supply system 608 supplies various kinds of power supplies which become operation power supplies of the DSP circuit 603, the frame memory 604, the display device 605, the recording device 606, and the operation system 607 to these supply targets as appropriate.

Such an imaging device 600 is applicable to camera modules for video camera, digital still camera, as well as mobile equipment including mobile phone. Moreover, in this imaging device 600, the imaging device described as the imaging element 602 in the aforementioned embodiment is applicable.

<Application Example to Endoscopic Surgery System>

A technology according to the present disclosure can be applied to various products. For example, the technology according to the present disclosure may be applied to an endoscopic surgery system.

Figure 37:
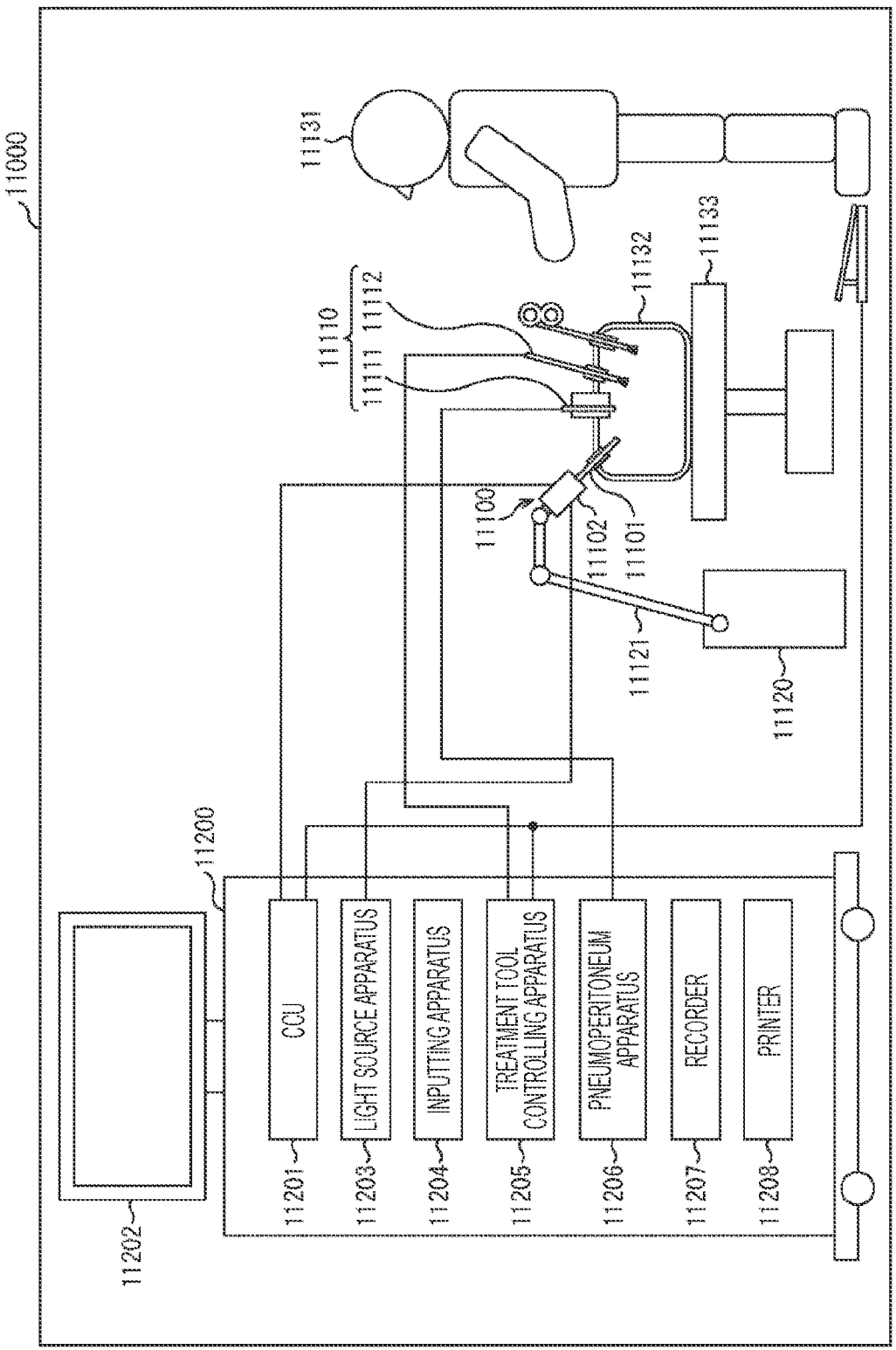
FIG. 37 is a diagram depicting an example of a schematic configuration of an endoscopic surgery system.

FIG. 37 is a diagram depicting an example of a schematic configuration of an endoscopic surgery system to which the technology according to the present disclosure (present technology) can be applied.

In FIG. 37, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which is included as a rigid endoscope having the lens barrel 11101 of the hard type. However, the endoscope 11100 may otherwise be included as a flexible endoscope having the lens barrel of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel by a light guide extending in the inside of the lens barrel 11101 and is emitted toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an imaging element are provided in the inside of the camera head 11102 such that reflected light (observation light) from the observation target is condensed on the imaging element by the optical system. The observation light is photo-electrically converted by the imaging element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU), or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region and the like to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or the like to change an image pickup condition (type of irradiation light, magnification, focal distance, or the like) by the endoscope 11100.

A treatment tool controlling apparatus 11205 controls driving of the energy device 11112 for cautery or incision of a tissue, sealing of a blood vessel, or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image, or a graph.

It is to be noted that the light source apparatus 11203 which supplies irradiation light when a surgical region is to be imaged to the endoscope 11100 may include a white light source which includes, for example, an LED, a laser light source, or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are emitted time-divisionally on an observation target and driving of the imaging elements of the camera head 11102 are controlled in synchronism with the irradiation timings, it is also possible to time-divisionally capture images corresponding to respective R, G, and B. According to the method just described, a color image can be obtained even if a color filter is not provided for the imaging element.

Further, the light source apparatus 11203 may be controlled such that the intensity of light to be output is changed for each predetermined time. By controlling driving of the imaging element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to emit light of a narrower wavelength band in comparison with irradiation light upon ordinary observation (namely, white light), so-called narrow band light observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation with excitation light may be performed. In fluorescent observation, it is possible to perform observation of fluorescent light from a body tissue by emitting excitation light on the body tissue (autofluorescence observation) or to obtain a fluorescent light image by locally injecting a reagent such as indocyanine green (ICG) into a body tissue and emitting excitation light corresponding to a fluorescent light wavelength of the reagent upon the body tissue, for example. The light source apparatus 11203 can be configured to supply such narrow-band light and/or excitation light suitable for special light observation as described above.

Figure 38:
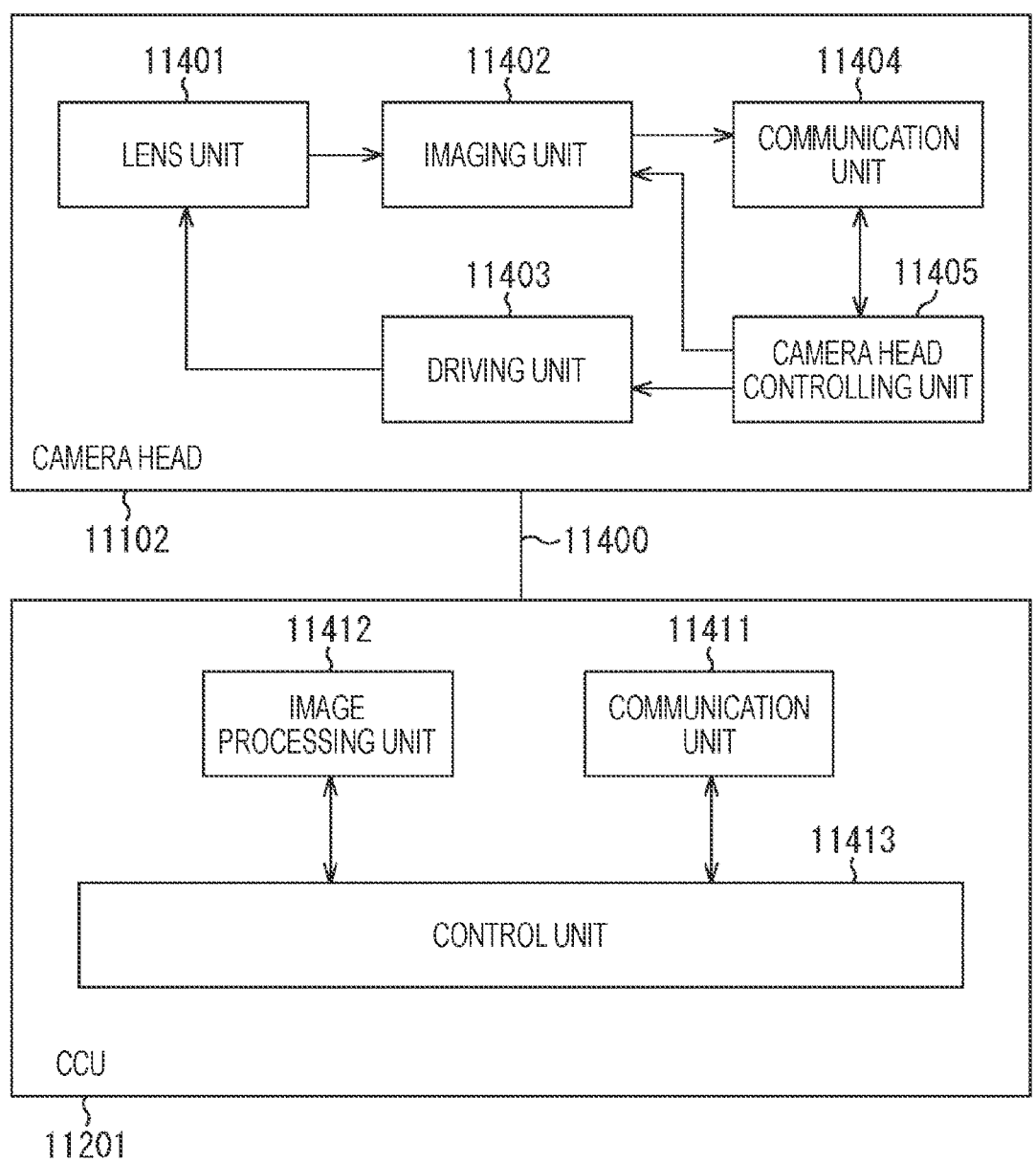
FIG. 38 is a block diagram depicting an example of a functional configuration of the camera head and the CCU.

FIG. 38 is a block diagram depicting an example of a functional configuration of the camera head 11102 and the CCU 11201 depicted in FIG. 37.

The camera head 11102 includes a lens unit 11401, an imaging unit 11402, a driving unit 11403, a communication unit 11404, and a camera head controlling unit 11405. The CCU 11201 includes a communication unit 11411, an image processing unit 11412, and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The imaging unit 11402 includes imaging elements. The number of imaging elements which is included by the imaging unit 11402 may be one (so-called single-plate type) or a plural number (so-called multi-plate type). Where the imaging unit 11402 is configured as that of the multi-plate type, for example, image signals corresponding to respective R, G, and B are generated by the imaging elements, and the image signals may be synthesized to obtain a color image. The imaging unit 11402 may also be configured so as to have a pair of imaging elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, in a case where the imaging unit 11402 is configured as that of multi-plate type, a plurality of systems of lens units 11401 is provided corresponding to the individual imaging elements.

Further, the imaging unit 11402 may not necessarily be provided on the camera head 11102. For example, the imaging unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the imaging unit 11402 can be adjusted suitably.

The communication unit 11404 includes a communication apparatus for transmitting and receiving various kinds of information to and from the CCU 11201. The communication unit 11404 transmits an image signal acquired from the imaging unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to imaging conditions such as, for example, information by which a frame rate of a picked up image is designated, information by which an exposure value upon image picking up is designated and/or information by which a magnification and a focal point of a picked up image are designated.

It is to be noted that the image pickup conditions such as the frame rate, exposure value, magnification, or focal point may be appropriately designated by the user or may be set automatically by the control unit 11413 of the CCU 11201 on the basis of an acquired image signal. In the latter case, an auto exposure (AE) function, an auto focus (AF) function, and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication, or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used, and so forth by detecting the shape, color, and so forth of edges of objects included in a picked up image. The control unit 11413 may cause, when it causes the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication, or a composite cable ready for both of electrical and optical communications.

Here, while, in the example depicted, communication is performed by wired communication using the transmission cable 11400, the communication between the camera head 11102 and the CCU 11201 may be performed by wireless communication.

Note that the endoscopic surgery system has been explained as an example above, however, the technology according to the present disclosure can also be applied to other systems, such as a microsurgery system, or the like.

<Application Example to Mobile Object>

A technology according to the present disclosure can be applied to various products. For example, the technology according to the present disclosure may also be realized as a device mounted in a mobile object of any type such as automobile, electric vehicle, hybrid electric vehicle, motorcycle, bicycle, personal mobility, airplane, drone, ship, or robot.

Figure 39:
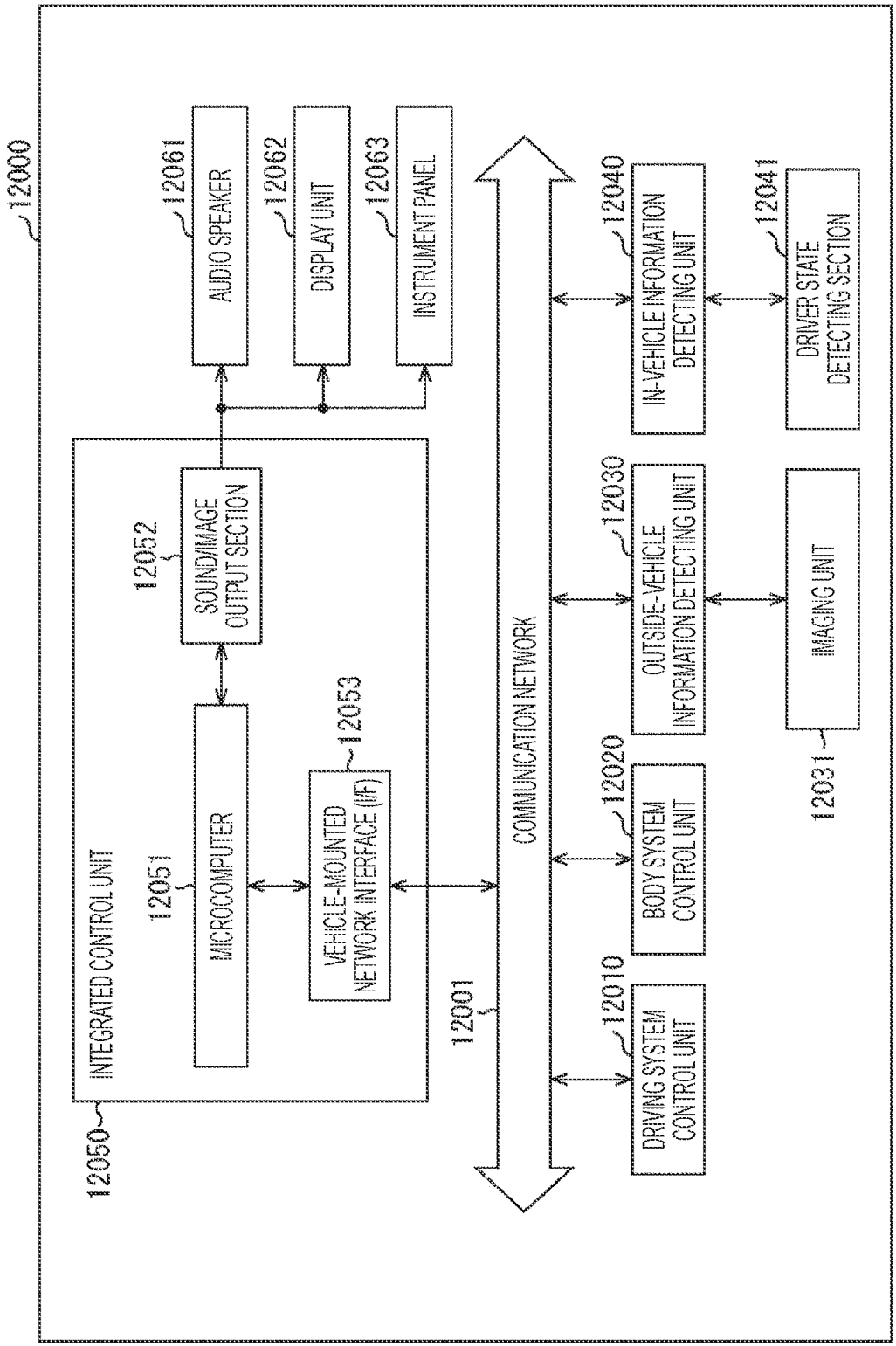
FIG. 39 is a block diagram depicting an example of schematic configuration of a vehicle control system.

FIG. 39 is a block diagram depicting an example of schematic configuration of a vehicle control system as an example of a mobile object control system to which the technology according to the present disclosure can be applied.

The vehicle control system 12000 includes a plurality of electronic control units connected to each other via a communication network 12001. In the example depicted in FIG. 39, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the surroundings of the vehicle which is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which is obtained by the outside-vehicle information detecting unit 12030. For example, the microcomputer 12051 can perform cooperative control intended to prevent a glare by controlling the headlamp so as to change from a high beam to a low beam, or the like, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 39, an audio speaker 12061, a display unit 12062, and an instrument panel 12063 are illustrated as the output device. The display unit 12062 may, for example, include at least one of an on-board display or a head-up display.

Figure 40:
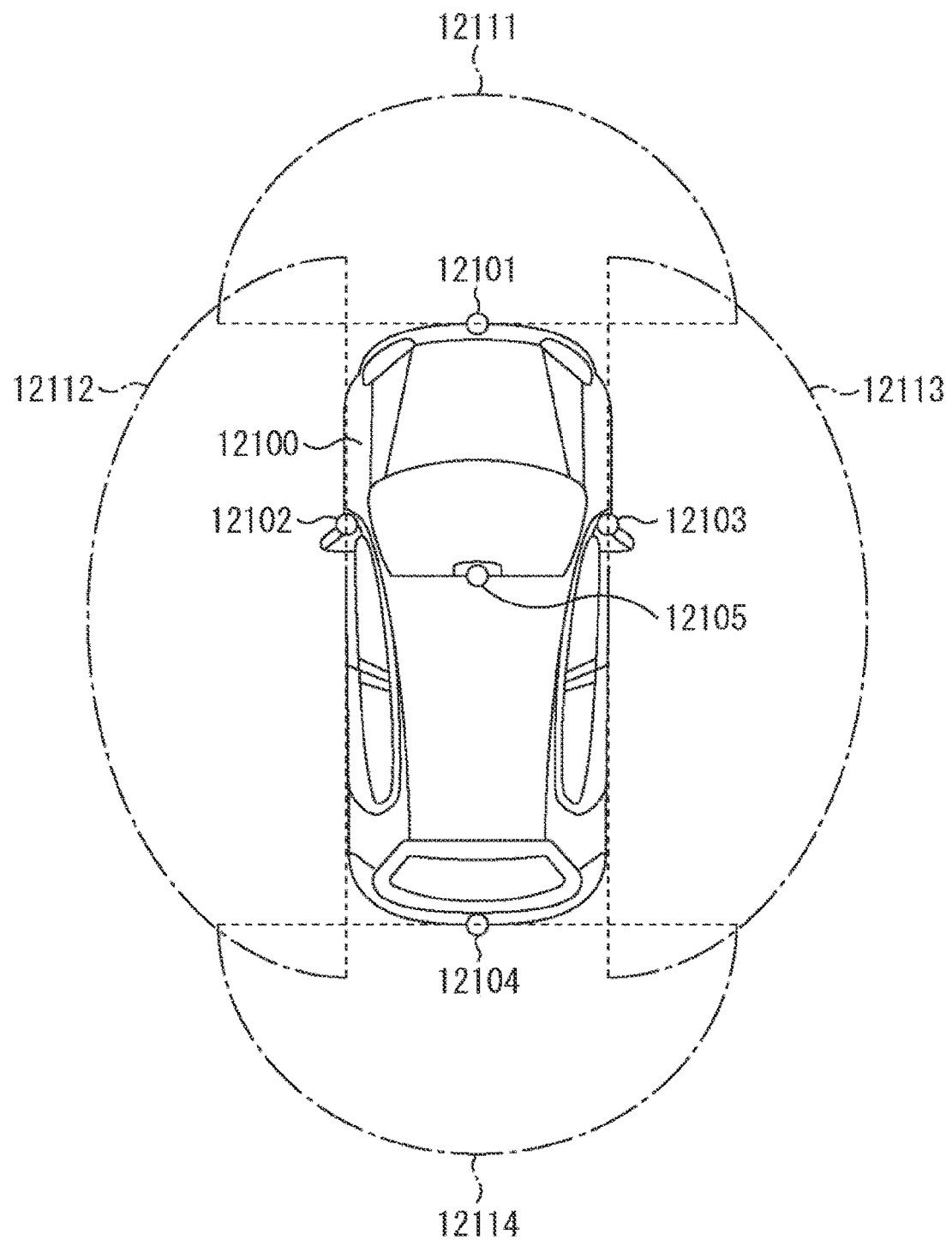
FIG. 40 is a diagram of assistance in explaining an example of installation positions of an outside-vehicle information detecting section and an imaging unit.

FIG. 40 is a diagram depicting an example of the installation position of the imaging unit 12031.

In FIG. 40, the vehicle 12100 includes imaging units 12101, 12102, 12103, 12104, and 12105 as the imaging unit 12031.

The imaging units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle or the like. The imaging unit 12101 provided to the front nose and the imaging unit 12105 provided to the upper portion of the windshield within the interior of the vehicle obtain mainly an image of the front of the vehicle 12100. The imaging units 12102 and 12103 provided to the sideview mirrors obtain mainly an image of the sides of the vehicle 12100. The imaging unit 12104 provided to the rear bumper or the back door obtains mainly an image of the rear of the vehicle 12100. The image of the front of the vehicle obtained by the imaging units 12101 and 12105 is used mainly to detect a preceding vehicle, a pedestrian, an obstacle, a signal, a traffic sign, a lane, or the like.

Incidentally, FIG. 40 depicts an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the sideview mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, and other three-dimensional objects such as a utility pole, on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in imaged images of the imaging units 12101 to 12104. Such recognition of a pedestrian is, for example, performed by a procedure of extracting characteristic points in the imaged images of the imaging units 12101 to 12104 as infrared cameras and a procedure of determining whether or not it is the pedestrian by performing pattern matching processing on a series of characteristic points representing the contour of the object. If the microcomputer 12051 determines that there is a pedestrian in the imaged images of the imaging units 12101 to 12104, and thus recognizes the pedestrian, the sound/image output section 12052 controls the display unit 12062 so that a square contour line for emphasis is displayed so as to be superimposed on the recognized pedestrian. In addition, the sound/image output section 12052 may also control the display unit 12062 so that an icon or the like representing the pedestrian is displayed at a desired position.

Also, in this specification, the term "system" represents the totality of a device including a plurality of devices.

Further, the advantageous effects described in the present specification are merely exemplary and are not limiting, and additional advantageous may be obtained.

Note that the embodiments of the present technology are not limited to the above-described embodiments, and various changes can be made within a scope not deviating from the gist of the present technology.

Additionally, the present technology may also be configured as below.

(1)
An imaging device including:
pixels each including:
a photoelectric conversion unit that converts light received thereon into electric charge; and
a holding unit that holds the electric charge transferred from the photoelectric conversion unit;
a floating diffusion that is shared among a plurality of the pixels, and that holds the electric charge transferred from the holding unit; and
a boost line through which the floating diffusion is boosted.

(2)
The imaging device according to (1),
being devised to capture images on the basis of a global shutter system.

(3)
The imaging device according to (1) or (2),
in which the boost line is formed in a vicinity of an interconnect line that connects a plurality of the floating diffusions, while aligning at least a part of the boost line in parallel to the interconnect line.

(4)
The imaging device according to (3),
in which the boost line and the interconnect line are formed in a same layer.

(5)
The imaging device according to (3),
in which the boost line and the interconnect line are formed in different layers.

(6)
The imaging device according to any one of (1) to (5),
in which the boost line is connected to a gate of an amplification transistor that outputs a voltage signal corresponded to potential of the floating diffusion.

(7)
The imaging device according to any one of (1) to (6), further including
a switching unit that switches capacitance of the floating diffusion.

(8)
The imaging device according to any one of (1) to (7), further including
a readout gate through which the electric charge is read out from the holding unit,
in which the readout gate is formed in a vertical direction and in a horizontal direction relative to the photoelectric conversion unit.

(9)
The imaging device according to any one of (1) to (8),
in which the electric charge is read out from the photoelectric conversion unit on the basis of a CCD system.

(10)
The imaging device according to any one of (3) to (9),
in which a control line, through which application of a predetermined voltage to the boost line is controlled, and the interconnect line are arranged orthogonally.

(11)
The imaging device according to any one of (3) to (9),
in which a control line, through which application of a predetermined voltage to the boost line is controlled, and the interconnect line are arranged in parallel.

(12)
An electronic device including:
an imaging device including:
pixels each including:
a photoelectric conversion unit that converts light received thereon into electric charge; and
a holding unit that holds the electric charge transferred from the photoelectric conversion unit;
a floating diffusion that is shared among a plurality of the pixels, and that holds the electric charge transferred from the holding unit; and
a boost line through which the floating diffusion is boosted; and
a processing unit that processes a signal from the imaging device.

REFERENCE SIGNS LIST

30 Image sensor
41 Pixel array portion
42 Vertical drive unit
43 Column processing unit
44 Horizontal drive unit
45 System control unit
46 Pixel drive line
47 Vertical signal line
48 Signal processing unit
49 Data storage unit
50 Pixel
54 Electric charge holding part
61 Interconnect layer
62 Oxide film
63 Semiconductor substrate
64 Light shielding layer
65 Color filter layer
66 On-chip lens
67 PD region
68 Electric charge holding region
71 Interconnect
72 Interlayer dielectric
73 TRX gate
74 Surface pinning layer
75 Inter-pixel isolating region
76 Light shielding part
77 High-k material film
121 Discharge transistor
122 OFG gate
124 Second transfer transistor
125 Floating diffusion region
126 FD boost interconnect
131 Reset transistor
132 Amplification transistor
133 Selection transistor
301 FD boost interconnect
331 Readout gate
401 Conversion efficiency switching transistor
411 FD conversion interconnect

The invention claimed is:
1. An imaging device, comprising:
a plurality of pixels, wherein each pixel of the plurality of pixels includes:
an amplification transistor;
a photoelectric conversion unit;
a holding unit;
a plurality of floating diffusions shared among the plurality of pixels;

a plurality of boost lines that includes a first boost line and a second boost line, wherein
the first boost line is different from the second boost line, and
the second boost line is in contact with a gate of the amplification transistor; and
an interconnect line configured to connect the plurality of floating diffusions, wherein the interconnect line is parallel to the first boost line.

2. The imaging device according to claim 1, wherein the photoelectric conversion unit is configured to:
receive light;
convert the received light into electric charge; and
output the electric charge.

3. The imaging device according to claim 2, wherein the holding unit is configured to:
receive the electric charge output from the photoelectric conversion unit; and
hold the received electric charge.

4. The imaging device according to claim 3, wherein each floating diffusion of the plurality of floating diffusions is configured to:
receive the electric charge from the holding unit; and
hold the electric charge received from the holding unit.

5. The imaging device according to claim 1, wherein each boost line of the plurality of boost lines is configured to boost the plurality of floating diffusions.

6. The imaging device according to claim 1, wherein the imaging device is configured to capture an image based on a global shutter system.

7. The imaging device according to claim 1, wherein the first boost line is within a proximity of the interconnect line.

8. The imaging device according to claim 7, wherein the first boost line and the interconnect line are in the same layer of the imaging device.

9. The imaging device according to claim 7, wherein the first boost line and the interconnect line are in different layers of the imaging device.

10. The imaging device according to claim 1, wherein the amplification transistor is configured to output a voltage signal corresponding to a potential of a floating diffusion of the plurality of floating diffusions.

11. The imaging device according to claim 1, further comprising a switching unit configured to switch a capacitance of the plurality of floating diffusions.

12. The imaging device according to claim 3, further comprising a readout gate configured to read out the electric charge from the holding unit, wherein the readout gate is in a vertical direction and in a horizontal direction relative to the photoelectric conversion unit.

13. The imaging device according to claim 2, wherein each pixel of the plurality of pixels is configured to read out the electric charge from the photoelectric conversion unit based on a CCD system.

14. The imaging device according to claim 7, further comprising a control line orthogonal to the interconnect line, wherein the control line is configured to control application of a voltage to the first boost line.

15. The imaging device according to claim 7, further comprising a control line in parallel to the interconnect line, wherein the control line is configured to control application of a voltage to the first boost line.

16. The imaging device according to claim 7, further comprising:
a conversion interconnect outside the first boost line; and
a switching unit configured to:
control a connection between the interconnect line and the conversion interconnect, and
control capacitance of the plurality of floating diffusions.

17. An electronic device, comprising:
an imaging device that includes:
a plurality of pixels, wherein each pixel of the plurality of pixels includes:
an amplification transistor;
a photoelectric conversion unit;
a holding unit;
a plurality of floating diffusions shared among the plurality of pixels;
a plurality of boost lines that includes a first boost line and a second boost line, wherein
the first boost line is different from the second boost line, and
the second boost line is in contact with a gate of the amplification transistor; and
an interconnect line configured to connect the plurality of floating diffusions, wherein the interconnect line is parallel to the first boost line; and
a processing unit configured to process a signal from the imaging device.

* * * * *